United States Patent [19]

Miyamoto

[11] Patent Number: 6,043,675

[45] Date of Patent: Mar. 28, 2000

[54] LOGIC CIRCUIT UTILIZING CAPACITIVE COUPLING, AN AD CONVERTER AND A DA CONVERTER

[75] Inventor: Yoshihiro Miyamoto, Kawasaki, Japan

[73] Assignee: Fujitsu Limited, Kanagawa, Japan

[21] Appl. No.: 08/888,900

[22] Filed: Jul. 7, 1997

[30] Foreign Application Priority Data

Jan. 30, 1997 [JP] Japan ..................................... 9-016968
Mar. 17, 1997 [JP] Japan ..................................... 9-063344

[51] Int. Cl.[7] .......................... H03K 19/23; H03K 19/20
[52] U.S. Cl. ................................ 326/36; 326/11; 326/112
[58] Field of Search .............................. 326/36, 35, 11, 326/112, 119, 121

[56] References Cited

U.S. PATENT DOCUMENTS

| | | | |
|---|---|---|---|
| 3,260,863 | 7/1966 | Burns et al. ................................ | 326/36 |
| 5,258,657 | 11/1993 | Shibata et al. ............................. | 326/36 |
| 5,444,411 | 8/1995 | Yang et al. ................................ | 327/361 |
| 5,594,372 | 1/1997 | Shibata et al. ............................. | 326/121 |
| 5,644,253 | 7/1997 | Takatsu ..................................... | 326/35 |
| 5,818,380 | 10/1998 | Ito et al. .................................. | 341/160 |

*Primary Examiner*—Michael Tokar
*Assistant Examiner*—Daniel D. Chang
*Attorney, Agent, or Firm*—Nikaido Marmelstein Murray & Oram LLP

[57] ABSTRACT

According to the present invention, various logic circuits, AD converters, DA converters and counter circuits can be constituted with a small number of transistors by employing a capacitive coupling circuit. An analog/digital converter comprises: an input terminal, for which analog input is provided; an output terminal of N (N is a plural number) bits, for which binary output is provided; and N unit circuits arranged in parallel, each including an input capacitor having one electrode connected to the input terminal, a first inverter connected to the other electrode of the input capacitor, and a second inverter connected to the first inverter, wherein outputs of the second inverters of the unit circuits are respectively provided for the output terminals, wherein inverted outputs of the outputs for the unit circuits are fed back via feedback capacitors to respective input terminals of the first inverters of the unit circuits corresponding to lower bits, and wherein a capacitance of the feedback capacitor, which corresponds to the inverted output of the M-th (M is an integer) unit circuit from the most significant bit, is $\frac{1}{2}^M$ times a capacitance of the input capacitor of the unit circuit that is fed back.

7 Claims, 59 Drawing Sheets

FIG.1
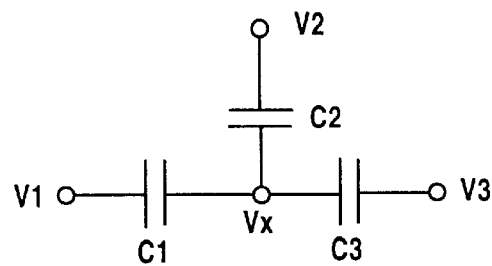
FIG.2A
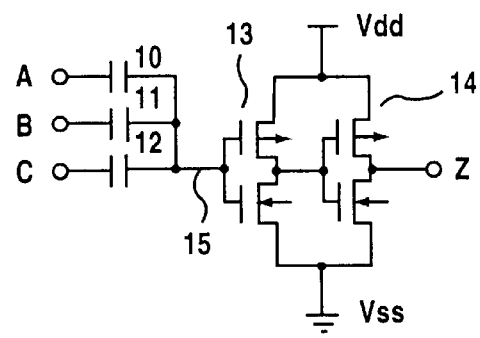
FIG.2B
| A | B | C | Z |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

FIG.3A
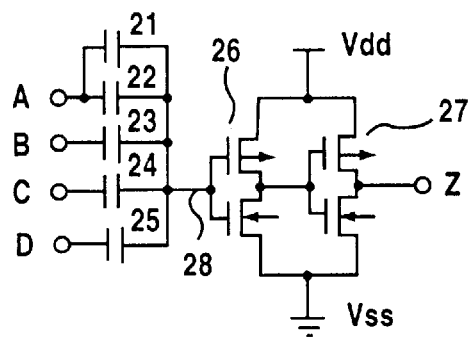
FIG.3B
| A | B | C | D | Z |
|---|---|---|---|---|
| 0 | 0 | 0 | 0 | 0 |
| 0 | 0 | 0 | 1 | 0 |
| 0 | 0 | 1 | 0 | 0 |
| 0 | 0 | 1 | 1 | 0 |
| 0 | 1 | 0 | 0 | 0 |
| 0 | 1 | 0 | 1 | 0 |
| 0 | 1 | 1 | 0 | 0 |
| 0 | 1 | 1 | 1 | 1 |
| 1 | 0 | 0 | 0 | 0 |
| 1 | 0 | 0 | 1 | 1 |
| 1 | 0 | 1 | 0 | 1 |
| 1 | 0 | 1 | 1 | 1 |
| 1 | 1 | 0 | 0 | 1 |
| 1 | 1 | 0 | 1 | 1 |
| 1 | 1 | 1 | 0 | 1 |
| 1 | 1 | 1 | 1 | 1 |
FIG.4A
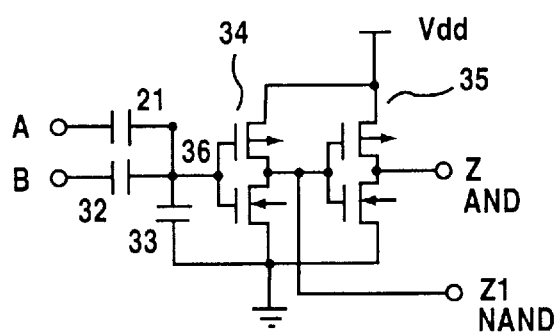
FIG.4B
| A | B | Z | Z1 |
|---|---|---|----|
| 0 | 0 | 0 | 1 |
| 0 | 1 | 0 | 1 |
| 1 | 0 | 0 | 1 |
| 1 | 1 | 1 | 0 |

FIG.5
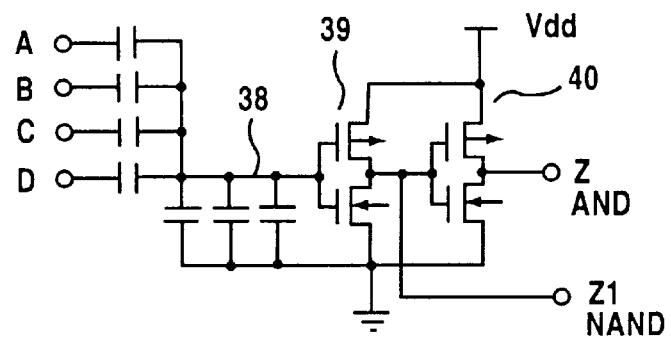
FIG.6A
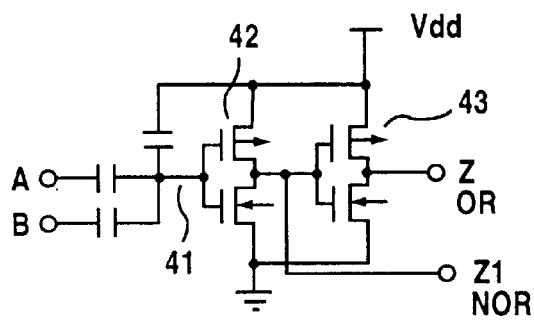
FIG.6B
| A | B | Z | Z1 |
|---|---|---|----|
| 0 | 0 | 0 | 1  |
| 0 | 1 | 1 | 0  |
| 1 | 0 | 1 | 0  |
| 1 | 1 | 1 | 0  |
FIG.7
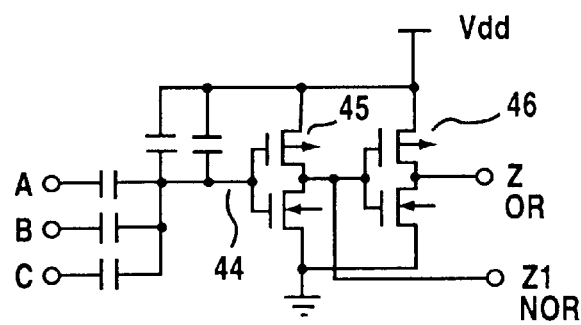

FIG.8A
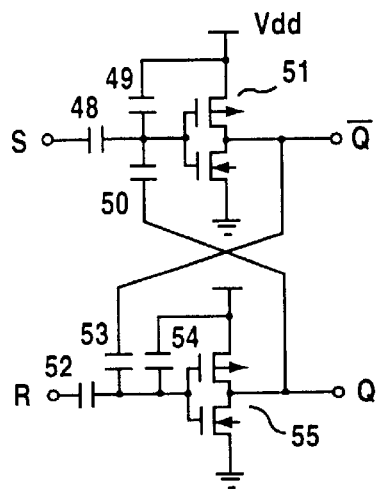
FIG.8B
| S | R | Q | QNEXT |
|---|---|---|-------|
| 0 | 0 | 0 | 0 |
| 0 | 0 | 1 | 1 |
| 0 | 1 | 0 | 0 |
| 0 | 1 | 1 | 0 |
| 1 | 0 | 0 | 1 |
| 1 | 0 | 1 | 1 |
| 1 | 1 | 0 | 0 |
| 1 | 1 | 1 | 0 |
FIG.9A
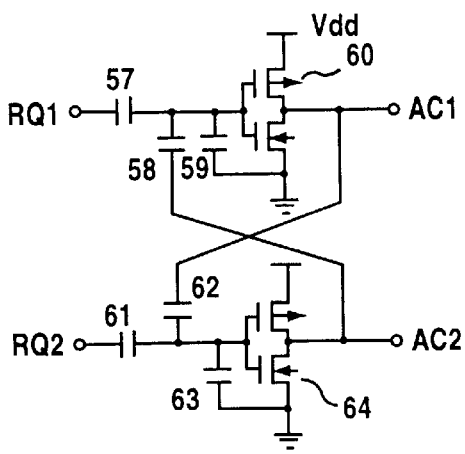
FIG.9B
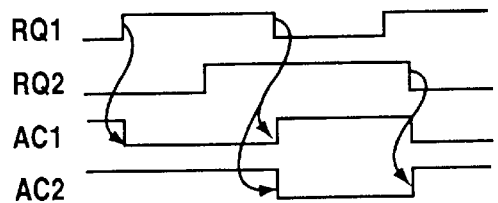

| IN | OE | OUT |
|----|----|-----|
| X  | 1  | HIGH Z |
| 0  | 0  | 0   |
| 1  | 0  | 1   |

FIG.11A
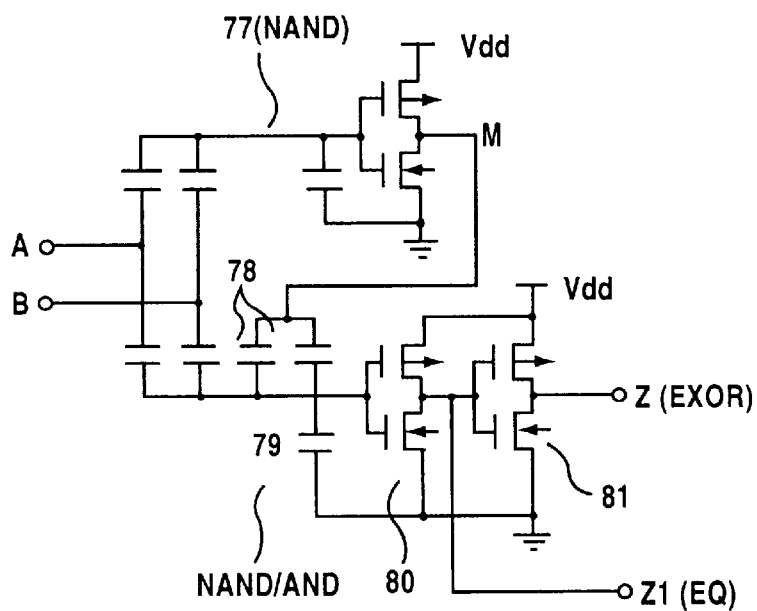
FIG.11B
| A | B | Mx2 | Z | Z1 |
|---|---|-----|---|----|
| 0 | 0 | 2   | 0 | 1  |
| 0 | 1 | 2   | 1 | 0  |
| 1 | 0 | 2   | 1 | 0  |
| 1 | 1 | 0   | 0 | 1  |
FIG.11C
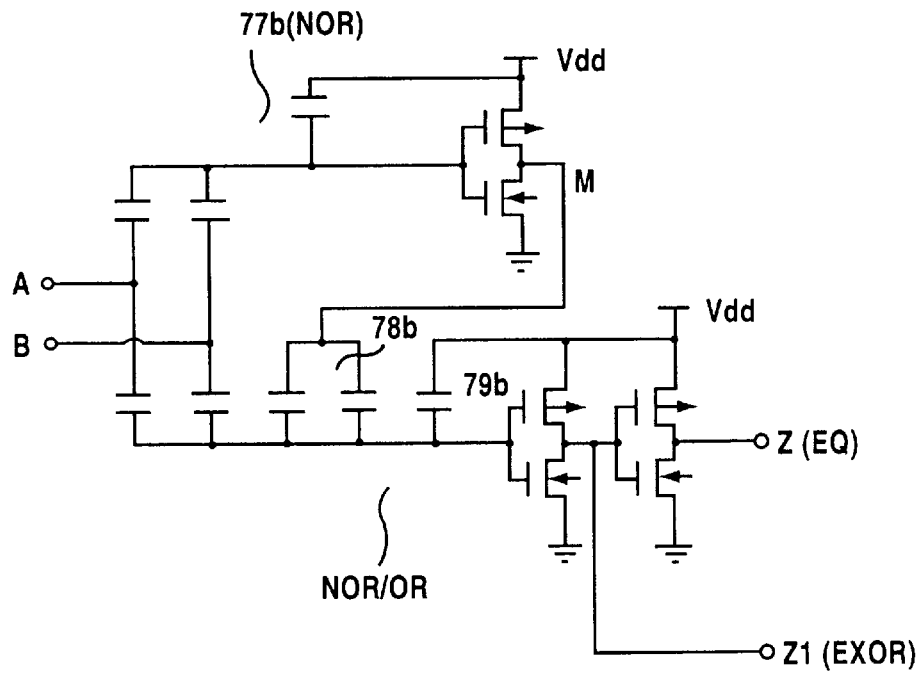

FULL ADDER

| A | B | C | Cn | S |
|---|---|---|----|---|
| 0 | 0 | 0 | 0 | 0 |
| 0 | 0 | 1 | 0 | 1 |
| 0 | 1 | 0 | 0 | 1 |
| 0 | 1 | 1 | 1 | 0 |
| 1 | 0 | 0 | 0 | 1 |
| 1 | 0 | 1 | 1 | 0 |
| 1 | 1 | 0 | 1 | 0 |
| 1 | 1 | 1 | 1 | 1 |

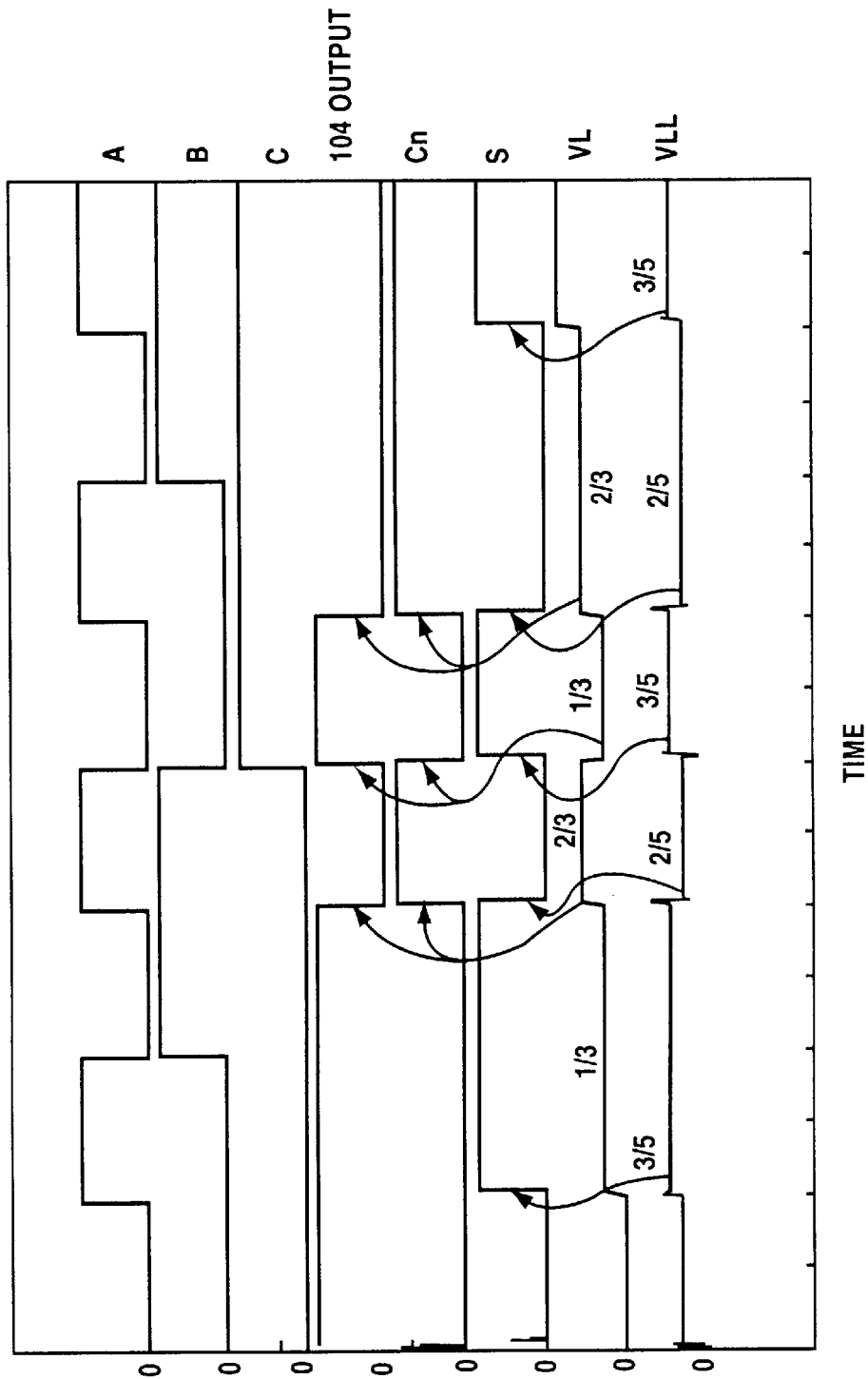

AD CONVERTER

AD CONVERTER OF FIG.20

4 BIT AD CONVERTER WITH REMINDER FOR LOWER BIT

12 BIT AD CONVERTER

FIG.25 12 BIT AD CONVERTER (1)

12 BIT AD CONVERTER (2)

12 BIT AD CONVERTER (3)

3 BIT AD CONVERTER

WAVEFORM FOR FIG. 20

WAVEFORM FOR FIG.29

4 BIT AD CONVERTER

12 BIT AD CONVERTER

12 BIT AD CONVERTER OF FIG.34 (1)

12 BIT AD CONVERTER OF FIG.34 (2)

12 BIT AD CONVERTER OF FIG.34 (1)

12 BIT AD CONVERTER OF FIG.34 (2)

12 BIT AD CONVERTER OF FIG.34 (3)

AD CONVERTER WITH
A ROUND FUNCTION AND AN OVERFLOW

144.

SEQUENTIAL AD CONVERTER

OPERATIONAL AMPLIFIER

1 BIT SERIAL AD CONVERTER

FIG. 48 SERIAL DA CONVERTER

WAVEFORM OF FIG.48

1 BIT SERIAL DA CONVERTER

WAVEFORM OF FIG.50

COUNTER CIRCUIT (1)

WAVEFORM OF FIG. 53

COUNTER CIRCUIT (2)

COUNTER CIRCUIT (3)

AD CONVERTER

SERIAL TYPE AD CONVERTER

SERIAL AD CONVERTER

LOGIC CIRCUIT UTILIZING CAPACITIVE COUPLING, AN AD CONVERTER AND A DA CONVERTER

BACKGROUND OF THE INVENTION

1. Field of the Invention

The present invention relates to a CMOS logic circuit, an AD converter and DA converter using capacitive coupling, and to an innovative circuit that can reduce the number of circuit elements required for logic circuits, AD converters and DA converters, which together with a photoelectric conversion device, such as an image sensor, are integrated in a single LSI.

2. Related Arts

For the fundamental structure of a CMOS logic circuit, comparatively many CMOS transistor elements are employed, as, for example, is described in "Base of MOS Integrated Circuit" (Kindai Kagakusha, May 30, 1992). AD converters are described, for example, in "Transistor Techniques Special, No. 16" (CQ Publication, Feb. 1, 1991, Second Edition). A flash AD converter that can obtain output at the same time as input being applied is better as an AD converter integrated with a photoelectric conversion device, such as an image sensor. However, the flash AD converter requires many comparators, and accordingly, the volume of the circuit is increased. For example, $2^n-1$ comparators are required to constitute an n-bit AD converter.

An image sensor has been studied wherein a signal processing function is provided on the chip by forming a CMOS circuit on the same substrate and whereby digital output is enabled. Such an image sensor is described, for example, in "Proceedings of SPIE Vol. 2745 Infrared Readout Electronics III" pp. 90–127, Apr. 9, 1996.

As is described above, however, the current CMOS logic circuit has many elements, and the AD converter which converts an analog signal detected by a sensor into a digital signal also has many elements. If a digital circuit employing these circuits is formed on the same substrate as is a photosensor, a fill-factor, which is a ratio of the sensor area to the area of the entire chip, is extremely small. This is described, for example, in ISSCC 1994 Digest Of Technical Papers, pp. 230.

SUMMARY OF THE INVENTION

It is, therefore, one object of the present invention to provide a CMOS logic circuit that has a very small number of elements.

It is another object of the present invention to provide a CMOS AD converter that does not require many comparators and for which only a few elements are employed.

It is an additional object of the present invention to provide a flash CMOS AD converter for which only a few elements are employed.

It is a further object of the present invention to provide a time sharing CMOS AD converter for which only a few elements are employed.

It is still another object of the present invention to provide a CMOS DA converter for which only a few elements are employed.

It is a still further object of the present invention to provide an image sensor, on which is mounted a digital circuit with a few devices, that can increase its fill-factor.

To achieve the above objects, according to the present invention, a logic circuit comprises:

a plurality of input terminals, to which binary input is provided;

a plurality of input capacitors having first electrode respectively connected to one of the plurality of input terminals and second electrode connected in common, said input capacitors having almost the same capacitance; and an inverter circuit, for receiving a voltage from the second electrodes and having a threshold value so that the inverter circuit is inverted when a voltage corresponding to logic 1 is applied to a predetermined number of input terminals of the plurality of input terminals.

Since a capacitive coupling circuit is employed in which a plurality of input capacitors are coupled in common and input signals are supplied to each input capacitors, when a voltage corresponding to logic 1 is applied to a predetermined number of input capacitors, a potential exceeding a threshold value of an inverter can be generated at the coupling terminal. When, for example, the threshold value is set to half of the power voltage, the logic circuit serves as a majority circuit.

In addition, when a fixed potential is applied to some input terminals connected to the input capacitors, a NAND circuit and an AND circuit, and a NOR circuit and an OR circuit can be obtained.

Further, developing the logic circuit, a logic circuit, such as a flip-flop circuit or a full adder, can be constituted by a small number of transistors.

As another feature of the present invention, by using a capacitive coupling circuit an analog/digital converter can be constructed for which only an extremely small number of transistors are employed. An example thereof is an analog/digital converter having an input terminal, for which analog input is provided and N (N is a plural value) bits output terminals, for which binary output is provided, comprises:

N unit circuits arranged in parallel, each including
an input capacitor having a first electrode connected to the input terminal,
a first inverter connected to a second electrode of the input capacitor, and
a second inverter connected to the first inverter,
wherein outputs of the second inverters of the unit circuits are respectively provided for the output terminals,
inverted outputs of the outputs for the unit circuits are fed back via feedback capacitors to inputs of the first inverters of the unit circuits respectively corresponding to lower bit, and
a capacitance of the feedback capacitor, which corresponds to the inverted output of the M-th (M is an integer) unit circuit from the most significant bit, is $\frac{1}{2^M}$ of a capacitance of the input capacitor of the unit circuit that is fed back.

When inverted signals for upper bit digital outputs are transmitted via feedback capacitors to the input of the lower bit inverters, lower bit comparison potentials can be generated by the capacitive coupling circuits. The above A/D converter can be constituted by an innovative CMOS circuit having an extremely small number of transistors.

BRIEF DESCRIPTION OF THE DRAWINGS

FIG. 1 is a circuit diagram illustrating a capacitive circuit representing the principle of the present invention;

FIGS. 2A and 2B are a diagram and a truth table for a majority circuit with a three-terminal input that employs the capacitive circuit at an input stage;

FIGS. 3A and 3B are a diagram and a truth table for a weighted majority circuit with a four-terminal input;

FIGS. 4A and 4B are a diagram and a truth table for a two-input AND and NAND circuit;

FIG. 5 is a diagram of a four-input AND and NAND circuit;

FIGS. 6A and 6B are a diagram and a truth table for a two-input OR and NOR circuit;

FIG. 7 is a diagram of a three-input OR and NOR circuit;

FIGS. 8A and 8B are a diagram and a truth table for an RS flip-flop circuit;

FIGS. 9A and 9B are a diagram and a timing chart for an arbiter circuit;

FIGS. 11A and 11B are a diagram and a truth table for an (EXOR) and (EQ) circuit, and 11C is a diagram for an (EQ) and (EXOR) circuit;

FIG. 19 is an output waveform diagram for confirming the operation of the full adder in FIG. 18;

DETAILED DESCRIPTION OF THE PREFERRED EMBODIMENT

Figures 10A, 10B:
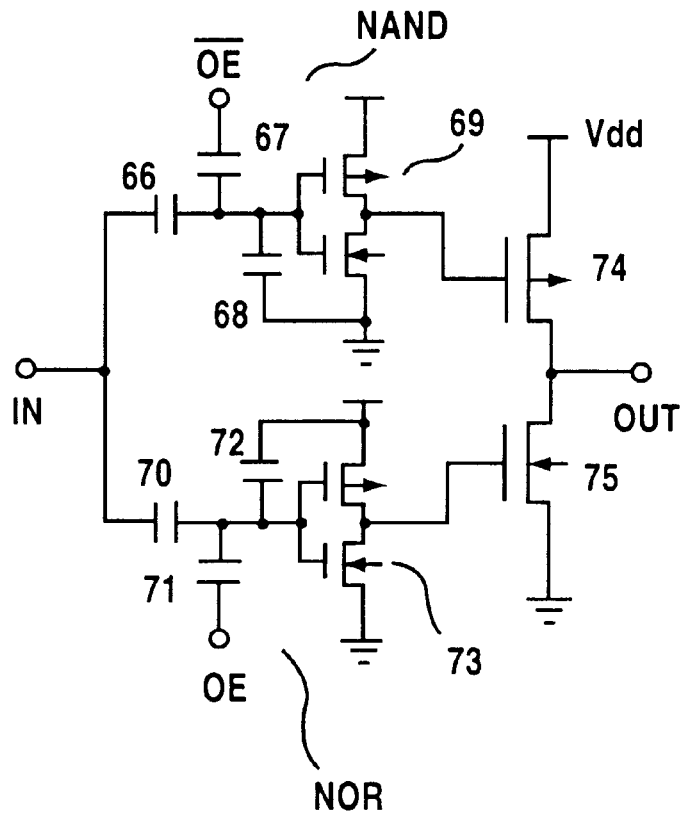
FIGS. 10A and 10B are a diagram and a truth table for a tristate buffer circuit.

The preferred embodiments of the present invention will now be described while referring to the accompanying drawings. These embodiments, however, do not limit the technical scope of the present invention.

[Capacitive circuit]

FIG. 1 is a circuit diagram illustrating capacitive circuit representing the principle of the present invention. In this example, each voltage, V1, V2 or V3, is individually applied to an electrode of a different capacitor, C1, C2 or C3. All other electrodes of the three capacitors are connected in common, and voltage value Vx at their common terminal is $$Vx=(C1 \cdot V1+C2 \cdot V2+C3 \cdot V3)/(C1+C2+C3).$$

In the above capacitive circuit in which a plurality of capacitors are coupled together, voltage value Vx, in accordance with the ratio of capacitances, can be uniquely obtained relative to the plurality of input voltages, V1, V2 and V3.

[CMOS logic circuit using capacitive circuitry]

FIG. 2A is a diagram of a three-terminal input, majority circuit using the above capacitive circuitry as an input stage. FIG. 2B is its truth table. In this majority circuit, three input terminals, A, B and C, are connected to two-stage CMOS inverters 13 and 14 via capacitors 10, 11 and 12, which have almost the same capacitance. With equal β values for a P channel transistor and an N channel transistor and also equal threshold values for both, the CMOS inverters 13 and 14 can have inverted threshold value Vt with half (Vdd/2) of power voltage Vdd.

Assume that two voltages, 0 and Vdd, are applied to input terminals of the following logic circuits. In this case, it is further assumed that logic 0 is input when the input voltage is 0 (level L), and that logic 1 is input when the input voltage is Vdd (level H).

As is explained while referring to FIG. 1, 0, Vdd/3, 2Vdd/3 or Vdd is provided at the common terminal 15 of the capacitive circuitry in accordance with the number of input logic 1. When the value at the common terminal 15 is 0 or Vdd/3, output Z is at logic 0 (level L), and when the value at the terminal 15 is 2Vdd/3 or Vdd, the inverter performs inversion and output Z is at logic 1 (level H).

With this arrangement, as is shown in the truth table in FIG. 2B, when two or more inputs are at level H (logic 1), output Z goes to level H (logic 1). When a value at input terminal A is logic 0, output Z is an AND output of the input terminals B and C. When a value at input terminal A is logic 1, output Z is an OR output of the input terminals B and C. In this manner, only three capacitors and two-stage CMOS inverters are required to constitute a majority circuit.

FIG. 3 is a circuit illustrating a weighted majority circuit with four-terminal inputs. FIG. 3A shows the circuit and FIG. 3B shows the truth table. A capacitive coupling circuit is also provided for this circuit. Input terminal A is connected to two-stage CMOS inverters 26 and 27 via two capacitors 21 and 22, while the other input terminals, B, C and D, are respectively connected to the CMOS inverters 26 and 27 via capacitors 23, 24 and 25. Therefore, compared with another terminal, the weighted value of the input at terminal A is twice as great. All these capacitors have almost the same capacitance.

As well as in FIG. 2, a voltage of 0, Vdd/5, 2Vdd/5, 3Vdd/5, 4Vdd/5 or Vdd is applied at a common terminal 28. When the input at terminal A is 1 and one of the other inputs goes to 1, the inverter inverts the output Z to provide 1. When the input at A is 0 and when all of the other inputs goes to 1, the inverter also inverts the output.

As is shown in FIGS. 2 and 3, when an odd number of capacitors that have almost the same capacitance are provided for an input stage, inverters having a threshold value of Vdd/2 can accurately invert the output.

FIG. 4A is a circuit diagram of a two-input NAND and AND circuit. FIG. 4B is its truth table. In this circuit, two input terminals A and B are connected to two-stage CMOS inverters 34 and 35 via capacitors 31 and 32, which have almost the same capacitance. A capacitor 33, one end of which is grounded, is also connected to a common terminal 36. The threshold value of the CMOS inverters is set to Vdd/2, for example.

By employment of the capacitor 33, this circuitry is the equivalent of a circuit like the one in FIG. 2 with one of the inputs of the three-terminal majority circuit fixed at logic 0. Therefore, only when both inputs are 1, the voltage at the common terminal 36 is 2Vdd/3 to invert the output of the inverter. As a result, output Z1 of the inverter 34 is NAND logic and output Z of the inverter 35 is AND logic.

FIG. 5 is a diagram of a four-input NAND and AND circuitry. In this circuitry, seven capacitors, which have almost the same capacitance, are connected to two-stage CMOS inverters 39 and 40. The input terminals of three capacitors are grounded. As a result, as for the circuit in FIG. 4, when all of the four inputs A D go to 1, AND output Z is 1 and the NAND output Z1 is 0.

While to constitute a conventional four-input NAND circuit four pairs of CMOS transistors are required, to constitute this circuit only seven capacitors and two transistors are required. For this circuit, the inverter 39 must have a threshold value characteristic that is sharp enough to distinguish 3Vdd/7 from 4Vdd/7.

As is apparent from this circuit, only two of the five capacitors need be grounded to form a three-input NAND and AND circuitry. To obtain N inputs, N−1 capacitors of 2N−1 capacitors are grounded. In this case, a single capacitor having N−1 times a specified capacitance can be substituted for N−1 capacitors.

FIG. 6A is a diagram of two-input NOR and OR circuitry. FIG. 6B is its truth table. This example circuitry corresponds to the three-input majority circuit in FIG. 2 in which one of the input terminals is connected to power source Vdd. The three capacitors in the circuitry in FIG. 6 also have almost the same capacitance. When a value at one of the two input terminals A and B is 1, the value at the common terminal 41 is 2Vdd/3, and an inverter 42 having a threshold value of Vdd/2 inverts the output. In other words, when the input at one of the input terminals is 1, output Z1 from the inverter 42 is 0. Thus, output Z1 is NOR output and output Z is OR output.

FIG. 7 is a diagram of a three-input NOR and OR circuitry. As in FIG. 6, two of five capacitors are connected to the power voltage terminal Vdd. As a result, when at least one of the three inputs is 1, the value at a common terminal 44 is 3Vdd/5 and the output of an inverter 45 is inverted. Therefore, output Z1 is NOR output and output Z is OR output. Generally, only two-stage CMOS inverters and N–1 capacitors of 2N–1 capacitors need to be connected to the power source Vdd to constitute the N-input NOR and OR circuitry. Similarly, a single capacitor having N–1 times a specified capacitance can be substituted for N–1 capacitors.

While a conventional three-input NOR circuit requires six (2×3) transistors, to constitute the NOR circuit in this embodiment, five capacitors and two transistors are required, and only a small number of elements is needed.

FIG. 8A is a diagram for an RS flip-flip circuit. FIG. 8B is its truth table. Two of the two-input NOR circuits in FIG. 6A are arranged in parallel, and their respective output terminals are connected to the input capacitors of the other NOR circuit for feedback. Set input terminal S is connected to a capacitor 48, a capacitor 49 is connected to power source Vdd, and a capacitor 50 is connected to output terminal Q. Reset input terminal R is connected to a capacitor 52, a capacitor 53 is connected to the other output terminal/Q, and a capacitor 54 is connected to the power source Vdd.

The truth table is shown in FIG. 8B. When set input S is 1, output Q is set to 1. When reset input R is 1, output Q is reset to 0. In a manner that differs from a common RS flip-flop circuit, when both set input S and reset input R are 1, the circuit in FIG. 8A does not become unstable, and both outputs Q and /Q are forced to 0 by the capacitive coupling circuit. However, since generally both R and S inputs does not become 1, no special problem occurs for the actual function. Since a small number of transistors are required to constitute the NOR circuit, the RS flip-flop circuit employing such a NOR circuit also requires the use of a small number of transistors.

FIG. 9A is a diagram showing an arbiter circuit. FIG. 9B is its timing chart. In FIG. 9A, two of the two-input NAND circuits in FIG. 4A are arranged in parallel and their respective output terminals are connected to input capacitors of the other NAND circuit for feedback. Request input RQ1 is connected to a capacitor 57, the paired output AC2 is connected to a capacitor 58, and a capacitor 59 is grounded. Capacitors 61, 62 and 63 in an inverter 64 are also connected in the same manner.

The timing chart for the arbiter circuit is shown in FIG. 9B. Output terminals AC1 and AC2 are first acknowledged when first request inputs RQ1 and RQ2 are received, and the next request can not be acknowledged at the output terminal until the first request input has returned to 0. As is shown in FIG. 9B, in the state wherein both inputs RQ1 and RQ2 are 0, the outputs AC1 and AC2 are stabilized at 1. When input RQ1 becomes 1, the input for an inverter 60 is 2Vdd/3, and output AC1 is inverted to 0. Since the process for the input RQ1 has not yet been terminated, even when the other input RQ2 is 1, output AC2 is not inverted. When input RQ1 becomes 0, the first operation is terminated and output AC2 is inverted.

FIG. 10A is a diagram of a tristate buffer circuit, and FIG. 10B is its truth table. In this circuit, a two-input NAND circuit and a two-input NOR circuit are arranged in parallel, and their output terminals are connected to the gates of a P channel transistor 74 and an N channel transistor 75, which are output inverters. Input terminal IN is connected to a capacitor 66 on the NAND circuit side, and output enable signal line /OE is connected to a capacitor 67. On the NOR circuit side, input IN is connected to a capacitor 70, and output enable signal line OE is connected to a capacitor 71.

With this arrangement, when the output enable signal OE is 1, the input for an invertor 69 goes to less than Vdd/3 and its output goes to level H, and a transistor 74 is turned off. And the input of an inverter 73 goes to higher than 2 Vdd/3 and its output goes level L, and a transistor 75 is turned off. As a result, output OUT is in the high impedance state. When output enable signal OE is 0, output OUT is changed in accordance with the input IN state, the inverter circuit constituted by the transistors 74 and 75 serves as a buffer circuit.

FIG. 11A is a diagram of a coincidence (EQ) circuit or an exclusive NOR(EXNOR) circuit and an exclusive OR (EXOR) circuit. FIG. 11B is a truth table for the circuit shown in FIG. 11A. In this circuit, the output of a two-input NAND circuit 77 is provided via two capacitors 78 to the input terminal of an inverter 80. A capacitor 79, one electrode of which is grounded, is connected to the input terminal (the common electrodes of the capacitors) of the inverter 80. As a result, when inputs A and B are 1, output M of the NAND circuit 77 is 0 and the input for the inverter 80 goes to level L. At other times, output M of the NAND circuit 77 is 1 and the effect of the capacitor 79 is canceled out. When one of the inputs A and B is 1, the output of the inverter 80 is inverted. As a result, when one of the inputs A and B is 1, output Z1 is 0 and output Z is 1, and when both of the inputs A and B are 1 or 0, output Z1 is 1 and output Z is 0. That is, output Z1 is the EQ circuit output and output Z is the EXOR circuit output.

Since except when inputs A and B are 1 the truth table for the EXOR circuit is the same as that for the OR circuit, the concept on which this circuit is based is that the output of the OR circuit is inverted by using the output of the NAND circuit 77, which has a different output only when both inputs A and B are 1. At times other than when both inputs are 1, output M is 1, the effect of the capacitor 79 is canceled out, and the inverters 80 and 81 are employed as a NOR circuit and an OR circuit.

When the NAND circuit 77 is replaced with the NOR circuit 77b in FIG. 6, and the capacitor 79 is connected to the power source Vdd (79b), output Z1 is EXOR output and output Z is EQ output. In other words, the circuit in FIG. 11c is provided.

Figure 12A:
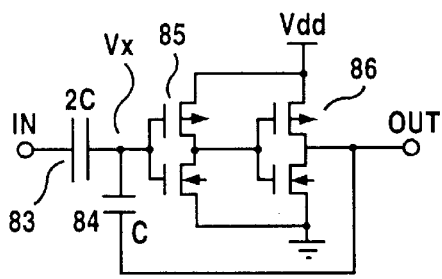
FIGS. 12A and 12B are a diagram and an input/output characteristic graph for a Schmitt trigger circuit.
Figure 12B:
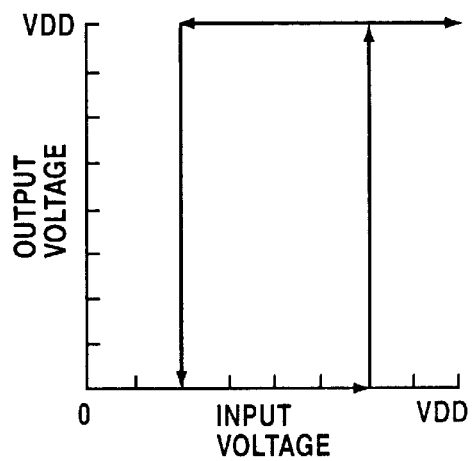

FIG. 12A is a diagram of a Schmitt trigger circuit, and FIG. 12B is an input/output characteristics diagram. In this circuit, a capacitor 83 connected to input IN has almost two times the capacitance of a capacitor 84 connected to output OUT of an inverter 86 at the second stage. The two capacitors 83 and 84, which have different capacitances, are connected in common, and input IN is connected to one of the capacitors, while output OUT, generated via two inverters, is connected to the other capacitor.

Assuming that input IN is raised from 0 V to power voltage Vdd, at first, output OUT is 0, so that input $V_X$ of the inverter 85, relative to voltage $V_{IN}$ of input IN, is $V_x=2V_{IN}/3$. Thus, when the threshold value of the inverter 85 is Vdd/2, $$V_x=2V_{IN}/3=Vdd/2,$$

and when $V_{IN}=3Vdd/4$, the output of the inverter 85 is inverted. As a result, when input IN goes from 3Vdd/4 to Vdd output OUT is inverted to 1.

When input IN falls from Vdd to 0V, as the first output OUT is Vdd, the input $V_X$ of the inverter 85, relative to voltage $V_{IN}$ of input IN, is $V_X=(2V_{IN}+Vdd)/3$. Therefore, since the threshold value for the inverter 85 is Vdd/2, $$V_X=(2V_{IN}+Vdd)/3=Vdd/2,$$

and when $V_{IN}=Vdd/4$, the output of the inverter 85 is inverted. As a result, when input IN goes from Vdd/4 to 0, output OUT is inverted to 0.

As is described above, the circuit in FIG. 12 serves as a Schmitt trigger circuit that has a dead band of Vdd/4 to 3Vdd/4. When the capacitance of the capacitor 83 is increased, the width of the dead band is narrowed. When the capacitance of the capacitor 83 is reduced and is nearer to that of the capacitor 84, the width of the dead band is increased.

With the structure whereby the output of the inverter 85 is fed back via the capacitor 84, the circuit has a reverse hysteresis characteristic, which causes the output to be inverted at a low voltage when input IN rises and at a high voltage when it falls.

Figure 13A:
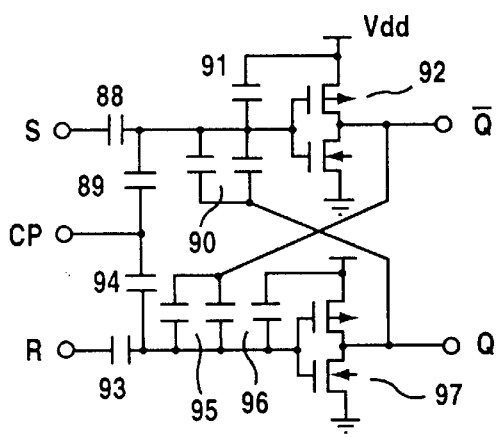
FIGS. 13A and 13B are diagrams illustrating a clocked RS flip-flop circuit.
Figure 13B:
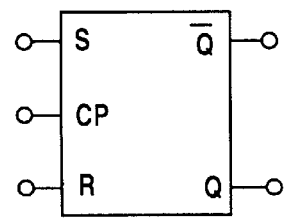

FIG. 13A is a specific diagram illustrating a clocked RS flip-flop circuit, and FIG. 13B is a block diagram of that circuit. In this circuit, the RS flip-flop circuit in FIG. 8 is employed, and output for the paired output terminals is fed back via capacitors 90 and 95, whose capacitances are almost twice those of capacitors 88 and 93, on the input side, and clock pulse CP is input via capacitors 89 and 94, whose capacitances are almost the same as those of the input capacitors 88 and 93. Set input S is connected via the capacitor 88 and reset input R is connected via the capacitor 93. The capacitors 91 and 96 are connected to power source Vdd. Single capacitor having twice a specified capacitance may be substituted for the capacitors 90 and the capacitors 95.

In this circuit, when clock CP is 0 and output Q is 1, the capacitors 91 and 90 on the inverter 92 side are connected to 1. Thus, the input goes to level H, which is higher than Vdd/2, and output/Q is fixed at 0. Because output/Q is 0, the capacitors 95 and 94 are connected to 0, and output Q is fixed at 1. When output Q is 0, on the other hand, output /Q is fixed at 1. In this fixed state, the output value is fixed regardless of what values the set input S and the reset input R have.

When clock CP goes to 1 and if output Q is 1, the input of the inverter 92 goes to level H, and output /Q is fixed to 0. Because output /Q is 0, the capacitor 95 and the capacitors 94 and 96 offset each other. Furthermore, when the reset input R is 0, input for the inverter 97 goes to level L and output Q is fixed at 1. Or, output Q is fixed at the reserve level.

With Q=1 and /Q=0, when reset input R becomes 1, the input of the inverter 97 goes to level H and output Q is inverted to 0. With the inversion of the output Q to 0, the capacitor 90 and the capacitors 91 and 89 offset each other, and because set input S is 0, the input of the inverter 92 goes to level L and output /Q is inverted to 1. On the other hand, with Q=0 and /Q=1, when set input S becomes 1, the input of the inverter 92 goes to level H and output /Q is inverted to 0. Since 0 is provided for the capacitors 95 and 93, the input of the inverter 97 goes to level L and output Q is inverted and set to 1.

That is, a clocked RS flip-flop circuit can be provided where the state is not changed when clock CP=0, and output Q is set or reset in consonance with set input S and reset input R when clock CP=1.

Figure 14:
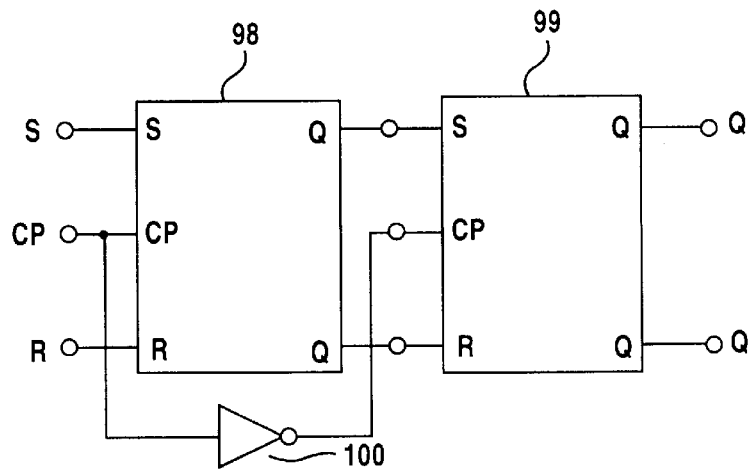
FIG. 14 is a diagram illustrating a master slave RS flip-flop circuit.

FIG. 14 is a diagram illustrating a master slave RS flip-flop circuit. In this example, clocked RS flip-flop circuits 98 and 99, the same as those in FIG. 13, are arranged in two stages. Clock signal CP is transmitted to the first circuit 98, and is transmitted via an inverter 100 to the second circuit 99. As a result, when clock CP is 1, the slave circuit 98 is set or reset by input S or input R, and the state of the slave circuit 98 is transmitted to the master circuit 99 by the inversion of the next clock CP to 0. In this case, the slave circuit 98 is not inverted by input R or S.

Figure 15:
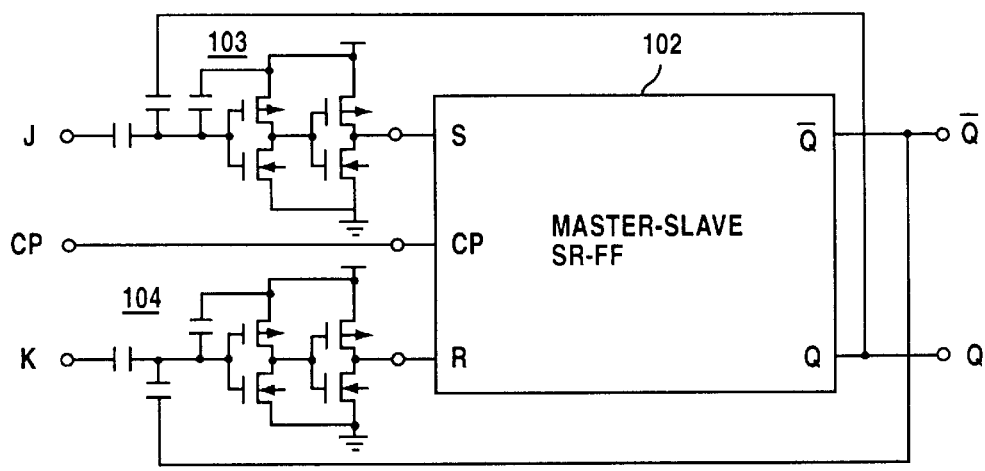
FIG. 15 is a diagram illustrating a JK flip-flop circuit.

FIG. 15 is a diagram illustrating a JK flip-flop circuit. In this circuit diagram, the OR circuits 103 and 104, as is shown in FIG. 6, are arranged on the input stage of a master slave RS flip-flop circuit 102, as is shown in FIG. 14. Inputs J and K are provided for the OR circuits 103 and 104, and outputs Q and /Q cross connected to each other for feedback. With this arrangement, when both of the inputs J and K are 0, and when output Q is 0 and /Q is 1, S=0 and R=1, and outputs Q and /Q are not changed, even during one cycle of clock CP. With J=0 and K=1, the output of the OR circuit 104 is 1 and R=1, and output Q is forcibly set to 0 during one cycle of clock CP. With J=1 and K=0, the output of the OR circuit 103 is 1 and S=1, and the output Q is forced to 1 during one cycle of clock CP. With J=K=1, output Q is inverted to /Q, which is the previous state. These operations are the same as those of a conventional, common JK flip-flop circuit.

Figure 16:
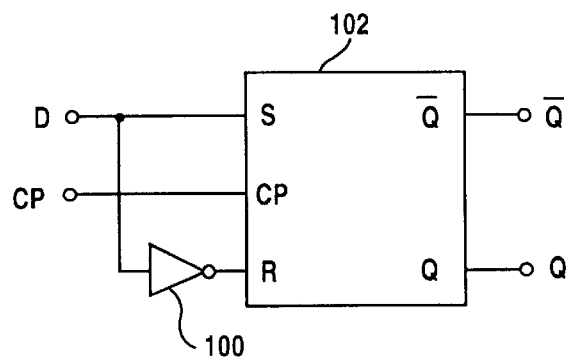
FIG. 16 is a diagram illustrating a D flip-flop circuit.

FIG. 16 is a diagram illustrating a D flip-flop circuit. In the D flip-flop operation, when a non-inverted signal and an inverted signal of input D are received at input S and input R of a master slave circuit 102, D input value is fetched to output Q in response to clock CP=1.

Figure 17:
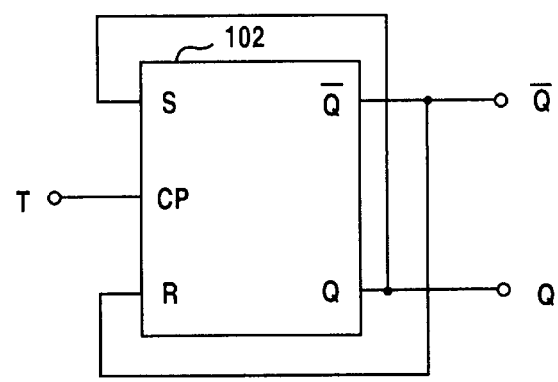
FIG. 17 is a diagram illustrating a T flip-flop circuit.

FIG. 17 is a diagram illustrating a T flip-flop circuit. Outputs Q and /Q of a master slave circuit 102 are fed back to input S and input R. As a result, when the T input is 0, the previous output Q is fetched, and when the T input is 1, the previous output /Q is fetched. In other words, the outputs are toggled by the T input.

Figures 18A, 18B:
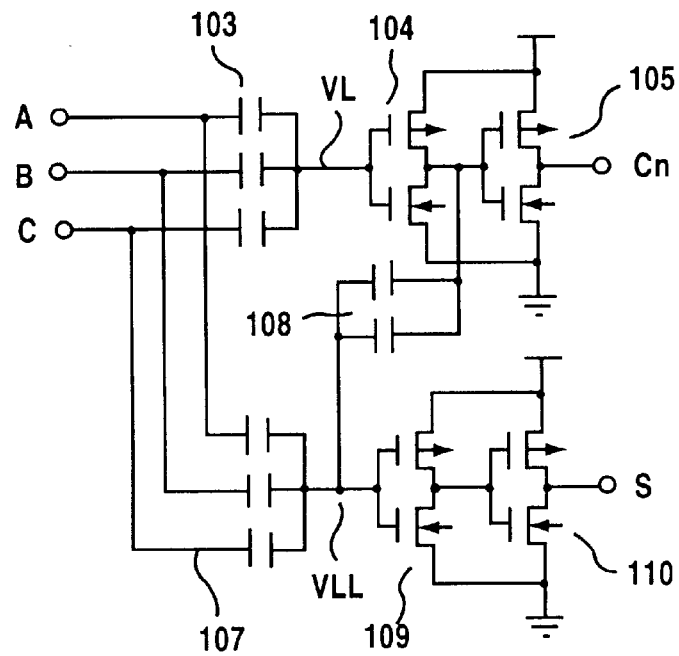
FIGS. 18A and 18B are a diagram and a truth table for a full adder.

FIG. 18A is a circuit diagram illustrating a full adder, and FIG. 18B is its truth table. When the two or three inputs out of A and B and the carry C from a lower digit are 1, carry output Cn is 1. In other words, this is a majority circuit. Therefore, the capacitors 103 and two inverters 104 and 105 have the same structure as those in FIG. 2. From the truth table, when input A is 0, the sum output S is the EXOR output of inputs B and C, and when input A is 1, the sum output S is the EQ output of inputs B and C. By referring to the circuits in FIGS. 11A and 11C and to the majority circuit in FIG. 2, three-input majority circuits are arranged in parallel and inverted outputs of the majority circuits are fed back to the other inputs via a capacitor 108 having a doubled capacitance, thereby providing a full adder. That is, when input A=0, output S is EXOR logic, as is described for the circuit in FIG. 11A. When input A=1, output S is EQ logic, as is described for the circuit in FIG. 11C.

Although a conventional, common full adder requires 20 to 30 transistors, for example, the full adder in this example requires, for example, only eight transistors and eight capacitors.

FIG. 19 is an output waveform diagram for confirming the operation of the full adder in FIG. 18. VL indicates an input level for an inverter 104, and VLL indicates an input level for an inverter 109. Inputs A, B and C, and outputs Cn and S represent logic 1 (power voltage Vdd) and logic 0 (ground) levels. With this waveform diagram, the operation according to the truth table in FIG. 18B can be confirmed.

As is described above, since the capacitive coupling circuit is employed at the input stage, various logic circuits, flip-flop circuits and full adders can be constituted with much smaller number of transistors. Therefore, even when these circuits are integrated with an image sensor, an integrated circuit can be provided wherein a sufficiently large area for the sensor can be ensured and a digital value can be output.

[Flash AD converter]

Figure 20:
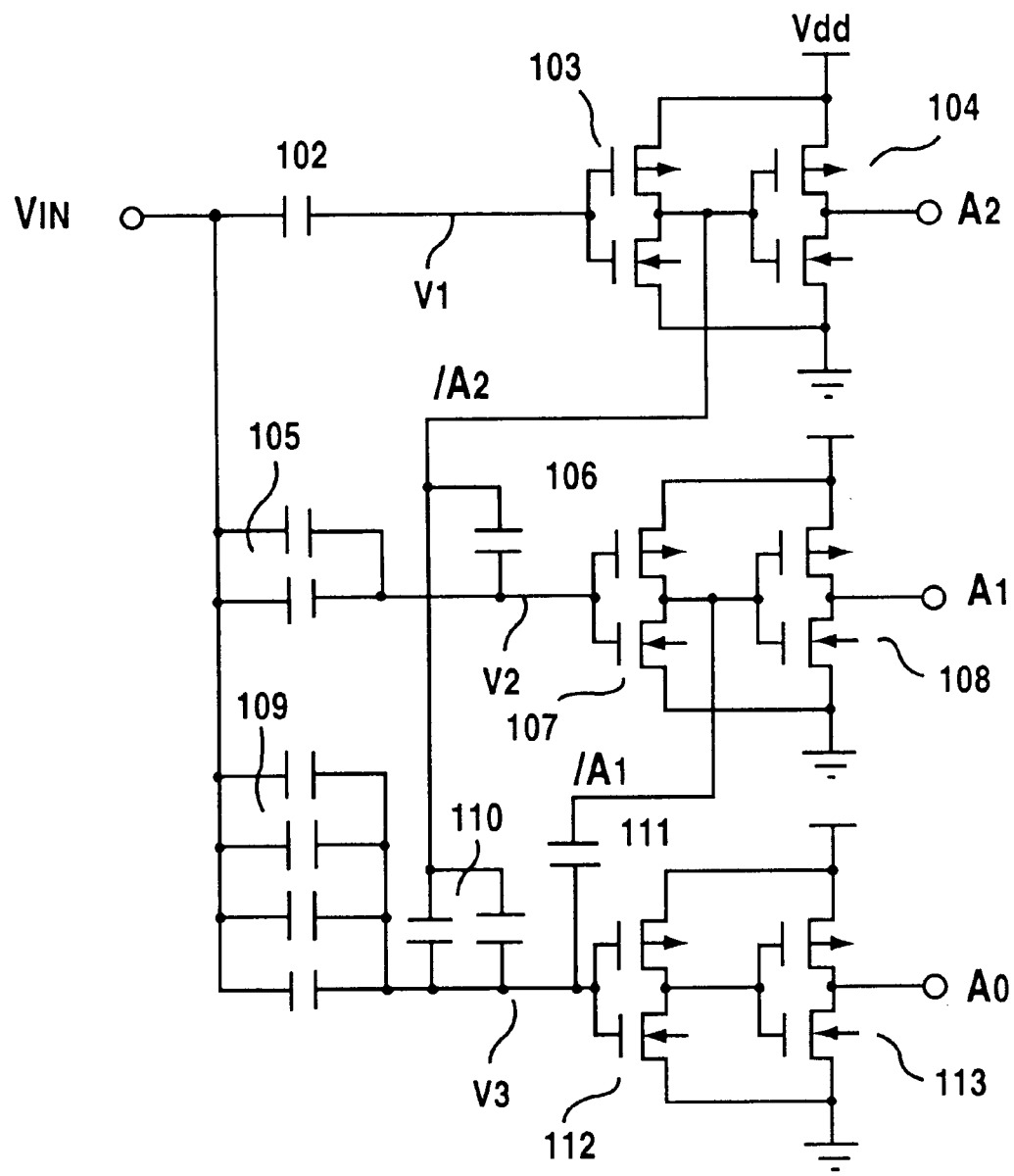
FIG. 20 is a circuit diagram for a flash AD converter.

FIG. 20 is a diagram illustrating a flash AD converter. This circuit converts analog input $V_{IN}$ into 3-bit digital outputs $A_2$, $A_1$ and $A_0$. In this circuit structure, three one-input majority circuits are arranged in parallel. The inverted output of the majority circuit that outputs upper bits is fed back to the lower-bit input terminal with a weighted factor of ½.

More specifically, for the most significant bit $A_2$, input terminal $V_{IN}$ is connected to an inverter 103 via a capacitor 102. Thus, with input $V_{in}$>Vdd/2, the inverter 103 inverts the most significant bit $A_2$ to 1.

Following this, for the second most significant bit $A_1$, the input terminal $V_{IN}$ is connected to an inverter 107 via a capacitor 105 having a doubled capacitance, and the output terminal of the inverter 103 is connected to the inverter 107 via a capacitor 106. That is, the output of the inverter 103 with a weighted factor of ½ is fed back, as a result, the input of the inverter 107 is $(2V_{IN}+/A_2)$ /3. Thus, when $$(2V_{IN}+/A_2)/3 > Vdd/2,$$

the inverter 107 inverts the second most significant bit $A_1$ to 1. That is, when $A_2=0$, if $V_{IN}$>Vdd/4 then $A_1=1(Vdd)$; and when $A_2=1(Vdd)$, if $V_{IN}$>3Vdd/4 then $A_1=1(Vdd)$.

Further, for the third bit $A_0$, input terminal $V_{IN}$ is connected via a capacitor 109 having a quadrupled capacitance to an inverter 112; the output terminal of the inverter 103 is connected via a capacitor 110 having a doubled capacitance to the inverter 112, and the output terminal of the inverter 107 is connected via a capacitor 111 to the inverter 112. In other words, the output of the inverter 103 has a weighted factor of ½, the output of the inverter 107 has a weighted factor of ¼, and both outputs are fed back. As a result, the input of the inverter 112 is $(4V_{IN}+2/A_2+/A_1)/7$. Therefore, when $$(4V_{IN}+2/A_2+/A_1)/7 > Vdd/2,$$

the inverter 112 inverts the third bit $A_0$ to 1. That is, when $A_2=0$ and $A_1=0$, if $V_{IN}$>Vdd/8 then $A_0=1$;

when $A_2=0$ and $A_1=1(Vdd)$, if $V_{IN}$>3Vdd/8 then $A_0=1$;

when $A_2=1(Vdd)$ and $A_1=0$, if $V_{IN}$>5Vdd/8 then $A_0=1$; and when $A_2=A_1=1(Vdd)$, if $V_{IN}$>7Vdd/8 then $A_0=1$.

Figure 21:
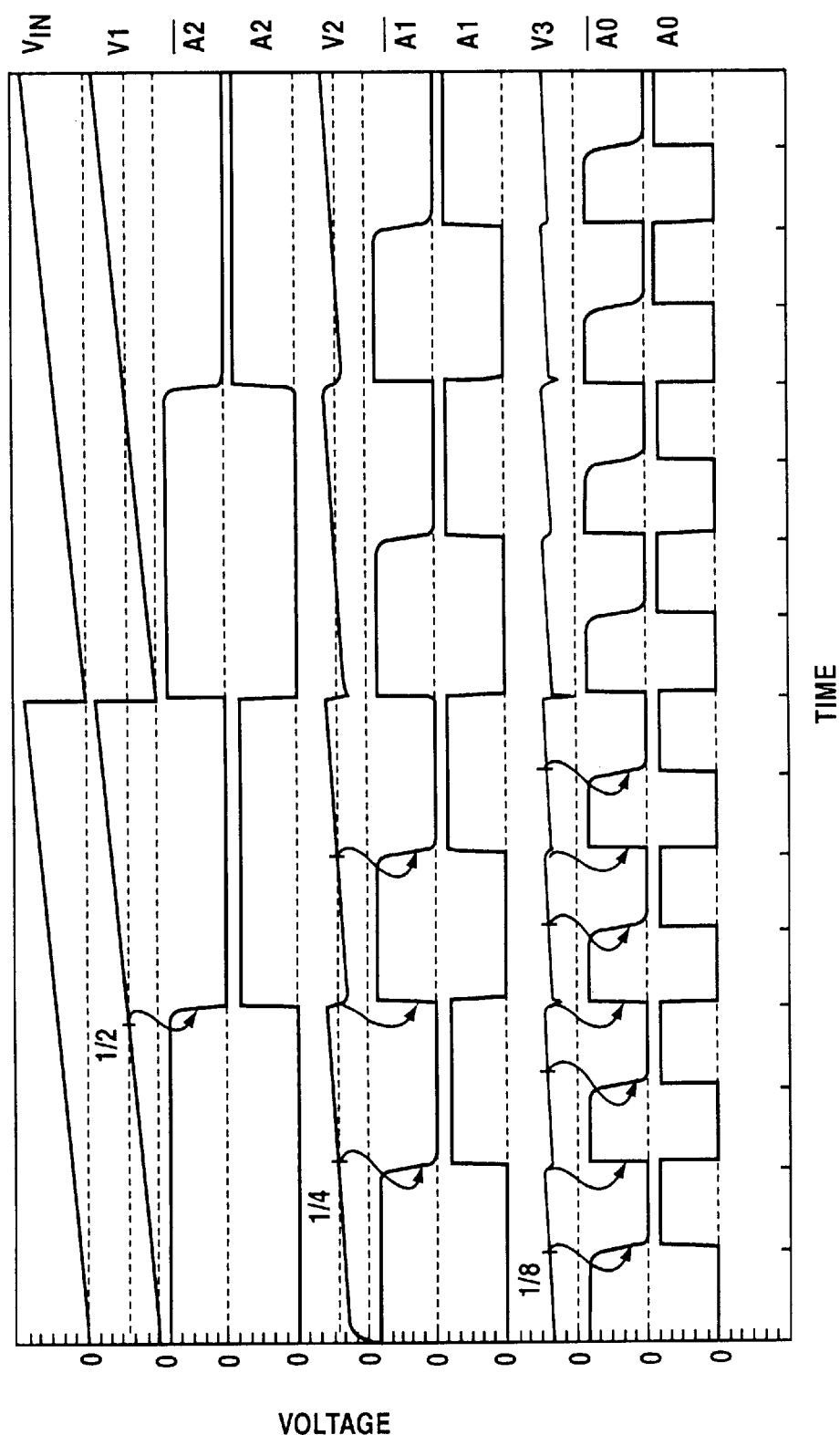
FIG. 21 is a waveform diagram for the operation of the AD converter in FIG. 20.

FIG. 21 is a waveform diagram showing the operation of the flash AD converter in FIG. 20. In this waveform diagram, changes of individual nodes and output bits $A_2$, $A_1$ and $A_0$ are shown when input $V_{IN}$ is linearly changed from 0 V to power voltage Vdd. In this example, input $V_{IN}$ is changed twice. As is apparent from the waveform diagram, the inverter 103 sensitively performs inversion, while the inverter 112 corresponding to the lower bit $A_0$ must detect a slight change in input V3. Therefore, although the circuit in FIG. 20 can theoretically obtain more accurate digital output, it is difficult, depending on the inversion sensitivity of the inverter at a threshold value, to ensure the accuracy of the lower bit.

It should be noted that the capacitor 102 in FIG. 20 may be omitted. When the capacitors 102, 105 and 109 have almost the same capacitance, the capacitors 106 and 110 must have ½ their capacitance, and the capacitor 111 must have ¼ their capacitance. In other words, relative to the inverters 107 and 112, the inverted output of output $A_2$ is provided with a weighted factor of ½, and the inverted output of output $A_1$ that is provided with a weighted factor of ¼.

As is shown in FIG. 20, to constitute the 3-bit AD converter requires only 12 transistors. In other words, for an N-bit output, 4N transistors can constitute an AD converter. This number of transistors is much smaller than that required for a conventional, common AD converter.

Figure 22:
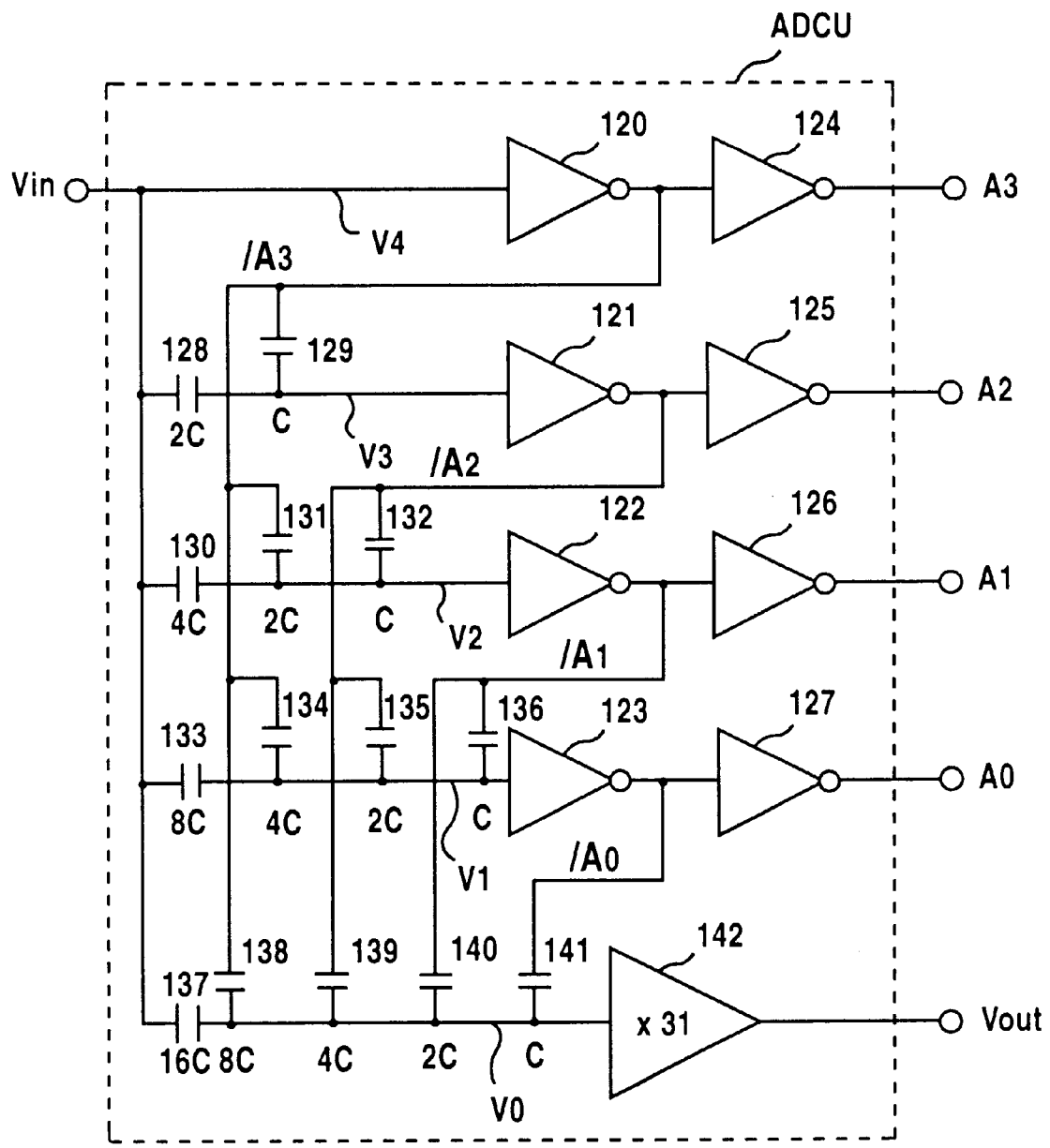
FIG. 22 is a circuit diagram for an AD converter for generating a 4-bit digital output and a remainder.

FIG. 22 is a diagram illustrating an AD converter for generating 4-bit digital output and the remainder of the least significant bit. In this circuit, the 3-bit AD converter in FIG. 20 is expanded to four bits. And voltage V0, corresponding to a remainder at the least significant bit, is amplified 31 times by an output buffer amplifier 142 so that an analog output Vout for AD conversion of lower bits is generated. Comparators 120 through 123, which are constituted by a CMOS inverter, and CMOS inverters 124 through 127 are the same as in FIG. 20. Similarly in FIG. 20, in the capacitive coupling circuitry at the front stage, the inverted outputs of individual bits having a weighted factor of $½^n$ are provided to lower bit inverters 121, 122 and 123. In FIG. 22, the ratio of the capacitances are shown as C, 2C, . . . and 16C to simplify the drawing.

In this circuit, to simplify an explanation of the circuit configuration and the operation, the power voltages for the inverters are +Vds (logic 1) and –Vds (logic 0), and a reference voltage (threshold voltage) is shown as 0, which differ from those of the preceding examples. The full scale, therefore, is 2 Vds.

Voltages input to the inverters 120 through 123, which are comparators, are V4, V3, V2 and V1. Disregarding parasitic capacitance, analog voltage V0 supplied from the least significant bit $A_0$ to the lower level is represented as:

$$V0=(16Vin+8/A_3+4/A_2+2/A_1+/A_0)/31.$$

$A_3$ through $A_0$ are either +Vds or –Vds, and it should be noted that /A is an inverted signal of A. In addition, in general, analog input value Vin for N-bit output is $$Vin=A_{n-1}/2+A_{n-2}/2^2+ \ldots +A_1/2^{n-1}+A_0/2^n.$$

Consider the upper limit value and the lower limit value for V0. When, for example, Vin=1(+Vds), then $A_3A_2A_1A_0$= 1111 and $/A_3/A_2/A_1/A_0$=0000, so that $/A_3$ through $/A_0$ are all 0(–Vds) and $$V0=(16Vds-15Vds)/31=+Vds/31.$$

Further, when Vin=0(–Vds), $A_3A_2A_1A_0$=0000 and $/A_3/A_2/A_1/A_0$=1111, so that $/A_3$ through $/A_0$ are all 1(+Vds) and $$V0=(-16Vds+15Vds)/31=Vds/31.$$

In other words, the range for V0 is +Vds/31 to –Vds/31. To generalize this, $$V0=(A_{n-4}/2+A_{n-5}/4+ \ldots +A_1/2^{n-5}+A_0/2^{n-4})/(2^{n+1}-1).$$

Therefore, it is understood that when the voltage V0 is multiplied 31 times (generally ($2^{n+1}-1$) times), the result V0 is analog value of from –Vds to +Vds, and can be employed as input Vin for lower bits AD converter. For the above general expression for V0, when the voltage V0 is multiplied $(2^{n+1}-1)$ times, the general expression for vin for lower bits can be obtained.

In this embodiment as shown in FIG. 22, the amplifier 142 for amplification 31 times is provided and the amplified output $V_{out}$ is used for the input for a lower AD converter.

Figure 23:
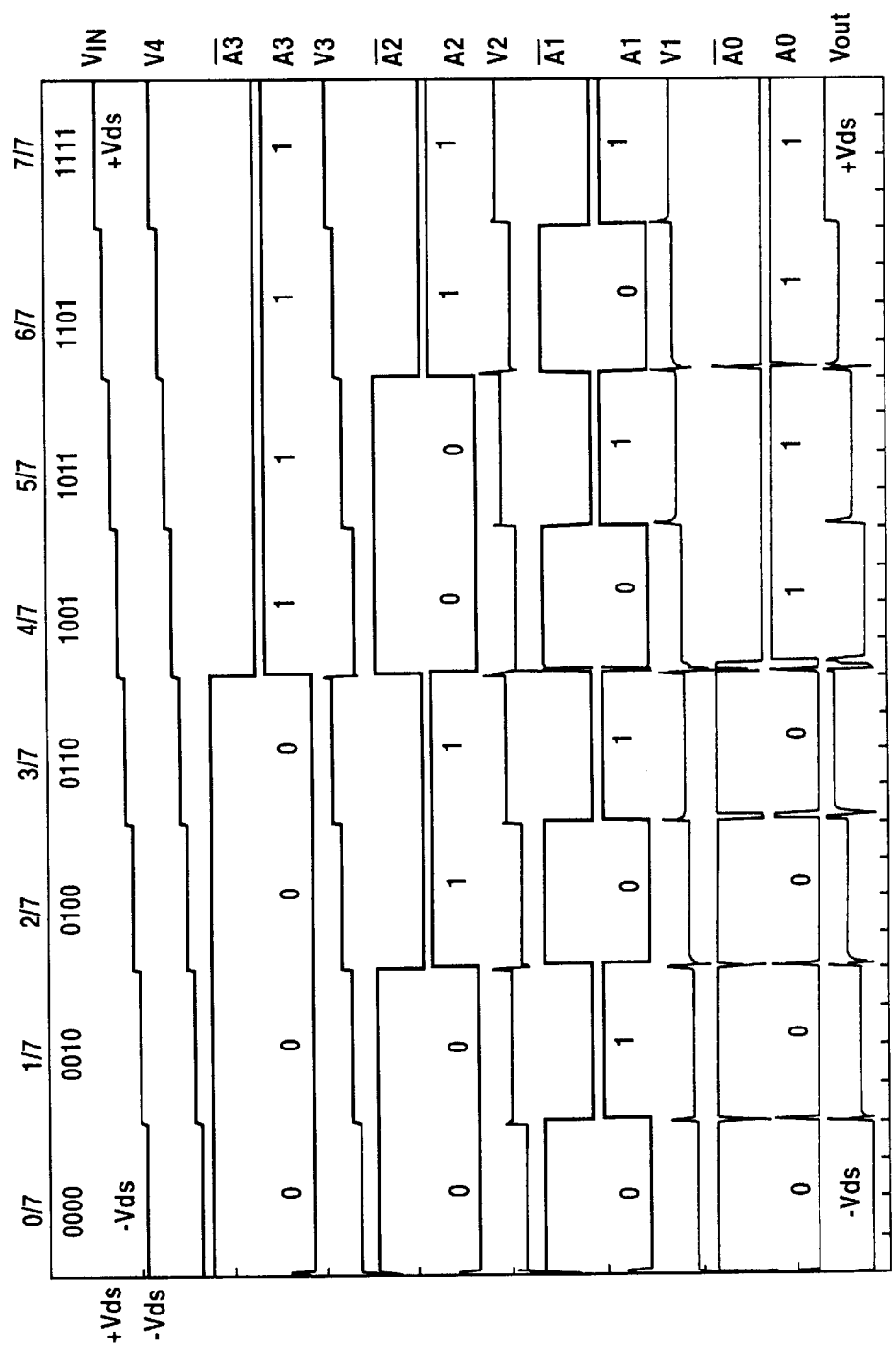
FIG. 23 is a waveform diagram for the AD converter in FIG. 22.

FIG. 23 is a waveform diagram showing outputs $A_3$ through $A_0$ and their inverted values $/A_3$ through $/A_0$, Vout and nodes V4 through V1 relative to eight values of 0/7 through 7/7, which are obtained by dividing into seven parts the range −Vds to +Vds for input Vin in FIG. 22. As is apparent from this waveform diagram, the analog input value Vout for the lower bit is −Vds and logic 0 at 0/7=(0000), while it rises nearly to 0 at 3/7=(0110), and is further increased up to a maximum +Vds (logic 1) at 7/7=(1111).

Figure 24:
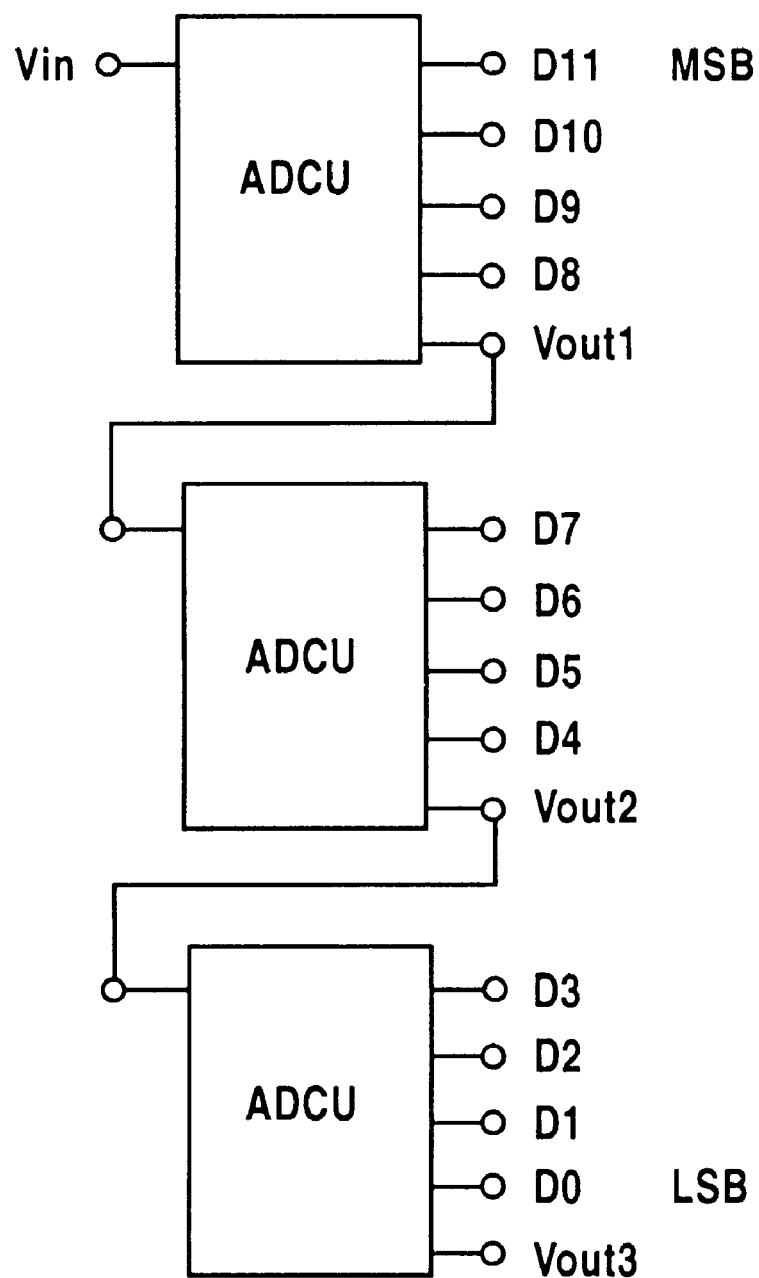
FIG. 24 is a circuit diagram illustrating a 12-bit flash AD converter.

FIG. 24 is a diagram of a 12-bit flash AD converter. For this circuit, three of the 4-bit AD converters shown in FIG. 22 are employed as three ADCU units, and the lowest output Vout for the unit ADCU is used as the analog input for the lower unit ADCU. The first feature of the multiple bit AD converter is that, since the 4-bit AD converter serves as a single unit, the number of capacitors in the total constitution is three times the number of those in a single unit ADCU. If the circuit in FIG. 22 is simply expanded, the number of capacitors in the capacitive coupling circuit will be greatly increased, and the original object of reducing the number of required devices can not be achieved. The first feature can avoid such a problem. The second feature is that the multiple-bit AD converter can be provided without a great increase in the sensitivity of the inverters 120 through 123, which are comparators. When the circuit in FIG. 22 is simply expanded, very acute sensitivity is required for inversion at the threshold value of the inverter for the lowest comparator. In this embodiment, however, since a remainder in each unit is multiplied 31 times, and the result is used as analog input for the next unit, very high sensitivity is not required for the inverter of each unit.

Figure 25:
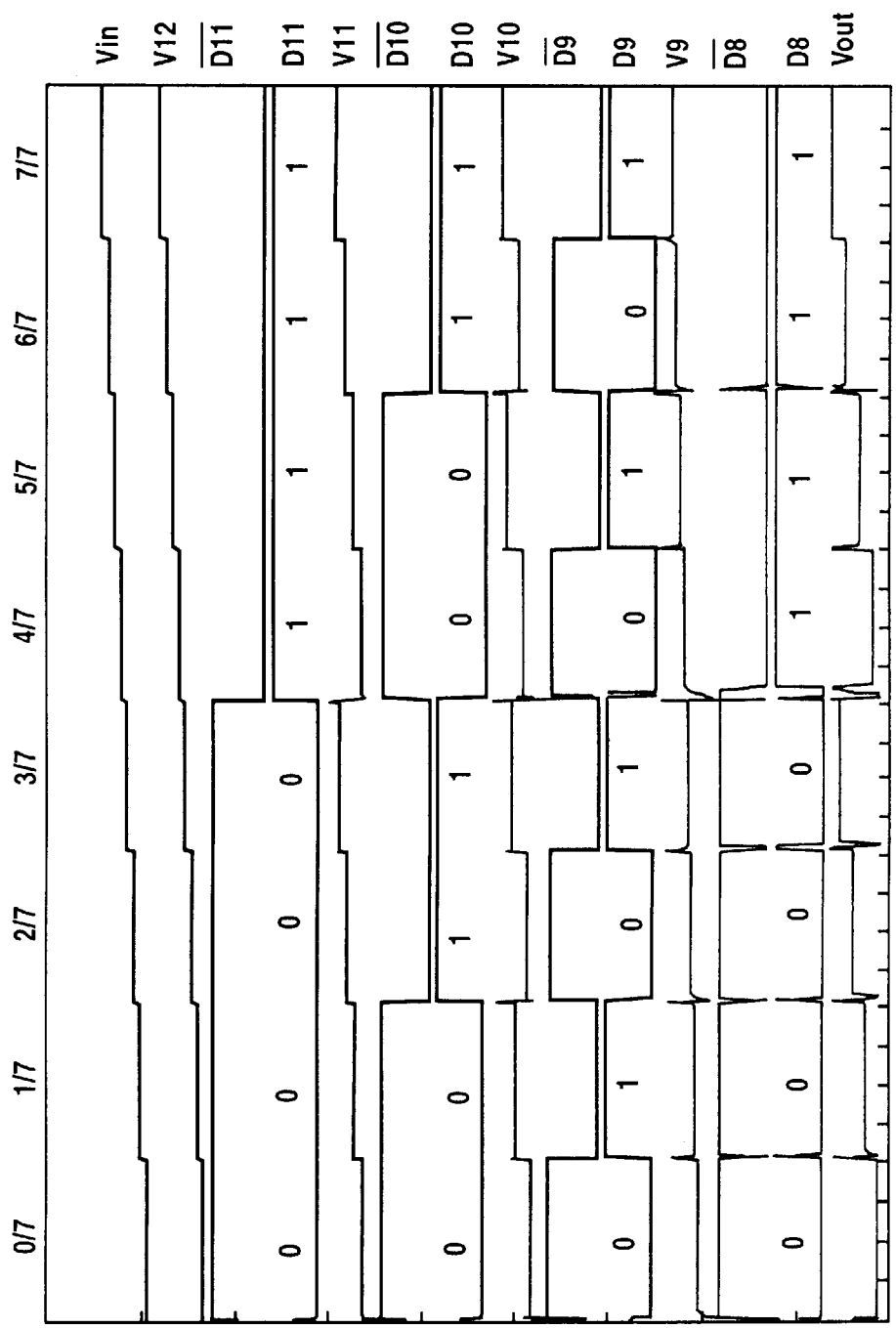
FIG. 25 is waveform diagram (1) for the AD converter in FIG. 24.
Figure 26:
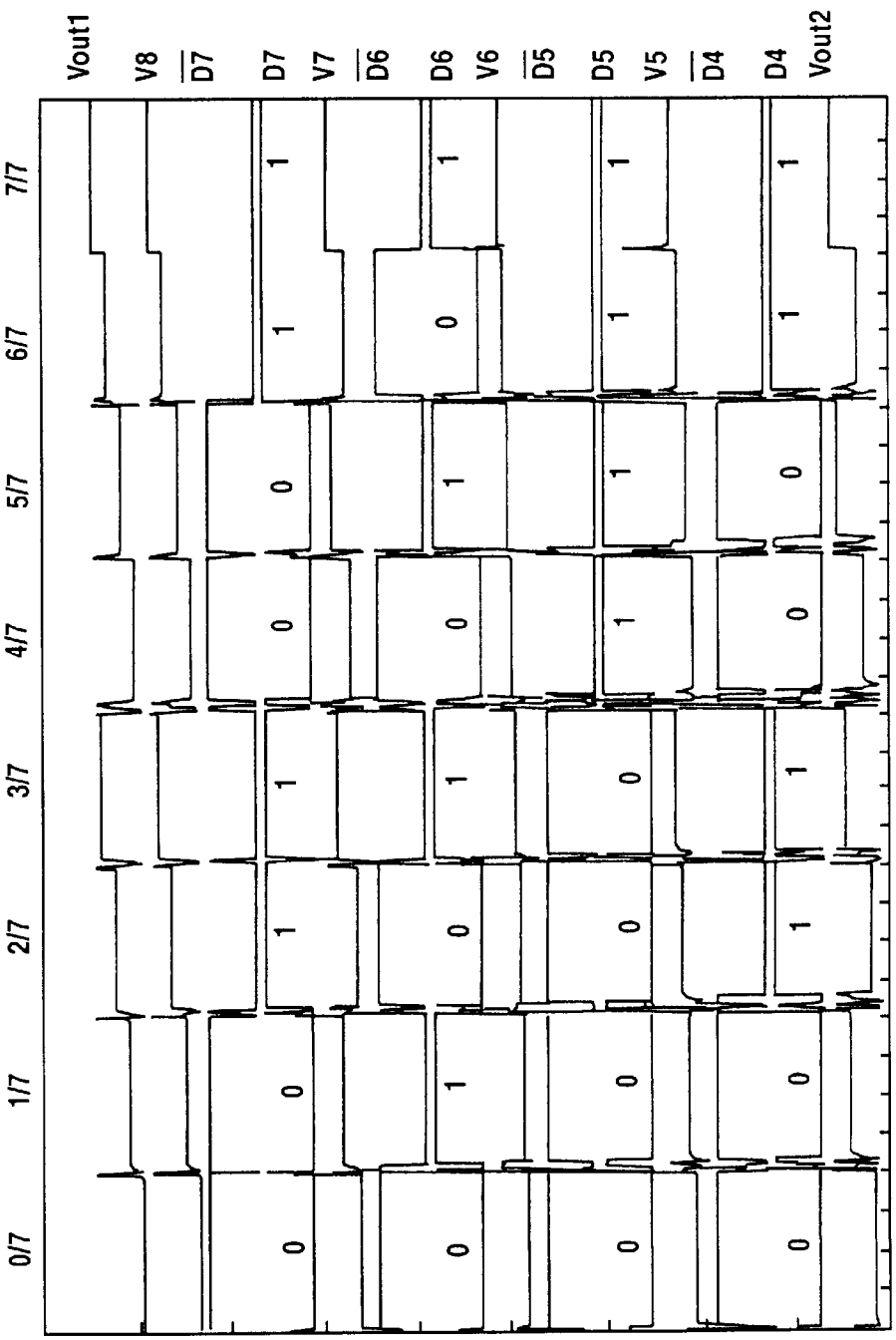
FIG. 26 is waveform diagram (2) for the AD converter in FIG. 24.
Figure 27:
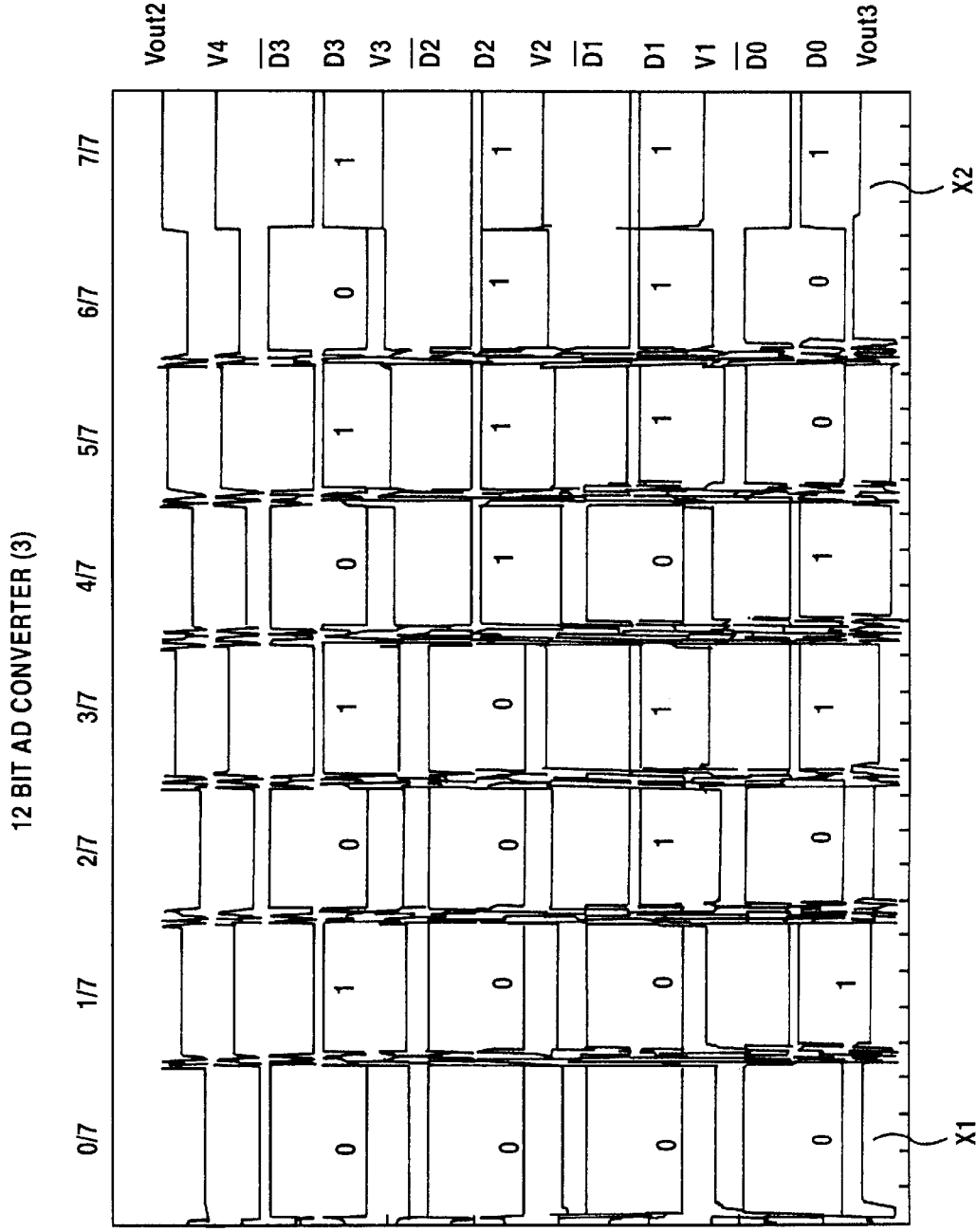
FIG. 27 is waveform diagram (3) for the AD converter in FIG. 24.

FIGS. 25, 26 and 27 are waveform diagrams for the 12-bit AD converter in FIG. 24. In these waveform diagrams, as well as in FIG. 23, the individual outputs and the changes of voltage at nodes are shown relative to eight values 0/7 through 7/7 obtained by dividing into seven parts the range of −Vds to +Vds. Voutl obtained by multiplying the remainder of the upper four bits $D_{11}D_{10}D_9D_8$ is used as analog input for the lower bits $D_7D_6D_5D_4$. Furthermore, the remainder Vout2 is employed as analog input for the lowest bits $D_3D_2D_1D_0$.

Figure 28:
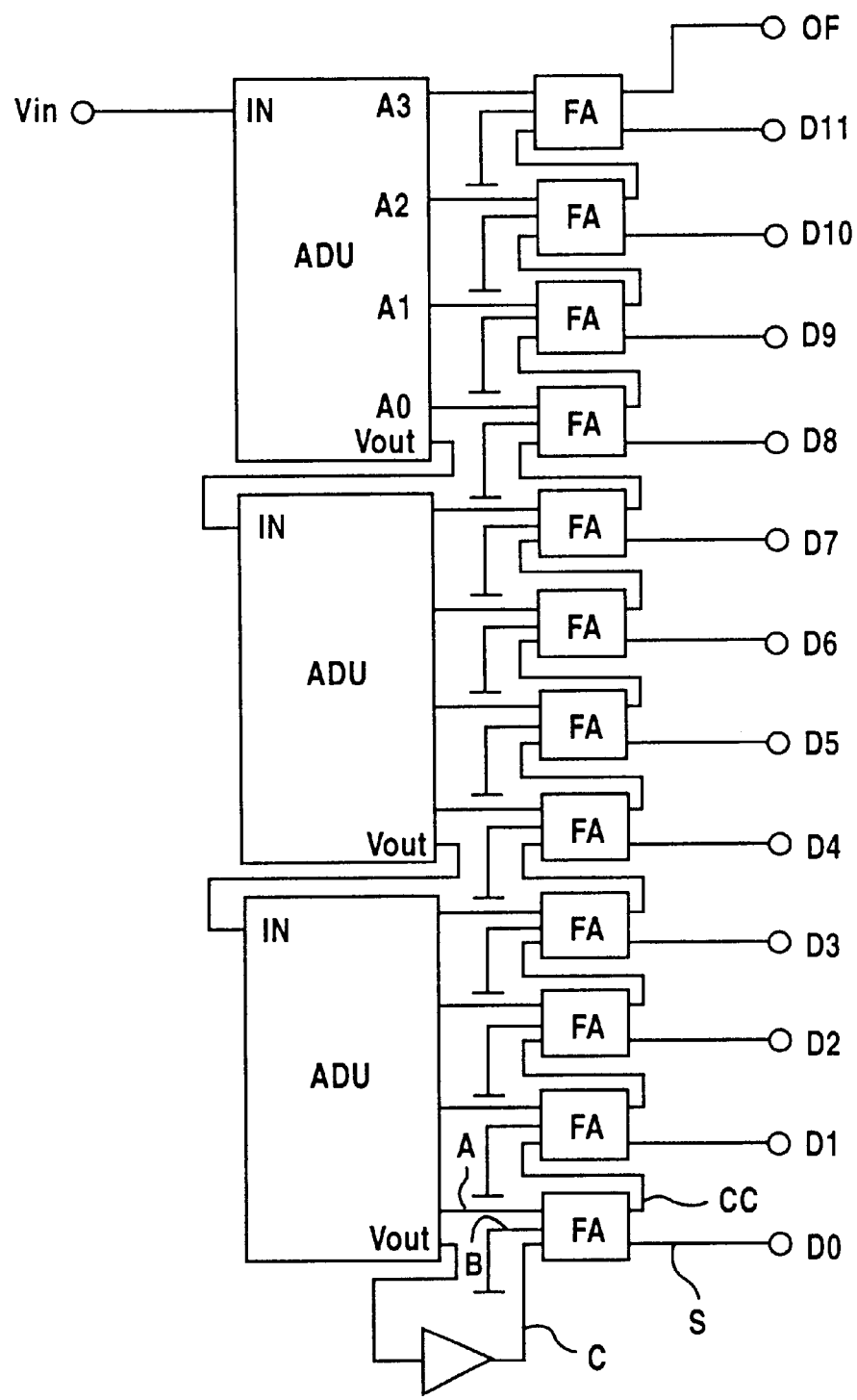
FIG. 28 is a diagram of a 12-bit AD converter having a rounding function and an overflow.

FIG. 28 is a diagram illustrating a 12-bit AD converter having a rounding function and an overflow. The 12-bit AD converter in FIG. 24 makes all of the digital outputs, $D_{11}$ to $D_0$, to 1 for a full-scale input. However, in actual 12-bit AD conversion, if the full scale is 4096, an input value of 0 to 4095 corresponds to a value of (000000000000) to (111111111111), and full scale input value 4096 overflows as (1000000000000). In the circuit in FIG. 28, in order to correctly output an overflow, the analog output for the least significant bit $A_0$ is rounded (rounded off), and the full adders FA are additionally provided for the individual bits to output an overflow bit OF. Each of the full adders FA has addition input terminals A and B, a carry input terminal C, and an addition output terminal S and a carry output CC. The digital output bit is received at the addition input terminal A. The addition input B is fixed to 0, and the carry input terminal is connected to the carry output terminal CC of the lower full adder. The analog output for the least significant bit is a remainder of the 12-bit AD converter and is rounded off by a comparator 144. The result is transmitted to the carry input C.

Assuming that the full scale analog input Vin is received and the digital output is (111111111111), the least significant bit analog output exceeds the threshold value for the comparator 144. Then, when logic 1 is input at the input terminals A and C of the lowest full adder FA, the carry output CC is 1 and the addition output S ($D_0$) is 0. In the same manner, the upper full adders have a carry output of 1 and an addition output of 0. As a result, the overflow bit OF is 1 and the remaining digital outputs are 0.

The capacitive coupling logic circuit in FIG. 18 is employed as the full adders FA in FIG. 28.

For the above described AD converters in FIGS. 22, 24 and 28, the gain of the amplifier for the amplification of the remainder of the least significant bit greatly affects the accuracy of the lower bit. In other words, the analog value that is obtained by amplification using the gain of the amplifier 142 is used as the analog input for the lower bit AD converter. When the analog value can not be amplified accurately, an incorrect analog value is converted. Generally, When fabricating a monolithic IC, the gain of an amplifier tends to be affected by the process. Therefore, it is preferable that a structure adopted that is not easily affected by the process. Especially when the number of bits of the digital output is to be increased, more accuracy for a gain is required. One of the countermeasures for this is the use of a feedback resistor, as a voltage follower, that is so designed that slight external adjustments are possible.

The accuracy in AD conversion depends on the characteristics of the inverters 120 through 123 that act as comparators. It is necessary, therefore, to increase the accuracy of the power supply voltages provided for the inverters and the accuracy of threshold values and of capacitances on the input side. In addition, a parasitic capacitor in the input side capacitive coupling circuit can not be disregarded. Thus, one of the countermeasures is the forming of many capacitors having the same capacitance and the performance of trimming thereof at the comparison step.

It is also important that time constants for each input section and the feedback section, which have different capacitances, be equalized, in order to reduce a transition response as understood from the calculation result. In FIGS. 23 and 25 through 27 are shown the excessive responses that occurred between the input values.

Figure 29:
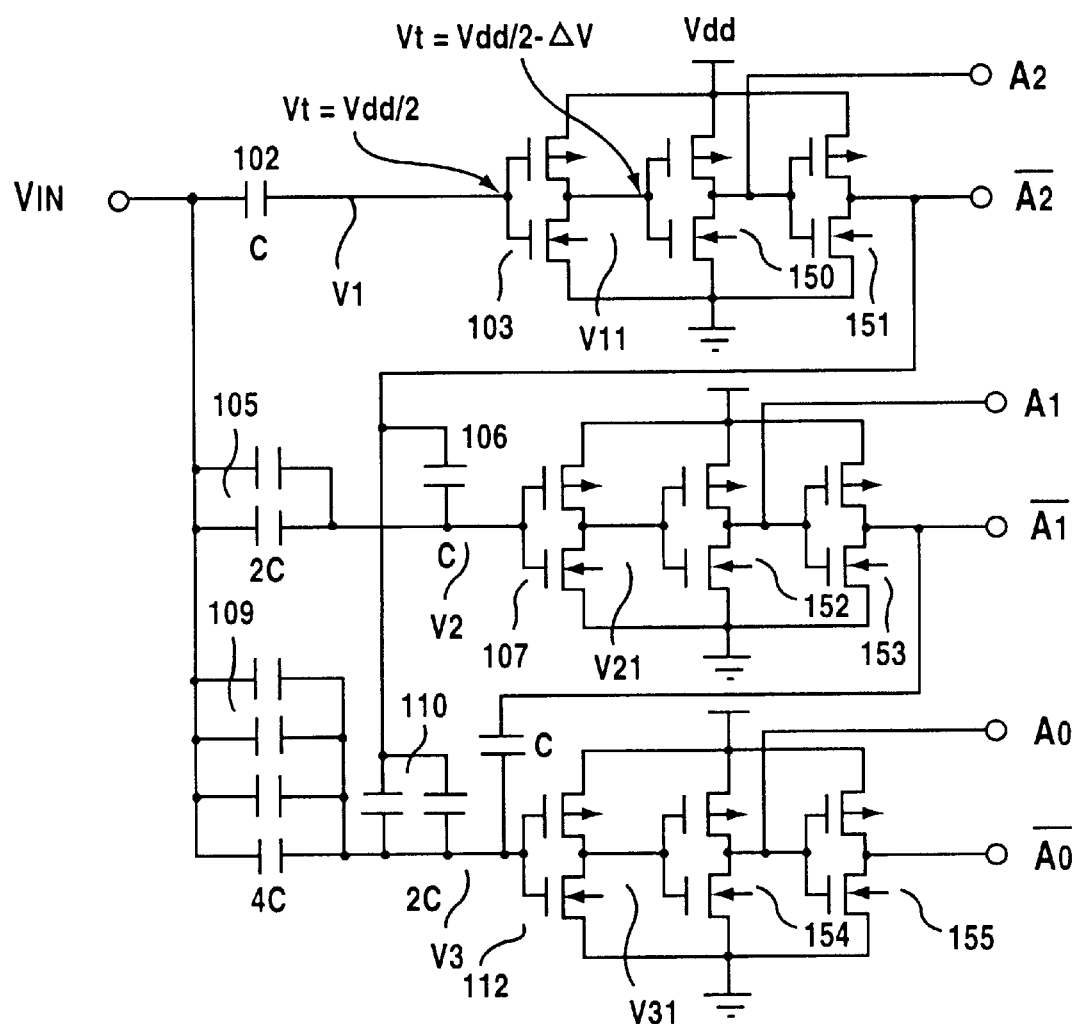
FIG. 29 is a diagram illustrating another example of a 3-bit AD converter circuit.

FIG. 29 is a diagram illustrating another 3-bit AD converter. The same reference numerals as are used for the 3-bit AD converter in FIG. 20 are used to denote corresponding and identical components. The difference between the circuit in FIG. 29 and the circuit in FIG. 20 is that inverters 150, 152 and 154, the threshold values of which are shifted from Vdd/2 to Vdd/2+ΔV, are provided at the stage following the inverters 103, 107 and 112. The outputs of the inverters 150, 152 and 154 are employed as digital outputs. The inverters 151, 153 and 155, which have a threshold value of Vdd/2, invert the digital outputs, and the inverted outputs are fed back to the lower inverters. The capacitive coupling circuitry at the input stage is the same as that in FIG. 20.

In this circuit, when the full scale is Vdd (e.g., 5 V), the threshold values of the inverters 103, 107 and 112 at the first stage are Vdd/2 (2.5 V), the threshold values of the inverters 150, 152 and 154 at the second stage are Vdd/2−ΔV (2.4 V), and the threshold values of the inverter at the final stage 151, 153 and 155 are Vdd/2 (2.5 V). Since the threshold values of the inverters at the second stage need only be shifted from Vdd/2, they may be Vdd/2+AV, for example.

When the analog input Vin is, for example, exactly ½, ¼ or ⅛ of the full scale, the P channel and N channel transistors of the inverters at the first stage are rendered conductive by the input of the threshold values. As a result, the outputs of the inverters are Vdd/2. In the example circuit in FIG. 20, therefore, in accordance with the outputs Vdd/2, the inverters 104, 108 and 113 also output Vdd/2. Thus, a correct binary digital output can not be generated.

Figure 30:
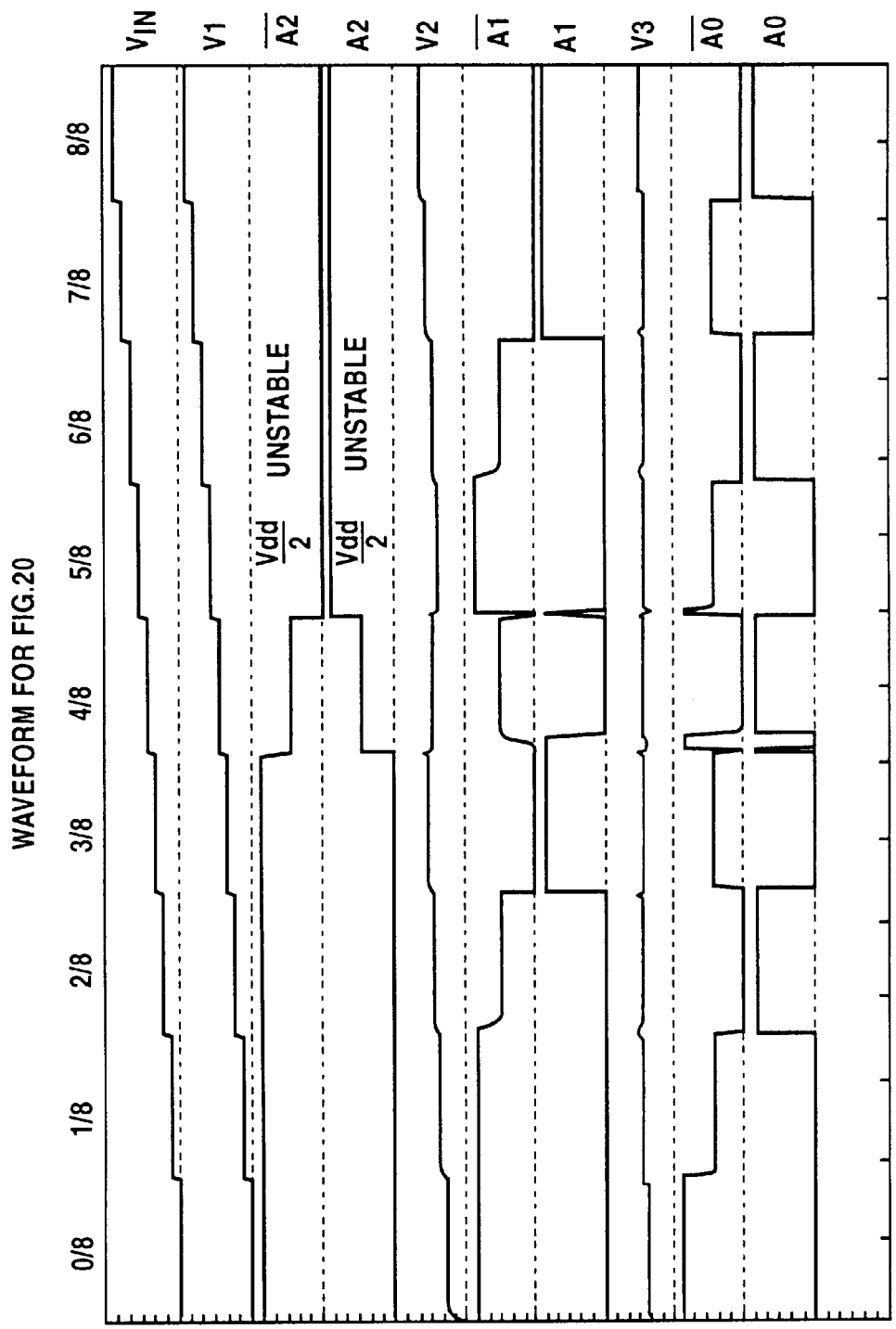
FIG. 30 is a waveform diagram for the AD converter in FIG. 20.

FIG. 30 is a waveform diagram for the example circuit in FIG. 20 when the analog input Vin is Vdd/8, 2Vdd/8, 3Vdd/8, 4Vdd/8, 5Vdd/8, 6Vdd/8, 7Vdd/8 and 8Vdd/8. As is shown in FIG. 30, output Vdd/2 is generated for analog input 4Vdd/8, and the condition becomes unstable. As a result, the accuracy of the digital output is not ensured.

In the circuit in FIG. 29, the threshold values of the inverters at the next stage are shifted. Thus, even when the inverters 103, 107 and 112 at the first stage generate Vdd/2 outputs V11, V21 and V31 for the above analog input, the inverters at the following stage generate digital outputs of either 1 or 0. In the example in FIG. 29, since the threshold values of the inverters 150, 152 and 154 are shifted to Vdd/2−ΔV, their outputs are always 1. Thus, the unstable condition shown in FIGS. 20 and 30 can be avoided.

Figure 31:
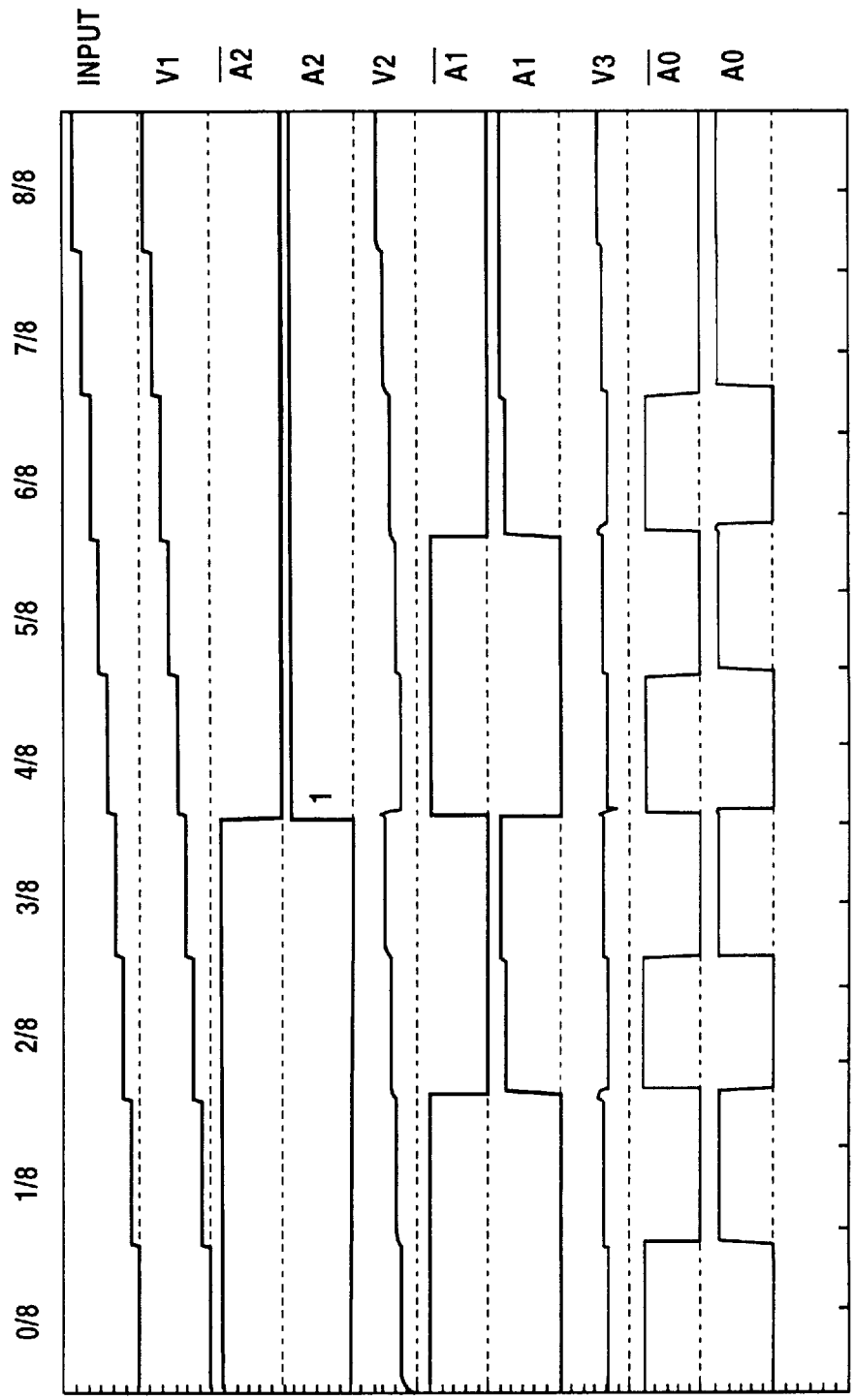
FIG. 31 is a waveform diagram for the AD converter in FIG. 29.

FIG. 31 is a waveform diagram for explaining the operation of the circuit in FIG. 29. When the analog input Vin is 4Vdd/8, output A2 is acquired as 1. Although during the actual AD conversion it is less probable that the analog input will be, for example, exactly ½ or ¼ of the full scale, the probability that the above erroneous operation will occur can be eliminated.

Figure 32:
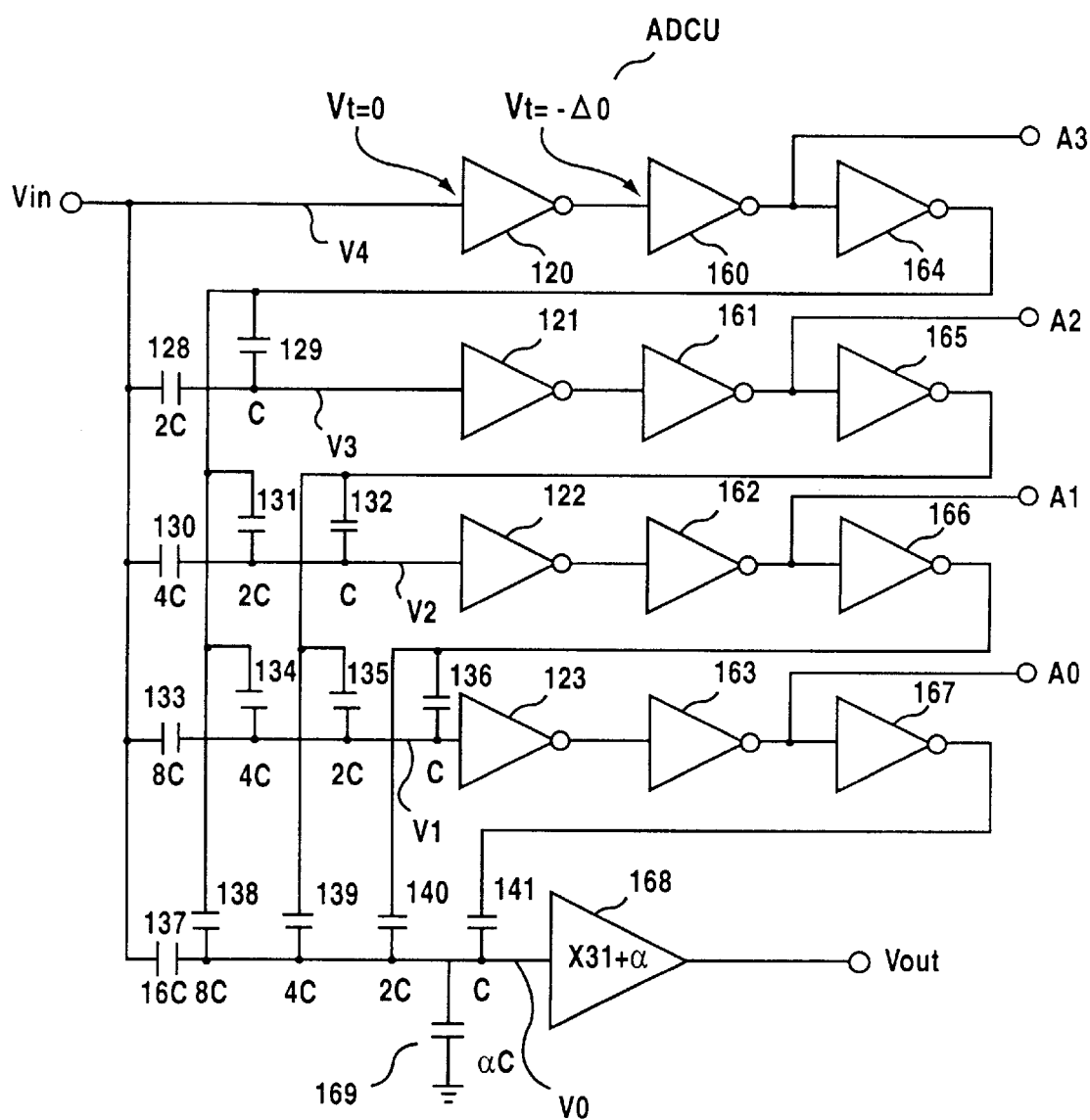
FIG. 32 is a diagram of another example of the AD converter for generating a 4-bit digital output and a remainder.

FIG. 32 is a diagram illustrating another example of the AD converter for generating a 4-bit digital output and a remainder. In this circuit, the AD converter in FIG. 29 is expanded to four bits, and the least significant bit remainder is amplified to generate analog output Vout at the lower stage. Further, to remove an error generated by a parasitic capacitor 169, the amplification rate of an amplifier 168 is corrected slightly.

For this circuit, as well as for that in FIG. 22, the power voltages of inverters 120 through 123, which are comparators, are set to +Vds and −Vds, and a reference voltage (threshold voltage) is 0 V. In addition, logic 1 is +Vds and logic 0 is −Vds. The same reference numerals as are used in FIG. 22 are used to denote corresponding or identical components. Unlike the circuit in FIG. 22, in the circuit in FIG. 32, the threshold values of inverters 161 through 163 at the next stage are shifted from 0 V by −ΔV. The amplification rate of an amplifier 168 is corrected to 31+α, and the capacitance of a parasitic capacitor 169 is assumed to be α times that of a capacitor 141.

The calculation of the amplification rate in FIG. 32 is performed the same as it is in FIG. 22. It should be noted that in FIG. 32, remainder V0 is smaller than the remainder in FIG. 22, while taking into consideration the presence of the parasitic capacitor 169 having a capacitance of αC. That is, $$V0 = (16Vin + 8/A_3 + 4/A_2 + 2/A_1 + /A_0)/(31+\alpha).$$

But when input Vin is (+Vds), $$V0 = (16Vds - 15Vds)/(31 + \alpha)$$
$$= +Vds/(31 + \alpha).$$

And when input Vin is 0(−Vds), $$V0 = (-16Vds + 15Vds)/(31 + \alpha)$$

$$= -Vds/(31 + \alpha).$$

Therefore, V0 falls in a range from −Vds/(31+α) to +Vds/(31+α). The analog input is amplified 31+α times by the amplifier 168, and the resultant input Vout for the lower bit is −Vds to +Vds. Generally, the analog input V0 is amplified $(2^{n+1}-1+\alpha)$ times.

Figure 33:
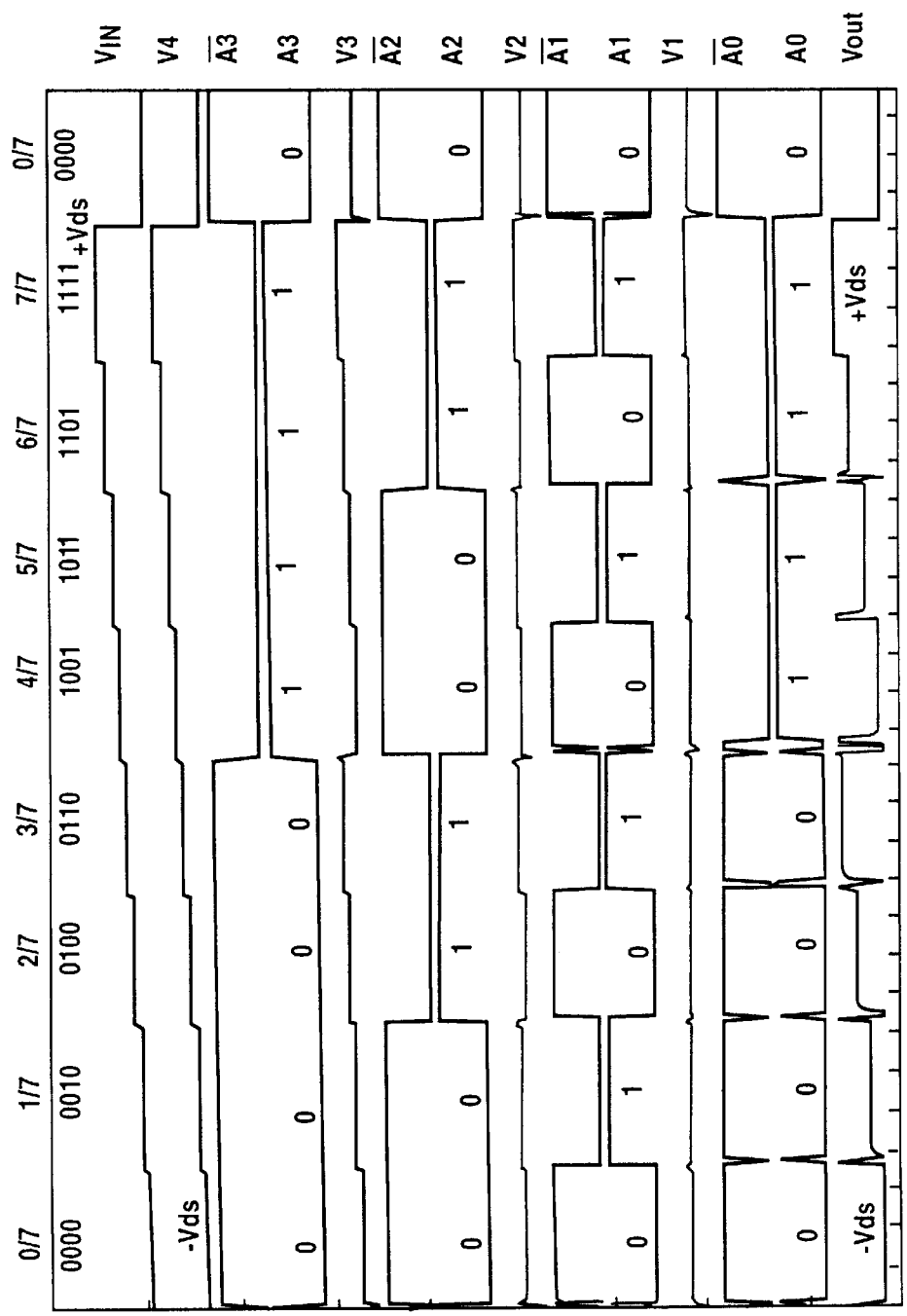
FIG. 33 is a waveform diagram for the AD converter in FIG. 32.

FIG. 33 is a waveform diagram prepared when 0/7 to 7/7 are input to the circuit in FIG. 32. The waveform in FIG. 33 is the same as that in FIG. 23 for the circuit in FIG. 22. Although not apparent from the diagram in FIG. 33, it should be noted that the analog value Vout for the lower level in FIG. 33 has higher accuracy.

Figure 34:
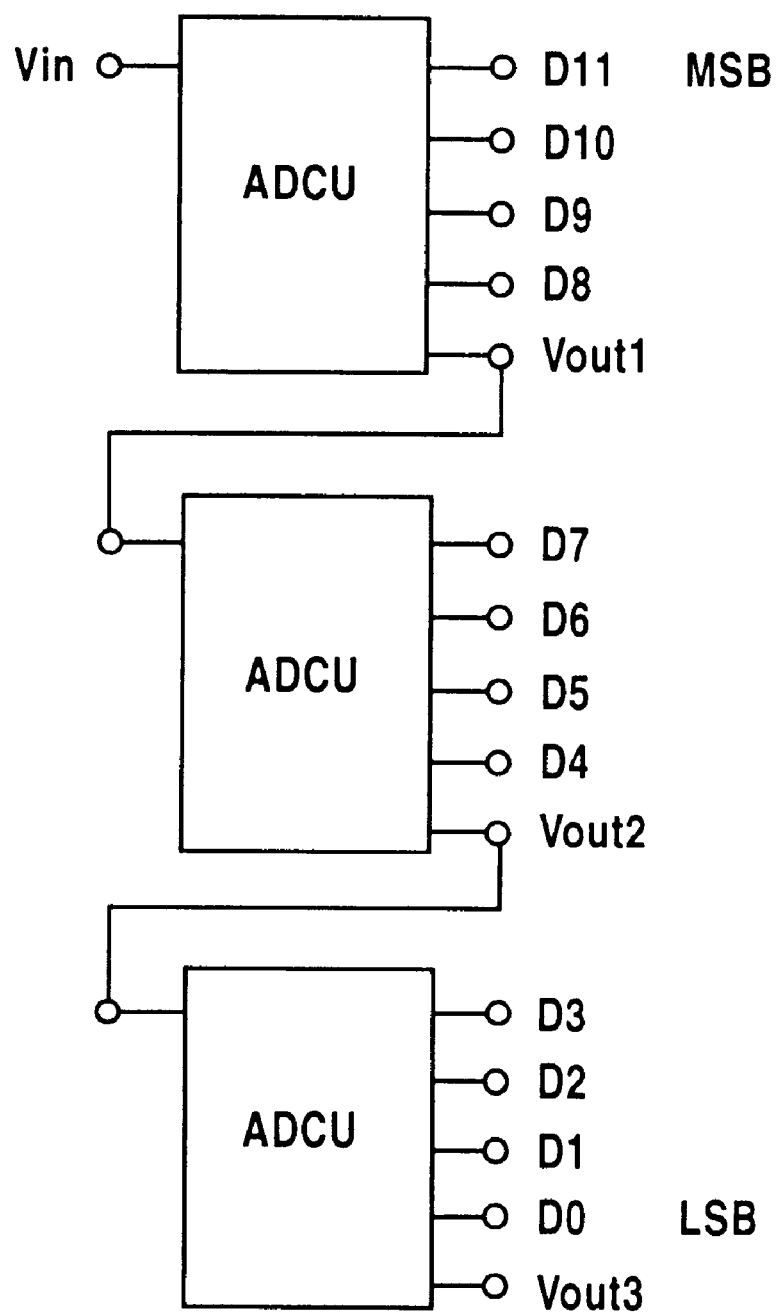
FIG. 34 is a diagram illustrating a 12-bit AD converter obtained by connecting three 4-bit AD converters in series.

FIG. 34 is a diagram illustrating a 12-bit AD converter provided by serially connecting three units of the 4-bit AD converters ADCU in FIG. 32. Although the circuit structure is the same as that in FIG. 24, analog inputs Vout1, Vout2 and Vout 3 of the individual ADCU units to the lower levels are amplified by an amplification rate by which the parasitic capacitance is compensated for, so that the analog input values are more accurate.

Figure 35:
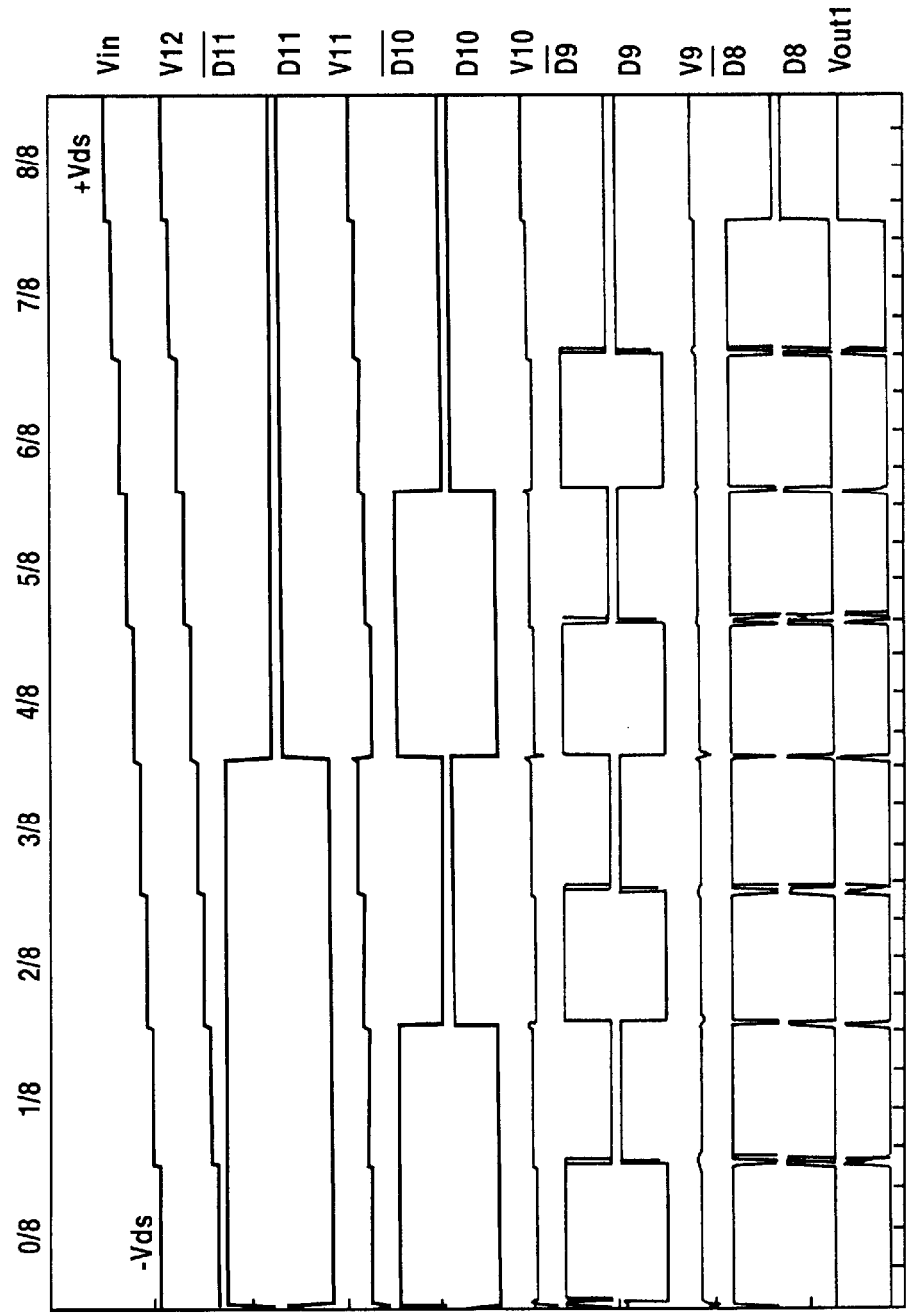
FIG. 35 is waveform diagram (1) when 0/8 to 8/8, in the range −Vds to +Vds, are given to the analog input terminal of the 12-bit AD converter in FIG. 34.
Figure 36:
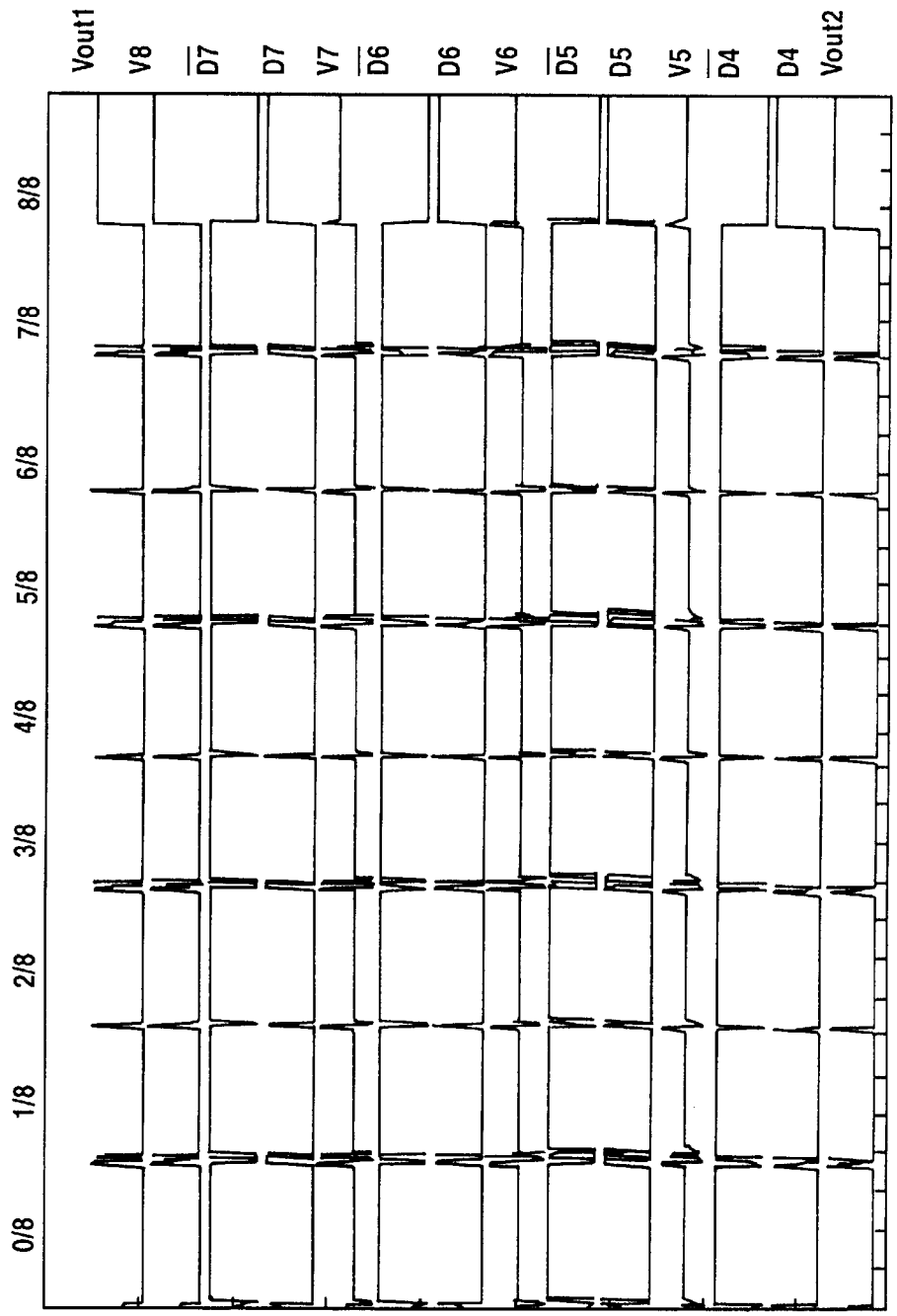
FIG. 36 is waveform diagram (2) when 0/8 to 8/8, in the range −Vds to +Vds, are given to the analog input terminal of the 12-bit AD converter in FIG. 34.
Figure 37:
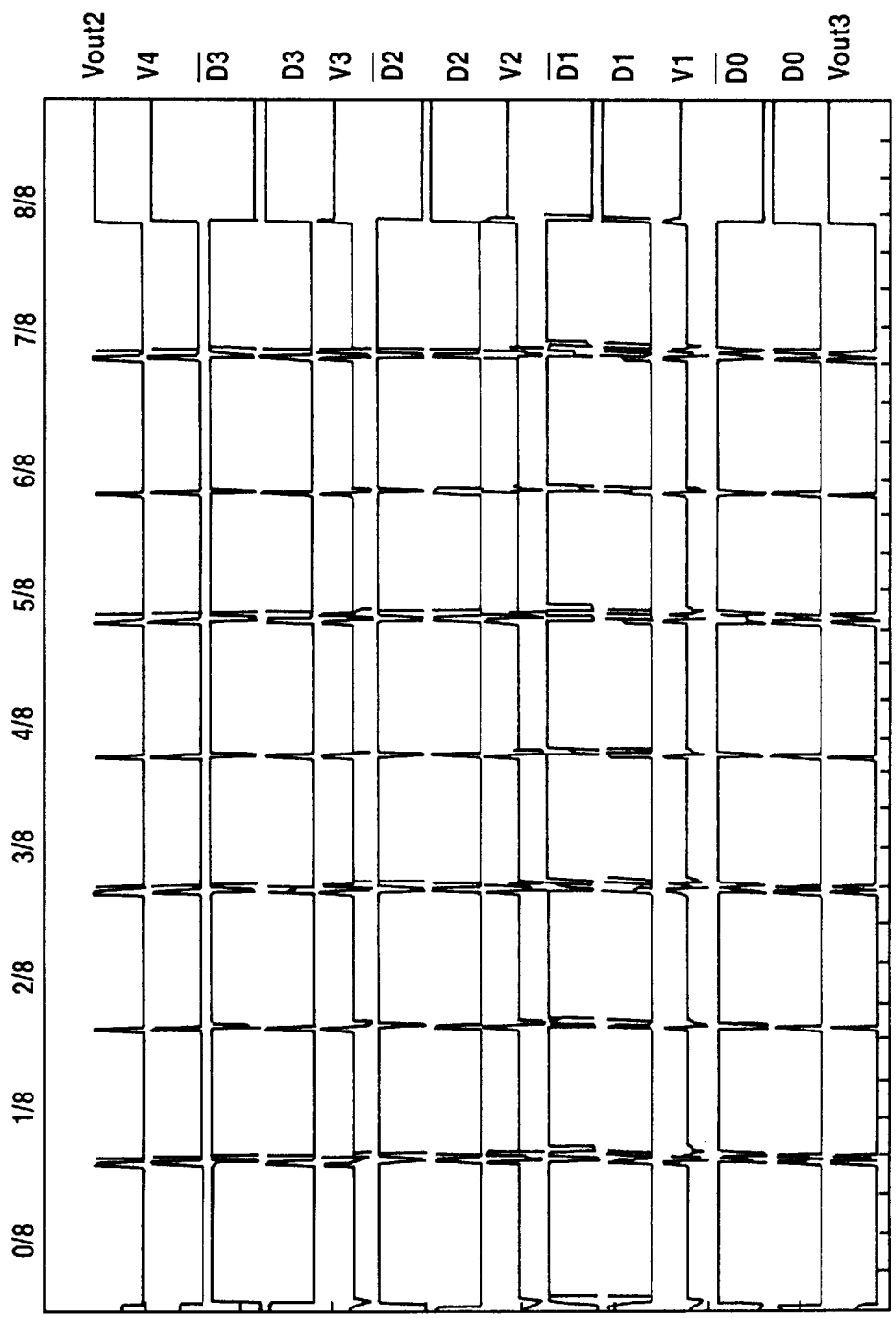
FIG. 37 is waveform diagram (3) when 0/8 to 8/8, in the range −Vds to +Vds, are given to the analog input terminal of the 12-bit AD converter in FIG. 34.

FIGS. 35, 36 and 37 are waveform diagrams prepared when 0/8 to 8/8 are provided for the analog input of the 12-bit AD converter in FIG. 34 in a range of from −Vds to +Vds. Since three stages of inverters are provided in this circuit and the threshold values of the inverters at the second stage are shifted from 0, an unstable condition can be avoided. Therefore, the lower analog inputs Vout1 to Vout3 of the individual 4-bit AD conversion units are −Vds when input is other than 8/8, and +Vds when input is 8/8.

Figure 38:
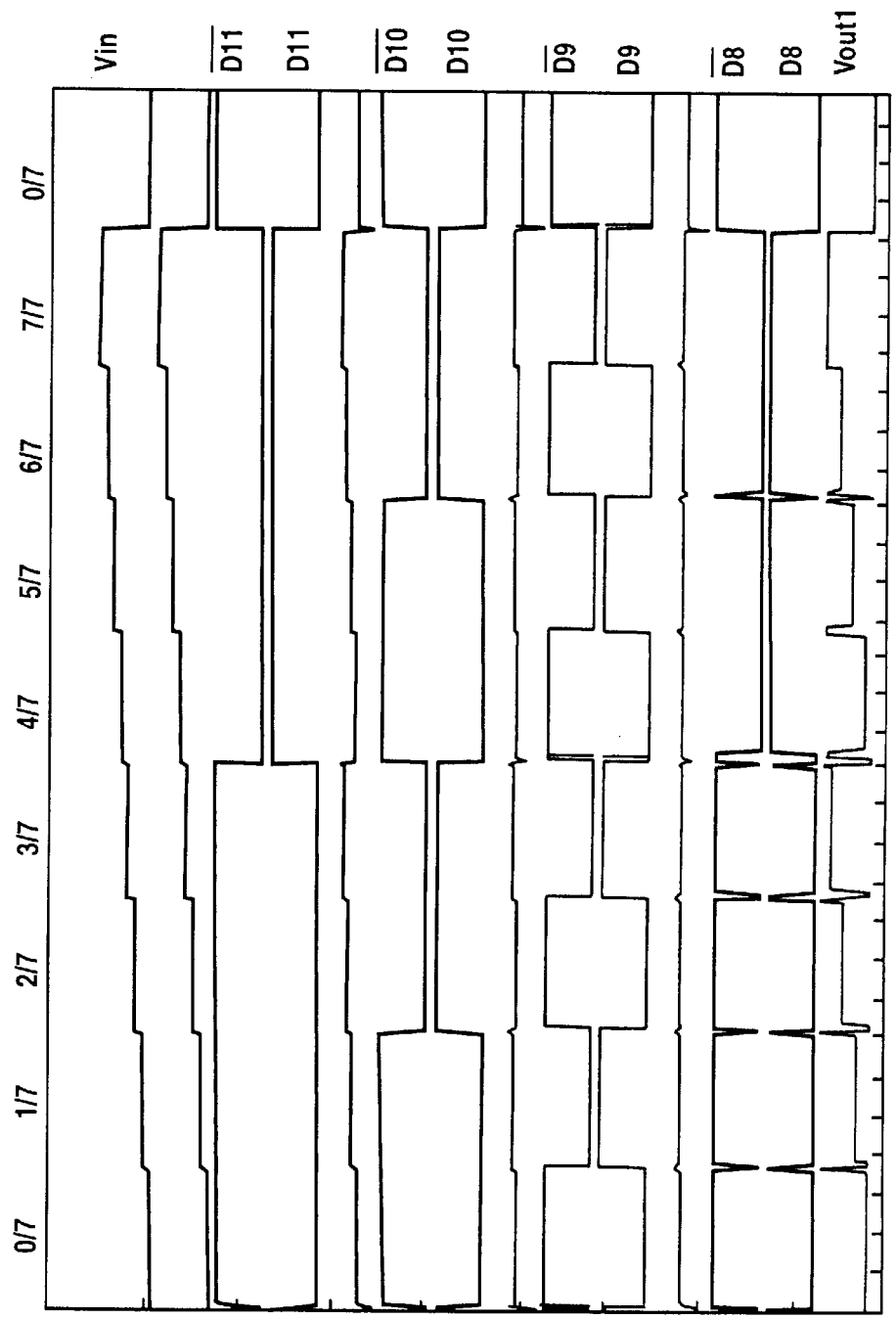
FIG. 38 is waveform diagram (1) when 0/7 to 7/7, in the range −Vds to +Vds, are given to the analog input terminal of the 12-bit AD converter in FIG. 34.
Figure 39:
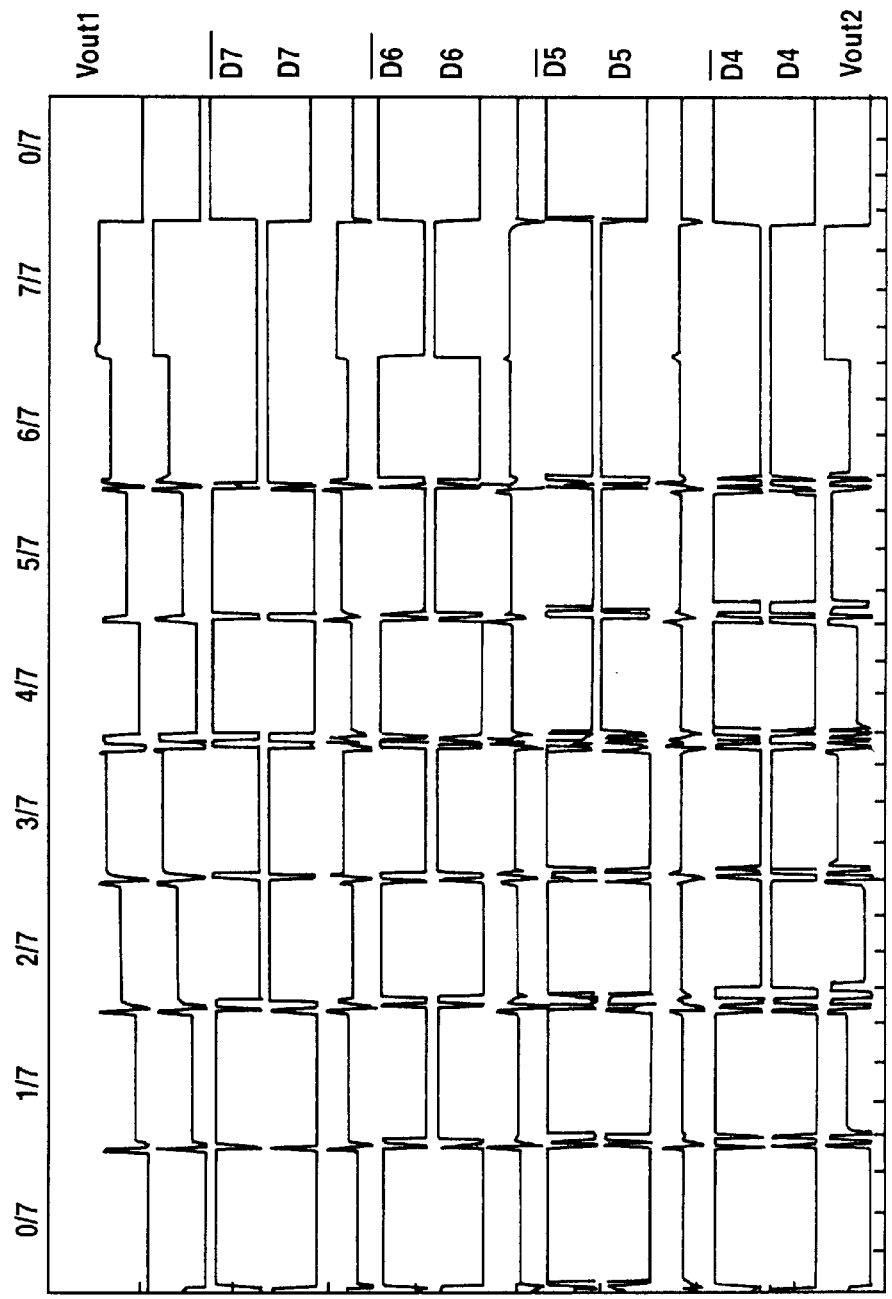
FIG. 39 is waveform diagram (2) when 0/7 to 7/7, in the range −Vds to +Vds, are given to the analog input terminal of the 12-bit AD converter in FIG. 34.
Figure 40:
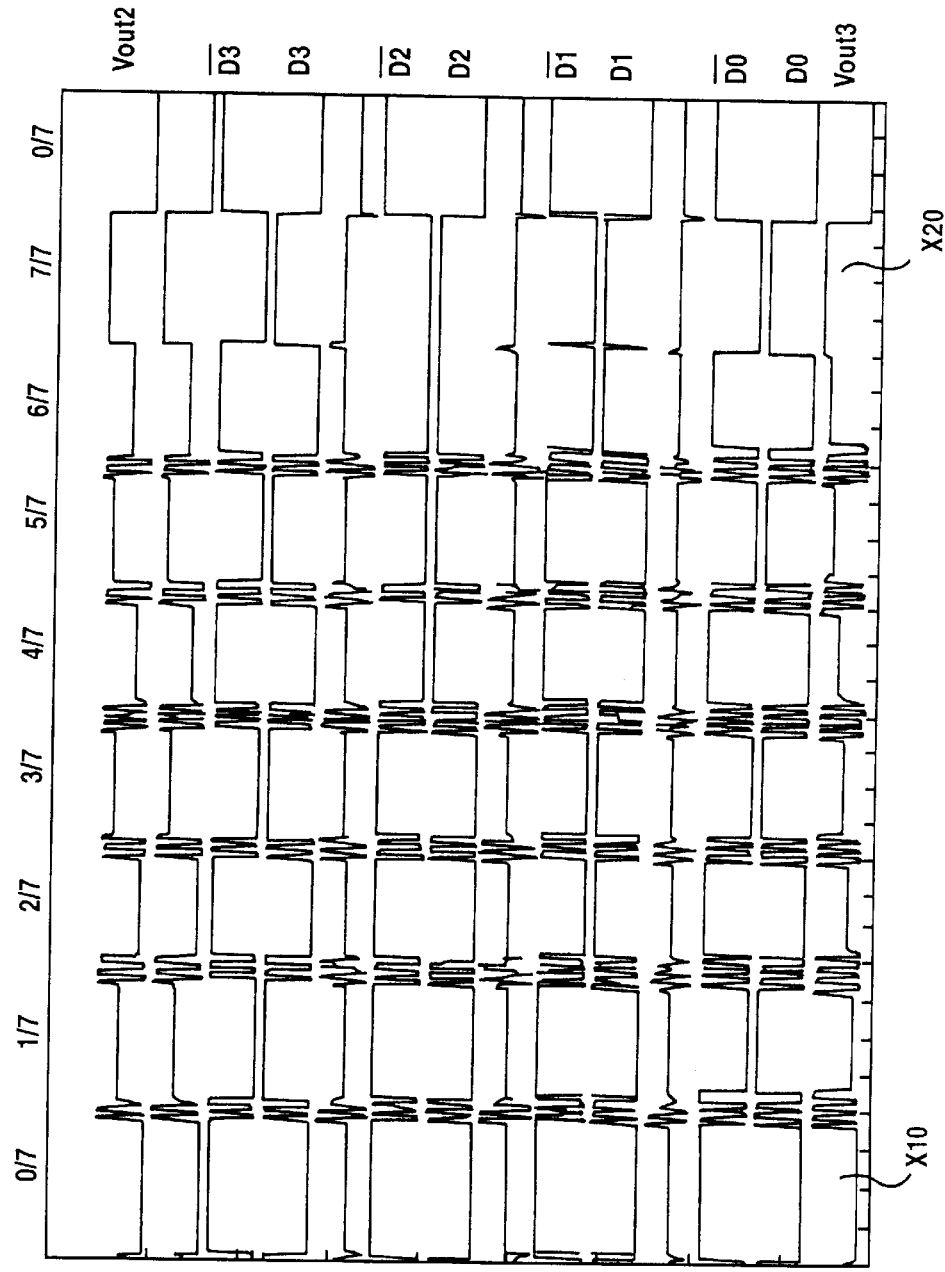
FIG. 40 is waveform diagram (3) when 0/7 to 7/7, in a range of −Vds to +Vds, are given to the analog input terminal of the 12-bit AD converter in FIG. 34.

FIGS. 38, 39 and 40 are waveform diagrams prepared when 0/7 to 7/7 are provided for the analog input of the 12-bit AD converter in FIG. 34 in a range of −Vds to +Vds. As the feature in this waveform diagram, as indicated by X10 and X20 in FIG. 40, analog value Vout3 is accurately generated by amplifying the least significant bit remainder, such as Vout3=−Vds relative to the input of 0/7, and Vout3=+Vds relative to the input of 7/7. Since in circuit in FIG. 24, compensation for the parasitic capacitor is not performed, as indicated by X1 and X2 in FIG. 27, an accurate Vout3 is not generated.

Figure 41:
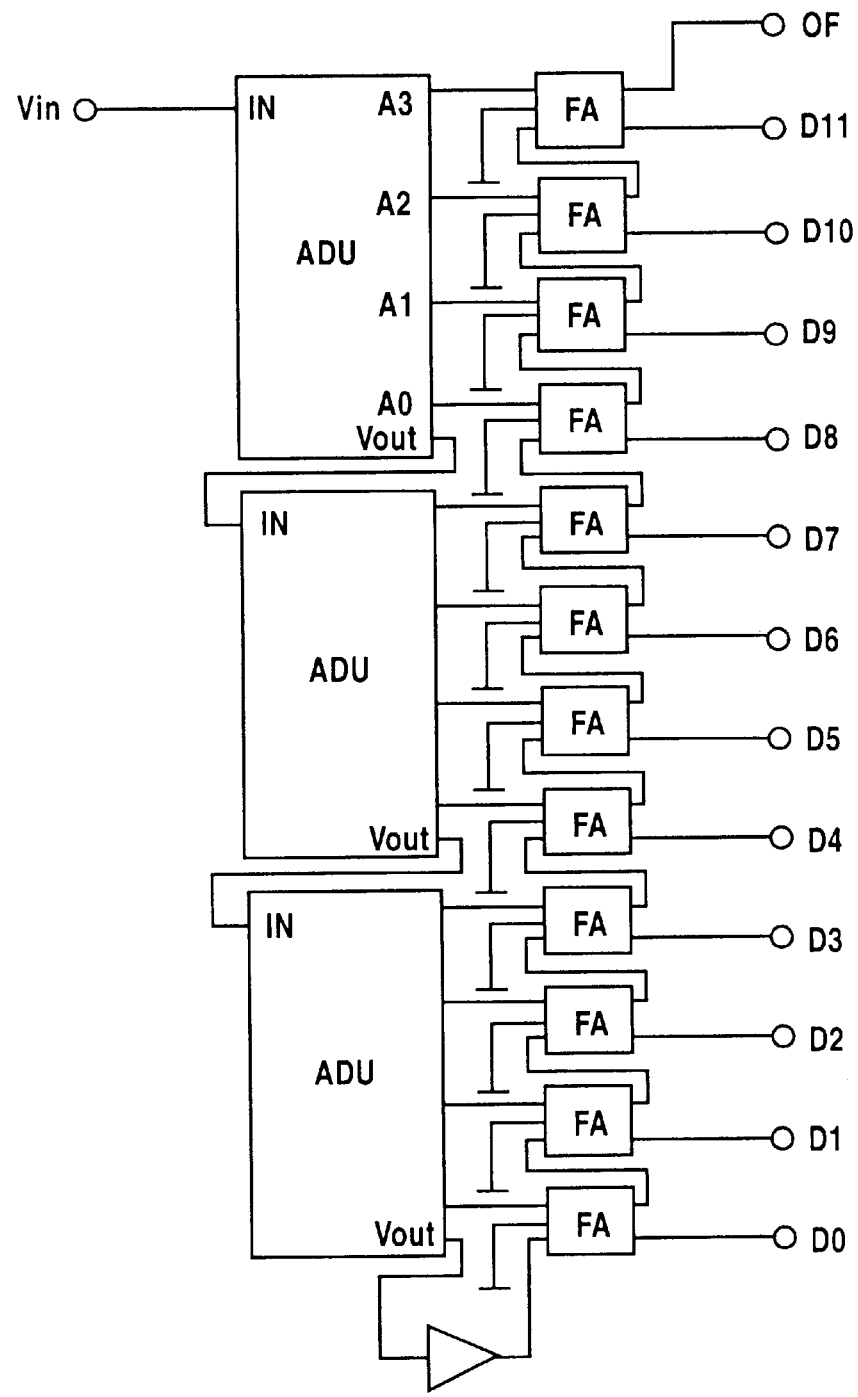
FIG. 41 is a circuit diagram for the 12-bit AD converter in FIG. 34 to which a rounding function and an overflow bit OF is added.

FIG. 41 is a diagram of a circuit provided by adding a rounding function and an overflow bit OF to the 12-bit AD converter in FIG. 34, and corresponds to FIG. 28. In the example in FIG. 41, the individual 4-bit AD conversion units have the additional inverter to prevent instability condition. Lower analog input is obtained by amplifying a remainder at an amplification rate acquired while taking a parasitic capacitance into account. In addition, a rounding function and an overflow bit are provided. The reason the rounding function and the overflow bit are included is the same as was explained for the circuit in FIG. 28.

In FIG. 41, overflow bit OF is 1 relative to the full-scale analog input, and the remaining 12-bit digital output is (000000000000).

[Sequential AD converter]

Figure 42:
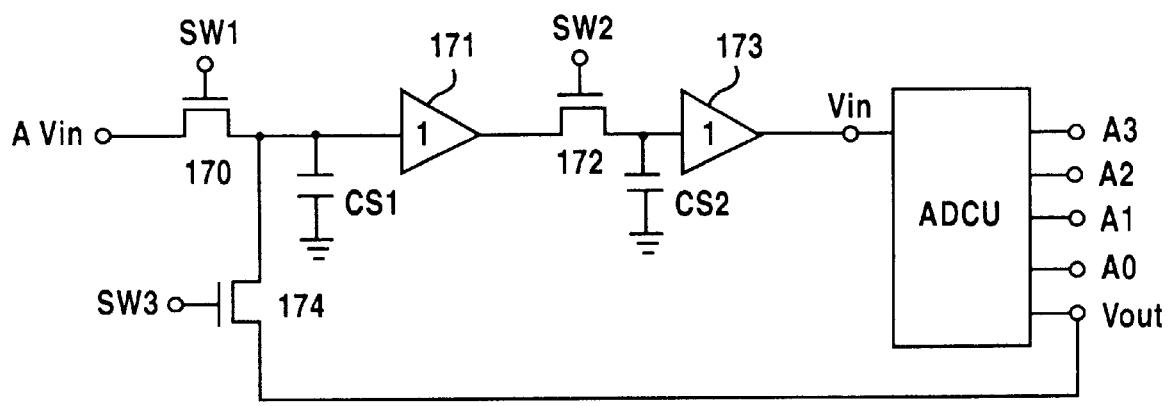
FIG. 42 is a diagram illustrating a serial AD converter.

FIG. 42 is a diagram illustrating a sequential AD converter. In this circuit, a sample-and-hold circuit is provided at the front stage of the 4-bit AD conversion unit ADCU explained while referring to FIGS. 22 and 42, so that 4×N bit AD conversion is serially performed. The 4-bit AD conversion unit ADCU generates a simultaneous 4-bit digital output. The sample-and-hold circuit samples and holds, for a lower level, analog input Vout which is generated as a result, and performs 4-bit AD conversion for the next lower level.

The sample-and-hold circuit includes a switch 170, a capacitor CS1, an operational amplifier 171 having a gain of 1, a switch 172, a capacitor CS2, and an operational amplifier 173 having a gain of 1. In addition, a switch 174 is provided to hold lower analog input vout.

Figure 43:
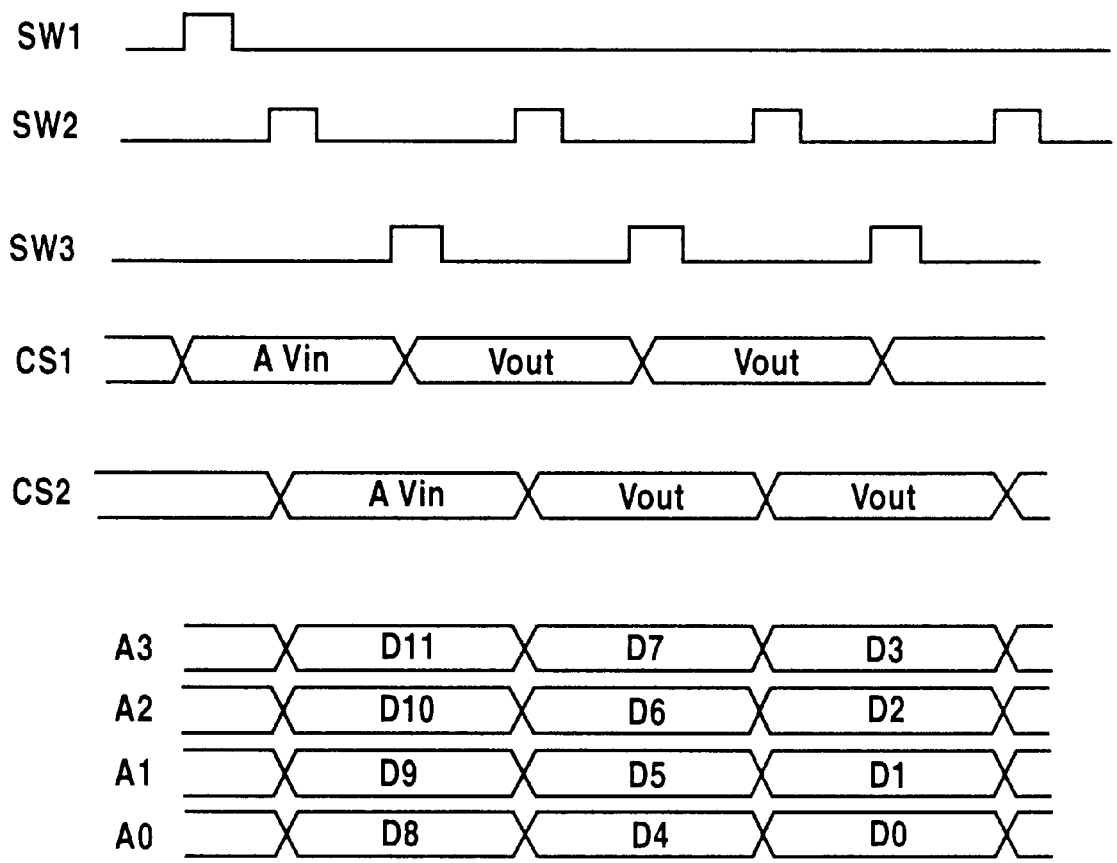
FIG. 43 is a timing chart for the serial AD converter in FIG. 42.

An explanation will now be given for a case where a 12-bit digital output is acquired by employing the serial AD converter. FIG. 43 is an operational timing chart. First, switch 170 is conductive by a pulse signal SW1, and analog input AVin is sampled and held by the capacitor CS1. Then, switch 172 is rendered conductive by a pulse signal SW2, and its analog voltage is held by the capacitor CS2. The voltage value is provided as analog input Vin for the 4-bit AD conversion unit ADCU via the operational amplifier 173 having a gain of 1. Then, the upper 4-bit output $D_{11}D_{10}D_9D_8$ is generated.

Following this, the switch 174 is turned on by a pulse signal SW3, and the analog input Vout for the lower bits obtained by amplifying the remainder is sampled and held by the capacitor CS1. Then, the pulse signals SW2 and SW3 are alternately provided in the same manner described as above, and lower 4-bit digital output $D_7D_6D_5D_4$ is generated. In this manner, the analog input is digitized by three sample-and-hold operations to obtain a 12-bit digital output.

With this circuit structure, 12 bits are not generated at one time, but AD conversion for 12 bits can be performed using a small number of devices. Furthermore, theoretically, an analog value can be converted to obtain a multiple-bit digital value by increasing the number of sample-and-hold operation.

Figure 44:
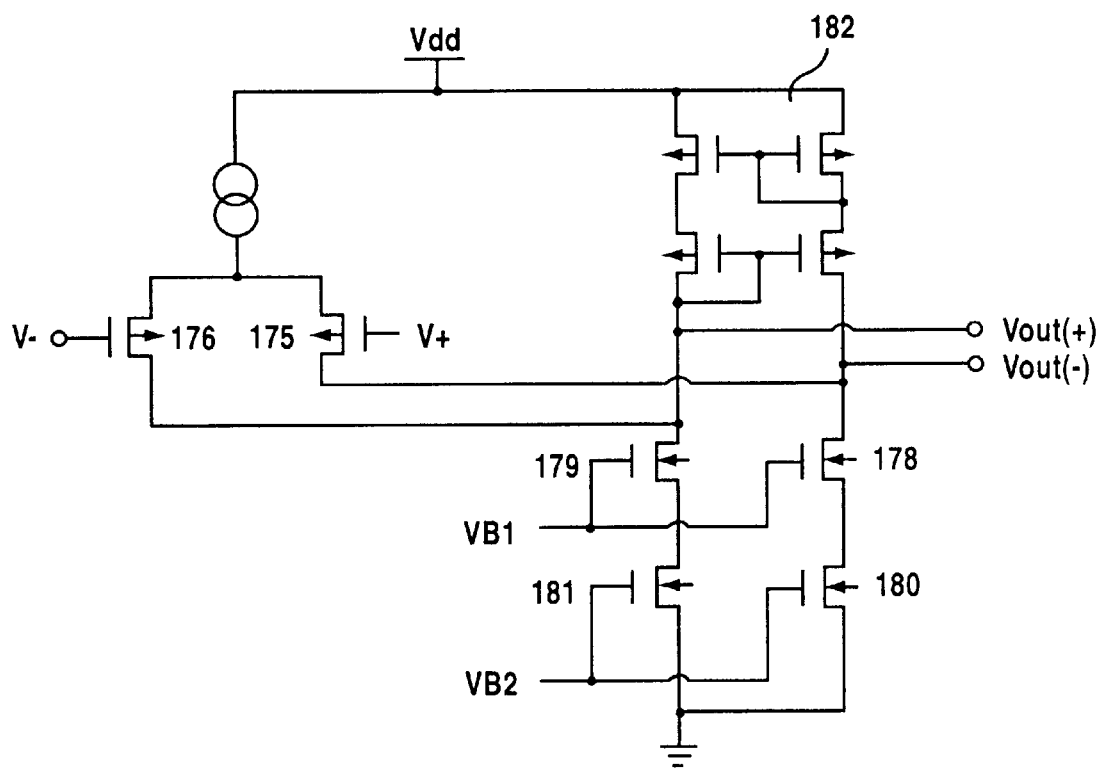
FIG. 44 is a diagram illustrating an operational amplifier in the AD converter in FIG. 42.

The operational amplifiers are non-inverted amplifiers and voltage follower circuits. FIG. 44 is a diagram illustrating the general circuit structure of the operational amplifier. This circuit is a full amplification operational amplifier. Transistors 175 and 176 have their sources connected in common to a current source, and each their current is supplied to circuits at the output stages. Transistors 178 and 179, and 180 and 181 are impedance circuits to which constant voltages VB1 and VB2 are applied. As for the operation of this circuit, when input V+ is increased, its current is reduced, the current flowing across transistor 176 is increased, and the output Vout (+) is increased. The gain of the amplifier is adjusted to 1.

Figure 45:
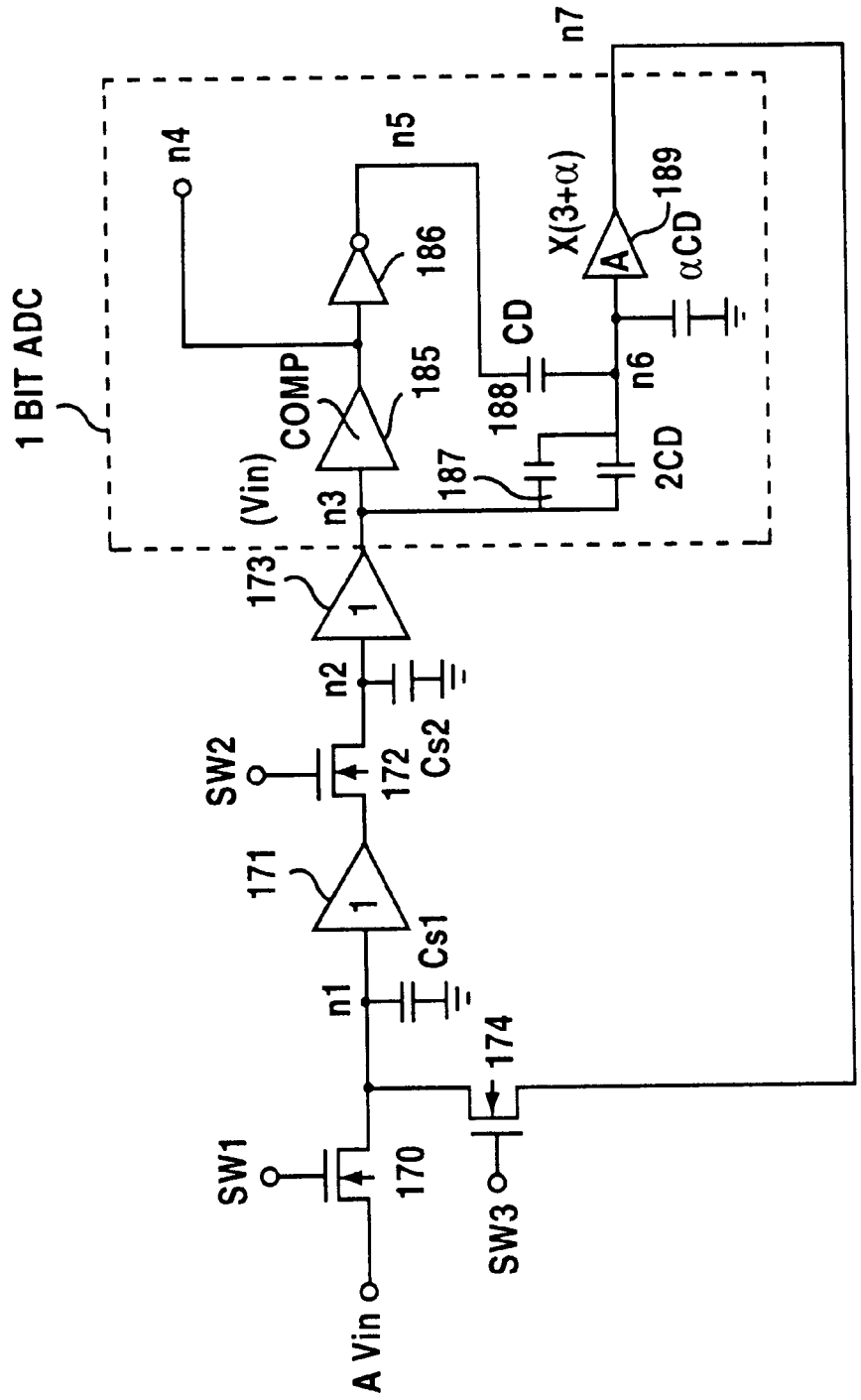
FIG. 45 is a diagram illustrating a 1-bit serial AD converter.

FIG. 45 is a diagram illustrating a 1-bit serial AD converter. This circuit is constituted by the sample-and-hold circuit, 1-bit circuit portion of the 4-bit AD conversion unit and the remainder amplifier, all of which are shown in FIG. 42. A switch 170 is used to sample and hold analog input AVin, and switches 172 and 174 are alternately rendered ON to transmit voltage n1 held by the capacitor Cs1 to the capacitor Cs2, so that voltage n7, which is obtained by amplifying the remainder after the AD conversion, is sampled and held in the capacitor Cs1. Operational amplifiers 171 and 173 both have a gain of 1. The structure and the operation of these circuits are the same as those in FIG. 42 (see FIG. 43).

The portion enclosed by the broken line is a 1-bit AD converter. Output n4 of a comparator 185 is a digital output obtained after the AD conversion. The comparator 185 is constituted by a CMOS inverter having a threshold value of Vdd/2 and a CMOS inverter having a threshold value shifted from Vdd/2, as is shown in FIG. 29, for example. Signal n5, generated via an inverter 186, is coupled via a capacitor 188 with a capacitor 187 to which input signal n3 is applied. The capacitance of a feed-back capacitor 188 is ½ of that of an input capacitor 187. Signal n6, obtained by subtraction, is amplified by an amplifier 189 having a gain of (3+α), obtained by compensating for a parasitic capacitance αCD. Signal n7 is sampled via the switch 174 and is held in the capacitor Cs2 in order to perform lower AD conversion.

More specifically, analog input AVin is sequentially stored in the capacitors Cs1 and Cs2, and is transmitted to the comparator 185. At the output n4 terminal of the comparator 185, first, the most significant bit (MSB) is output, and inverted signal n5 is fed back via the capacitor 188 having ½ times a specified capacitance to the input terminal of the amplifier 189. As a result, analog signal n7, which corresponds to a lower bit obtained by subtracting analog value for the MSB from analog input n3, is output. When the switch 174 is rendered conductive, the signal n7 is sampled and stored in the capacitor Cs1. Then, signal n7 is input as lower analog input signal n3 by rendering the switch 172 conductive. In the same manner, the lower bits are sequentially output at the output terminal n4 by the switching of the switches 172 and 173.

Figure 46:
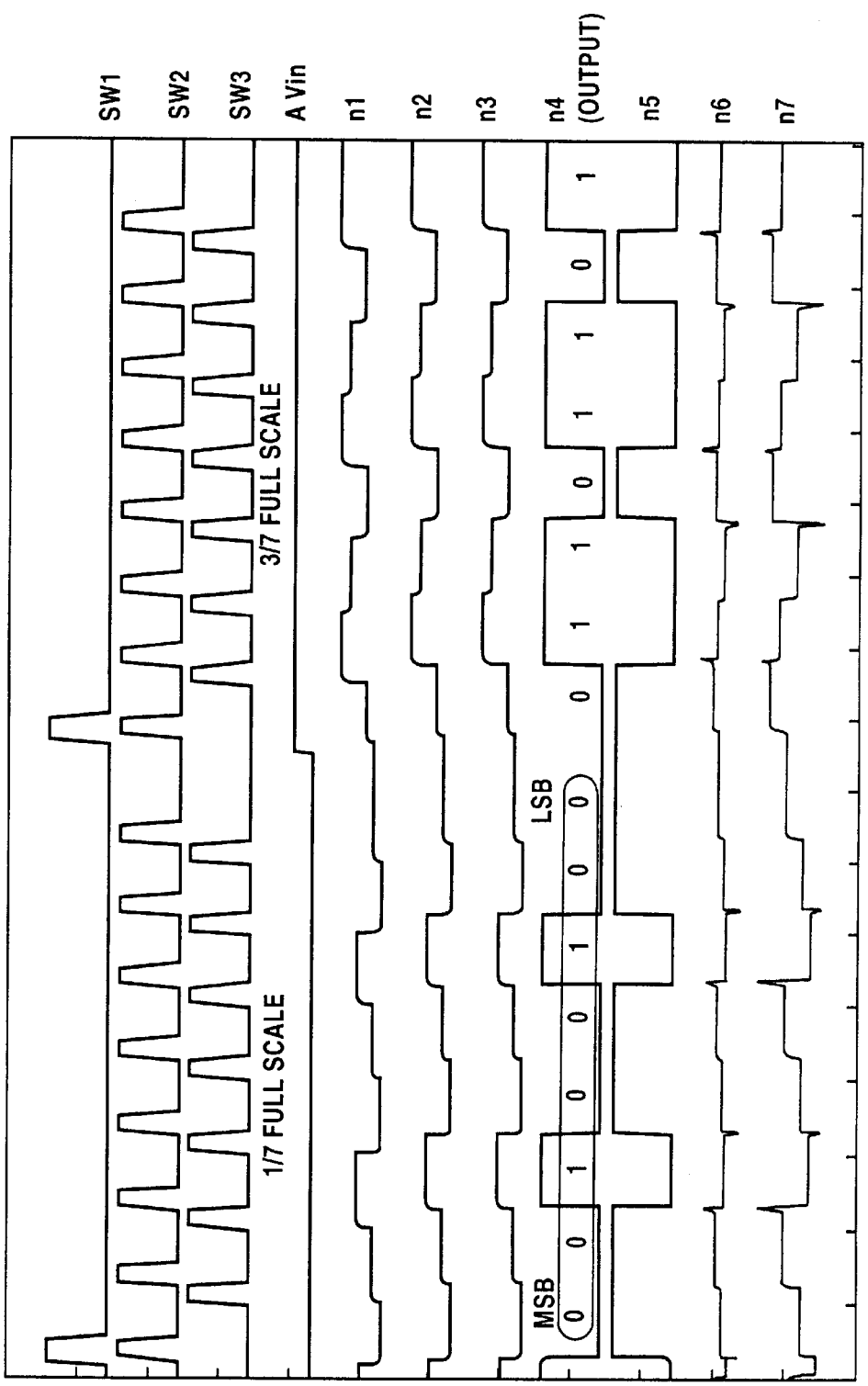
FIG. 46 is a waveform diagram for the AD converter in FIG. 45.
Figure 47:
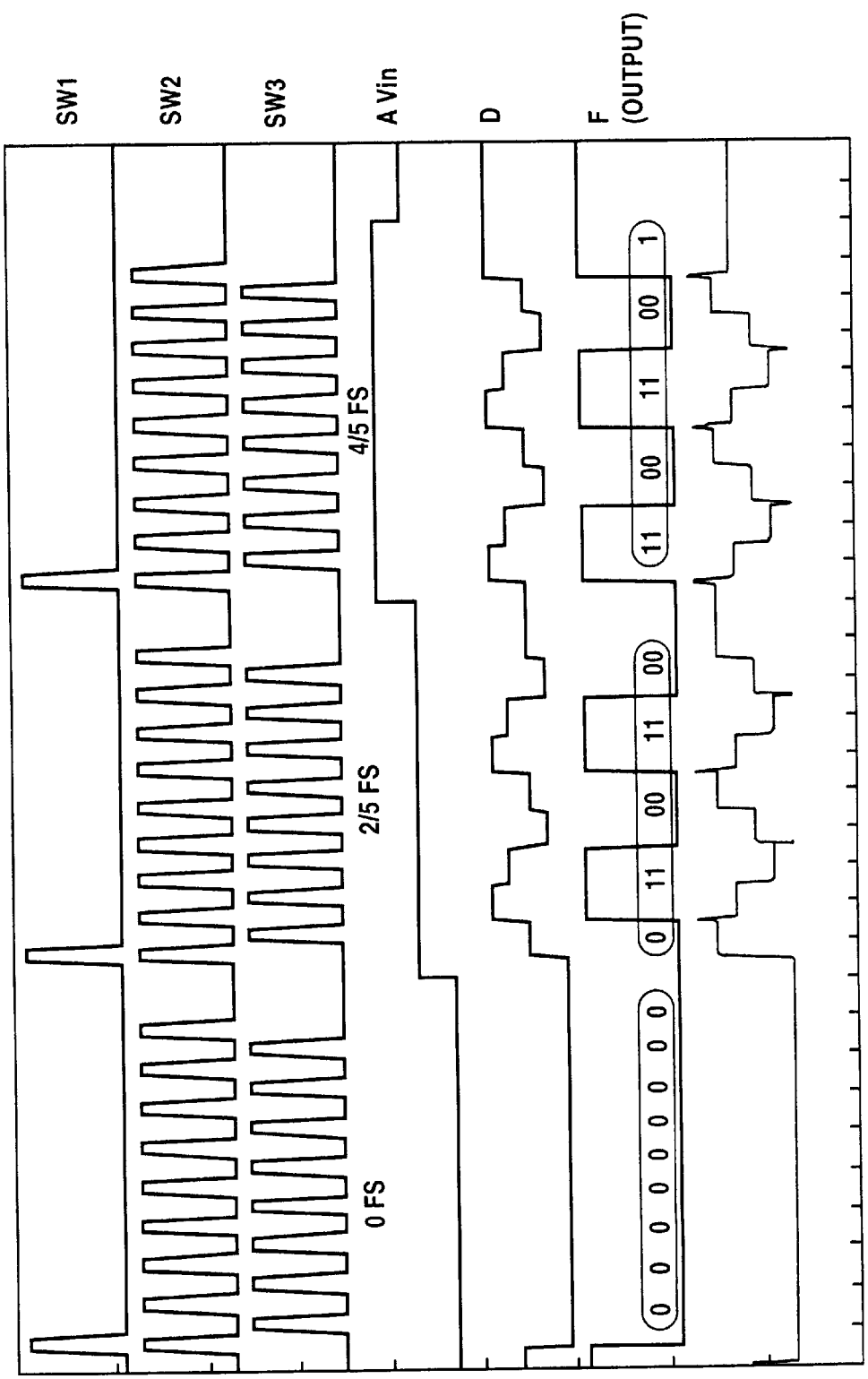
FIG. 47 is a waveform diagram for the AD converter in FIG. 45.

FIGS. 46 and 47 are waveform diagrams for this circuit. In FIG. 46 are shown the 8-bit digital output when the analog input AVin is 1/7 full scale, and the 8-bit digital output when the analog input AVin is 3/7 full scale. The 8-bit output n4 is generated by rendering on and off seven times the pulse signals SW2 and SW3 for turning on the switches 174, 172. Since eight bits are $2^8=256$, 256/7=36.5 for the 1/7 full scale, and the 8-bit output is (00100100). For the 3/7 full scale, the 8-bit output is (01001101).

In FIG. 47 are shown the 9-bit output when analog value=0, the 9-bit output when the analog value is 2/5 full scale, and the 9-bit output when the analog value is 4/5 full scale.

This circuit can be constituted by merely a 1-bit AD converter, a remainder amplifier for lower AD conversion, and a sample-and-hold circuit. Although the circuit has a simple structure, it performs multiple-bit AD conversion. It should be noted that, since digital output is generated by one bit through the ON/OFF operation of the switches 172 and 174, this is not a flash but a serial circuit.

The logic circuit and the AD converter that reduces the required number of transistors by using the capacitive coupling circuit have been explained. A DA converter is always necessary for AD conversion. Thus, a DA converter that also uses a capacitive coupling circuit will now be described.

[DA converter using capacitive coupling circuit]

Figure 48:
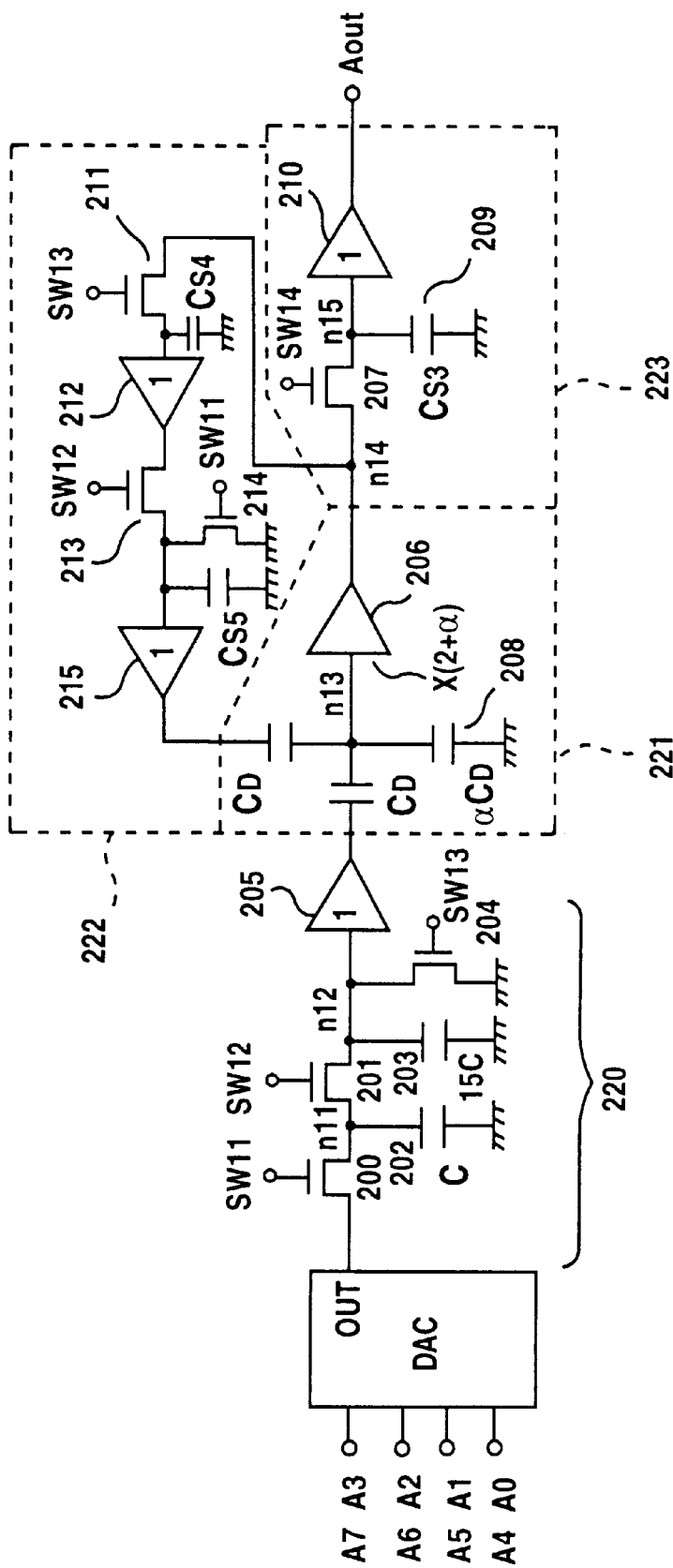
FIG. 48 is a diagram illustrating a serial DA converter.

FIG. 48 is a diagram illustrating a serial DA converter. The DA converter DAC serially performs DA conversion for a digital value beginning with the upper bit of every four bits. Analog output Out of the 4-bit DA converter DAC is serially added by an adder 221, and final, cumulative analog value is held by a sample-and-hold circuit 223. A 1/16 circuit 220 changes a lower bit Digital-Analog converted value into a 1/16 analog value. A delay circuit 222 delays an upper bit analog value by the equivalent of one cycle for the switch signals SW11 and SW12, and supplies it to the adder circuit 221.

Figure 49:
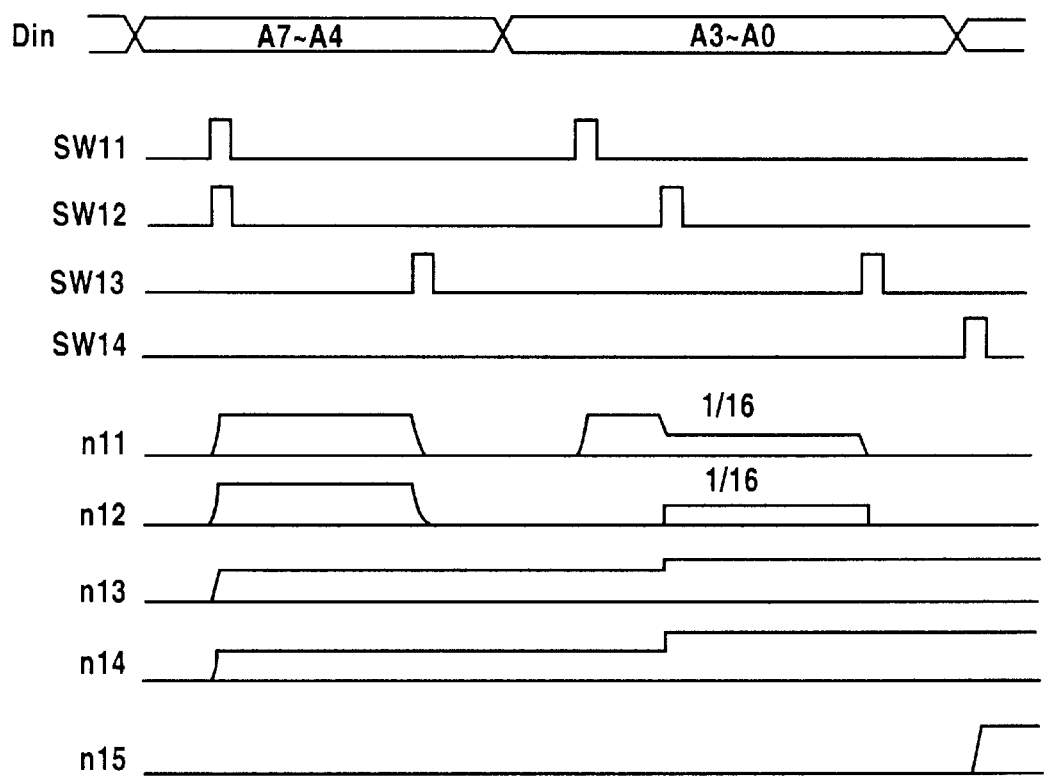
FIG. 49 is a waveform diagram for the DA converter in FIG. 48.

FIG. 49 is a waveform diagram for the serial DA converter in FIG. 48. In this example, 8-bit digital signals $A_0$ through $A_7$ are converted into analog signals Aout. First, the upper 4-bits $A_4$ through $A_7$ are supplied as input to the DA converter DAC. The pulse signals SW11 and SW12 are simultaneously supplied to the switches 200 and 201, and analog output value Out is held by capacitors 202 and 203. The capacitance of the capacitor 203 is 15 times that of the capacitor 202. This operation will be described later.

Analog value n12, held by the capacitor 203, is supplied to the capacitor CD by an operational amplifier having a gain of 1 or a voltage follower 205. Since at this time the output of the delay circuit 222 is 0 V, node n13 is provided a voltage that is almost half that of analog value n12 by the capacitive coupling of two capacitors $C_D$. The capacitor 208 is a parasitic capacitor, and has α (α<1) times the capacitance of the capacitor $C_D$. The amplifier 206 generates voltage n14 by providing an amplification of (2+α) times.

After the application of pulse signal SW13, the voltage n14, transmitted via the switch 211, is held by the capacitor Cs4. In this manner, a voltage obtained by the analog conversion of the digital value for the first four upper bits is transmitted and is held by the capacitor Cs4. By means of the pulse signal SW13, the capacitor 203 is discharged and reset.

Then, the lower four bits, $A_0$ through $A_3$, are supplied to the digital input terminal, and pulse signal SW11 is supplied. As a result, analog output Out, obtained by conversion, is acquired and held by the capacitor 202. At the timing for the next pulse signal SW12, voltage n11 is reduced by 1/16 to voltage n12 by a capacitive coupling circuit composed of the capacitor 202, the switch 201 and the capacitor 203. The voltage n12 is supplied via an amplifier 205 having a gain of 1 to the capacitor $C_D$.

At this time, in the delay circuit 222, by the supply of pulse signal SW12, analog value n14 for the upper four bits is transmitted via the amplifiers 212 and 215, which have a gain of 1, to the other capacitor $C_D$. The upper 4-bit analog value and 1/16 the lower 4-bit analog value are added together by the capacitive coupling circuit $C_D$, and the result n13 is amplified to obtain n14, which is output in turn. Upon receipt of pulse signal SW14, the voltage obtained by addition is acquired and held by the capacitor Cs3. In other words, voltage n15 is an 8-bit analog conversion value. This voltage is output as analog output Aout by the amplifier 210.

As is described above, in the circuit in FIG. 48, the DA converter DAC performs a DA conversion for each 4-bit digital value, an analog value obtained by conversion of lower four bits is serially multiplied, and the results are added together. For the conversion of a 12-bit digital value, the lower 4-bit digital value is converted into an analog value, which is multiplied by 1/256 by two ON/OFF operations of the switches 200, 201 and 204. The result is then added to the upper 8-bit analog value by the adder. Thus, pulse signals SW12 and SW13 in the delay circuit 222 are turned on and off twice.

With this circuit structure, the DA conversion portion that requires many transistors need only accommodate four bits. For the conversion of a multiple-bit digital value into an analog value, sets of four bits each are serially converted. The 1/16 circuit 220 and the adder circuit 221 for serial conversion are constituted with a small number of transistors by using the capacitive coupling circuit previously explained. Therefore, a circuit for converting a multiple-bit digital value into an analog value can be constituted with a small number of transistors.

Figure 50:
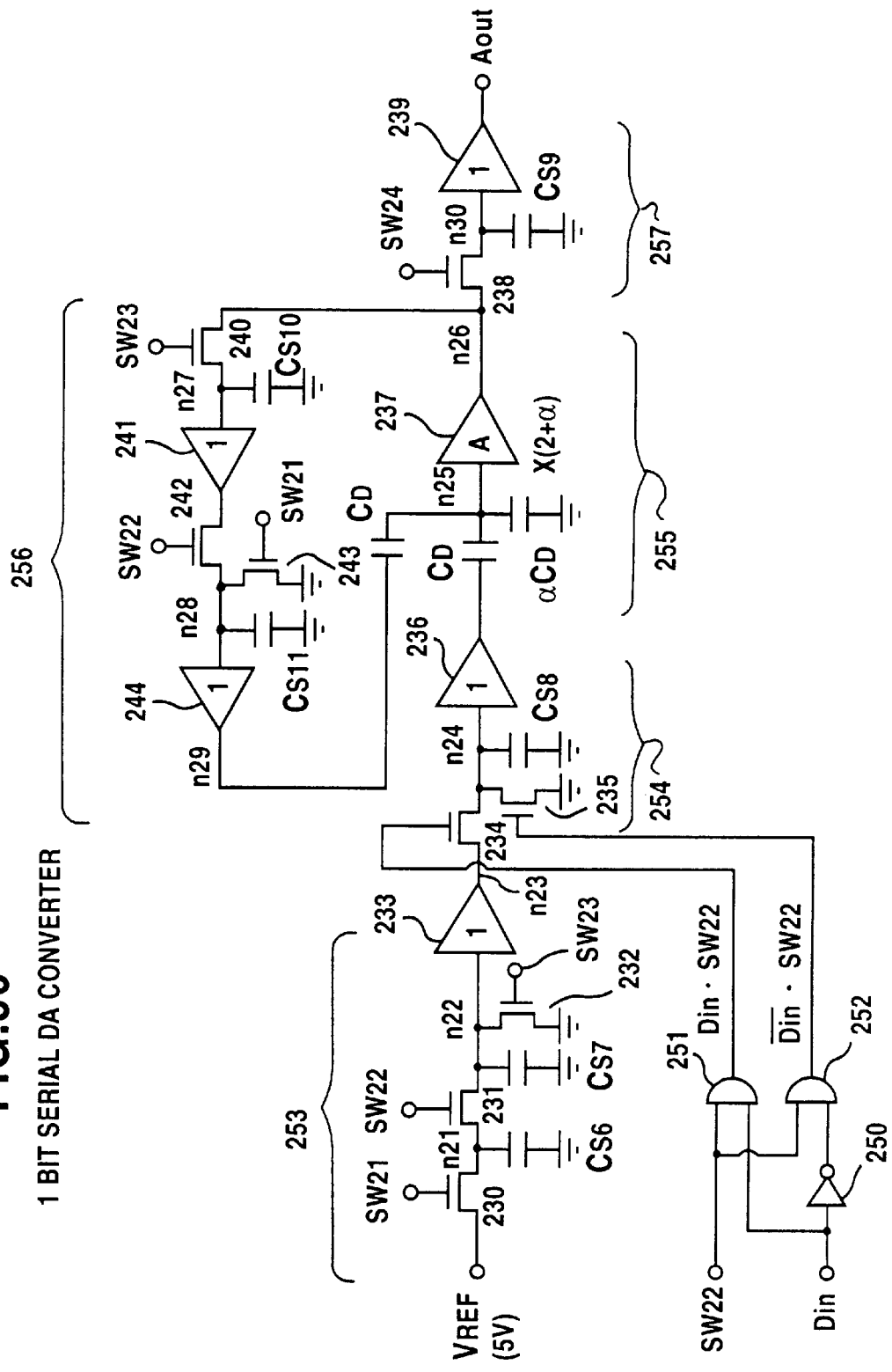
FIG. 50 is a diagram illustrating a 1-bit serial DA converter.

FIG. 50 is a diagram of a 1-bit serial DA converter. This DA converter serially converts digital input Din into an analog value by one bit at a time, accumulates the analog values, and finally outputs a cumulative analog value Aout.

For each cycle, a ½ circuit 253 multiplies ½ times a reference value Vref of 5 V, for example, by using switches 230, 231 and 232, which are controlled by pulse signals SW21, SW22 and SW23. The voltage value n23, obtained multiplication by ½ each cycle, is held in a capacitor Cs8 in accordance with digital value Din of either 1 or 0, which is selected by a data input sample-and-hold circuit 254. An adder circuit 255, a delay circuit 256 and an output sample-and-hold circuit 257 have the same functions as those of the corresponding circuits in FIG. 48. More specifically, the upper bit analog value is delayed by the equivalent of one bit cycle by the delay circuit 256, and the delayed analog value is output to node n29. The voltage n29 is added to analog value n24 for the next lower bits by the adder circuit 255. When the digital value Din for a digit that is in the process of being converted is set to 0, the analog value n23 corresponding to that digit is not added by switch 234. When the digital value Din is 1, the analog value n23 corresponding to that digit is added by the switch 234.

Figure 51:
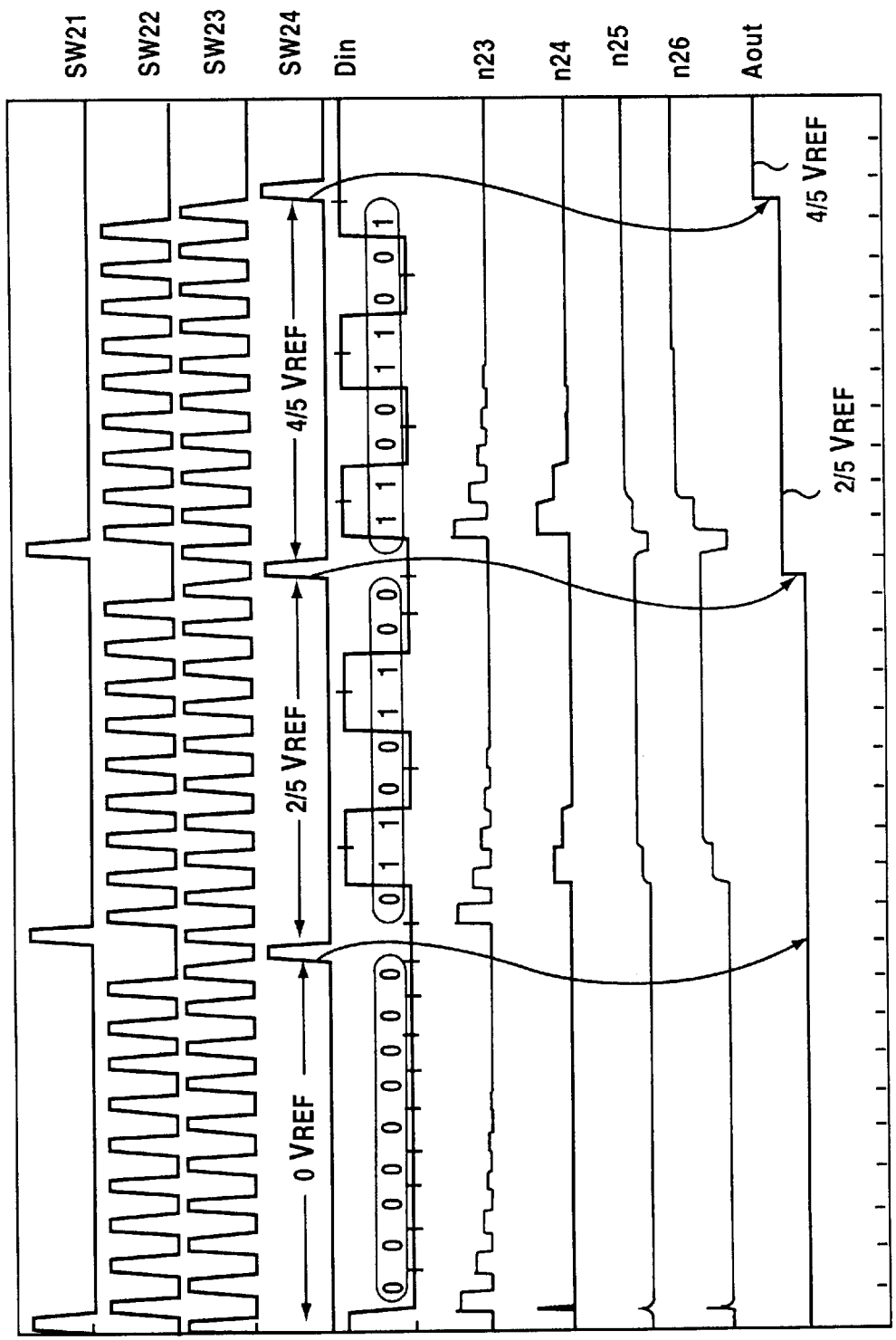
FIG. 51 is a waveform diagram for the 1-bit DA converter in FIG. 50.
Figure 52:
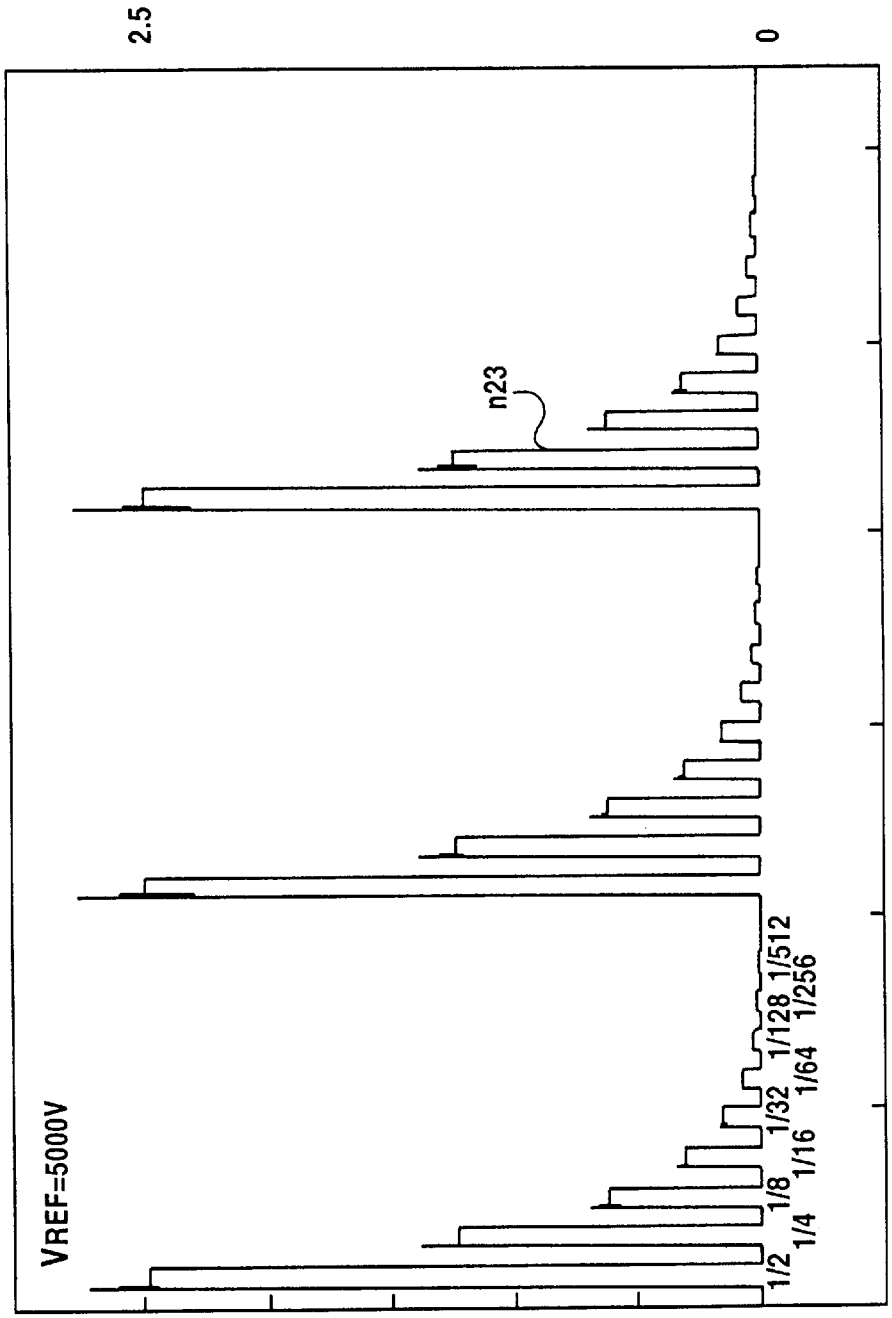
FIG. 52 is an enlarged waveform diagram showing a signal n23.

FIG. 51 is a waveform diagram for the 1-bit serial DA converter. FIG. 52 is an enlarged waveform diagram for signal n23.

The operation of the converter in FIG. 50 will now be described while referring to FIGS. 51 and 52. The example in FIG. 51 is for the conversion of digital values Din of 0 V, 2 $V_{REF}$/5, and 4 $V_{REF}$/5. The digital input values Din of nine digits are (000000000) (011001100) and (110011001). An explanation will be given for a digital input value corresponding to 4 $V_{REF}$/5.

First, in the ½ circuit 253, transistor 230 is turned on by the pulse signal SW21, resulting in a reference voltage $V_{REF}$ of 5 V being held by the capacitor Cs6. Then, transistor 230 is turned off, and the transistor 231 is turned on by the pulse signal SW22. As a result, the reference voltage $V_{REF}$ is reduced to half by the division provided by the capacitances of the capacitors Cs6 and Cs7, and $V_{ref}$/2 is held by the node n22. In the same manner, $V_{REF}$/2 is held at the node n23 by the amplifier 233, which has a gain of 1.

Following this, in the data input sample-and-hold circuit 254, voltage n23 is acquired and held by the capacitor Cs8 at the timing for the pulse signal SW22 in accordance with the most significant bit digital value Din. The value n24 that is held is transferred to the output terminal of the amplifier 236, and is transmitted to one of the capacitors $C_D$ of the adder circuit 255. Since voltage n29 from the delay circuit 256 is 0 at first, voltage value n24 is reduced by almost half (to $V_{REF}$/4) by the coupling circuit of the two capacitors $C_D$, and resultant voltage n25 is amplified (2+α) times by the amplifier 237. After the transmission of pulse signal SW23, output n26 is held by the capacitor Cs10.

Next, the following lower bit digital value is supplied to the input terminal Din. This time, the capacitor Cs6, which previously held $V_{REF}$/2, is coupled with the capacitor Cs7, which was cleared by the pulse signal SW23, and $V_{REF}$/4 is held by the capacitor Cs7. In other words, an analog value corresponding to the second most significant bit is held. Since the second most significant bit digital value is also 1 in the example where a corresponding analog value is 4 $V_{REF}$/5 output of the transistor 234 is held by the capacitor Cs8 in accordance with the timing for pulse signal SW22 in the data input sample-and-hold circuit 254.

The voltage $V_{REF}$/4 that is held is applied to one of the capacitors $C_D$ of the adder circuit 255, and voltage $V_{REF}$/2, at output terminal n29 of the delay circuit 256, which is generated with a one cycle delay, is applied to the other capacitor $C_D$. The two voltages are then added together. As a result, $V_{REF}$/2+$V_{REF}$/4=3 $V_{REF}$/4 is output to node n26. This voltage value is held by the capacitor Cs10 in accordance with the timing for pulse signal SW23.

When the above described operation is repeated up to the least significant bit digital value, in the output sample-and-hold circuit 257, the final analog value is held by the capacitor Cs9 in accordance with the timing for the pulse signal SW24. The analog output Aout is generated via the amplifier 239 having a gain of 1.

In this circuit, a sampling and holding process and addition are performed for analog values of $V_{REF}$/2, $V_{REF}$/4 . .

. and $V_{REF}/2^N$ the number of times that is the equivalent of the N number of digits in a digital value. Therefore, a digital value having any count of digits can be converted into an analog value by a serial operation.

In the 1-bit serial DA converter, an inverter and an amplifier can be constituted with a small number of transistors by mainly using capacitive devices. And the total number of transistors can therefore be reduced. The above described capacitive coupling circuit is employed for the ½ circuit 253 and the adder circuit 255.

[Counter circuit employing capacitive coupling circuit and an AD converter using such a counter]

A counter circuit employing a capacitive coupling circuit will now be described. One type of serial AD converter can be constituted by a combination of the counter circuit and a type of oscillator driven by a detection current from a photodetector, which will be described later. Therefore, this corresponds to the object of constituting an AD converter by effectively employing the capacitive coupling circuit of the present invention.

Figure 53:
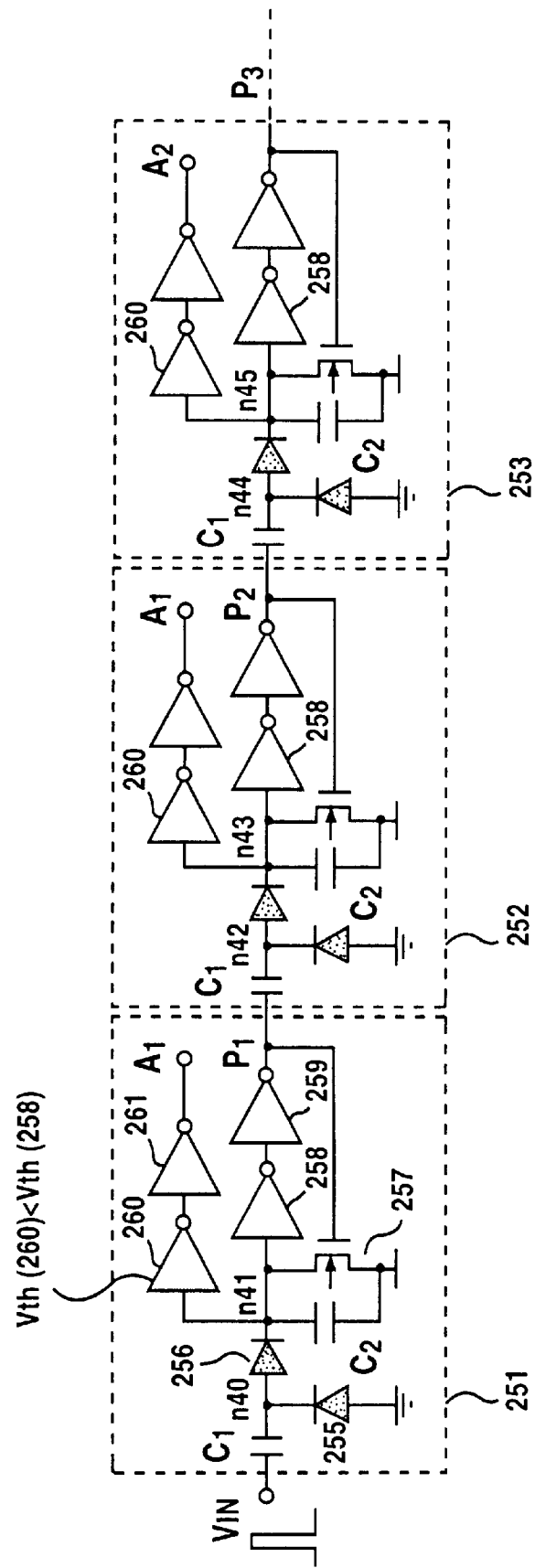
FIG. 53 is a diagram illustrating a counter circuit employing a capacitive coupling circuit.
Figure 54:
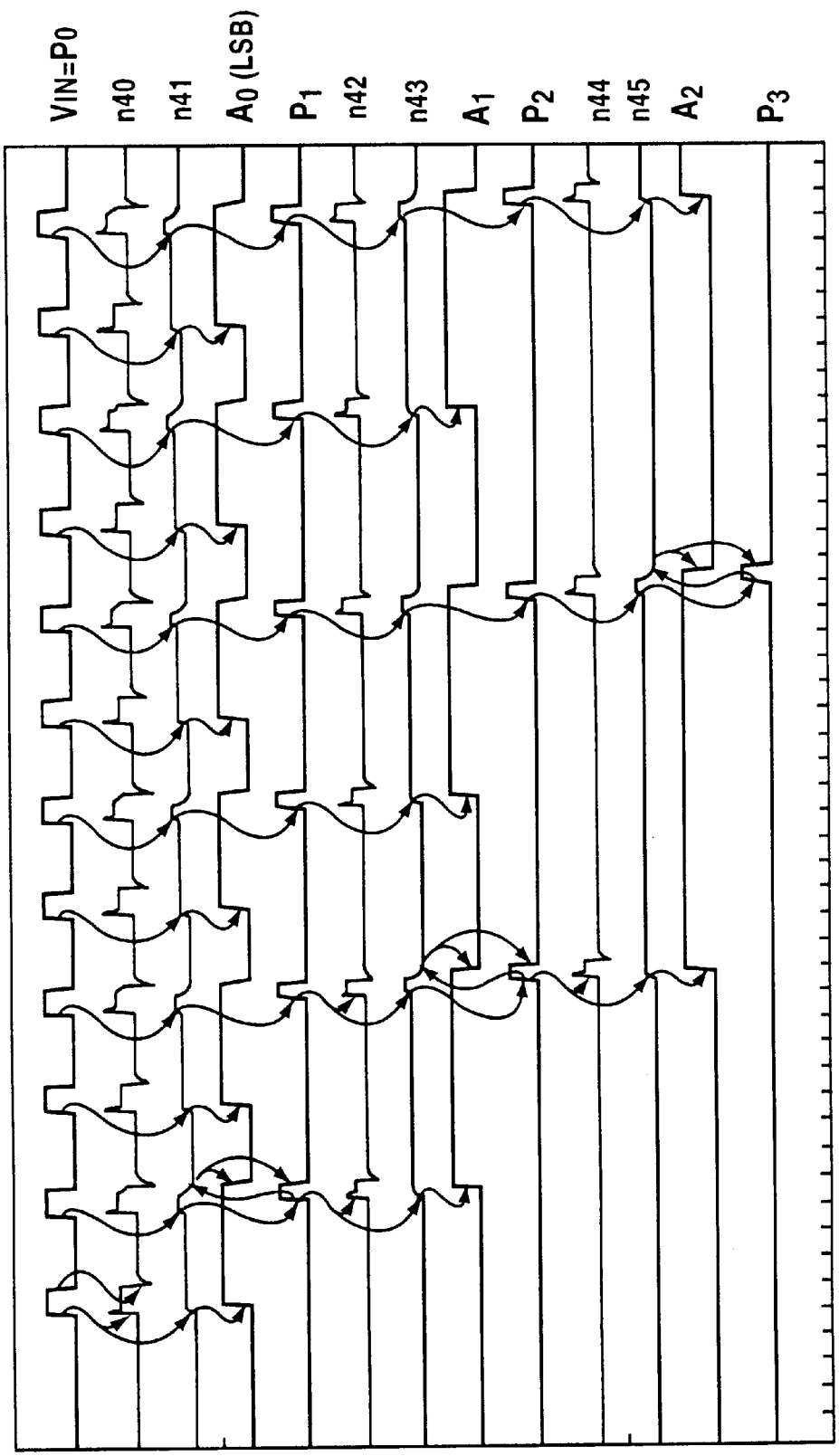
FIG. 54 is a signal waveform diagram for the counter circuit in FIG. 53.

FIG. 53 is a diagram illustrating an example counter circuit using a capacitive coupling circuit. FIG. 54 is a signal waveform diagram for the counter circuit. Pulse signals are sequentially supplied to input terminal Vin, and the least significant bit $A_0$ is changed from level L to level H and from level H to level L for each pulse signal Vin, the second stage bit $A_1$ is changed from level L to level H to level L for each two pulse signals Vin, and the third stage bit $A_2$ is changed in the same manner for each four pulse signals Vin.

A first stage circuit 251 generates a pulse signal $P_1$ for each two pulse signals Vin; a second stage circuit 252 generates a pulse signal P2 for each four pulse signals Vin; and a third stage circuit 253 generates a pulse signal $P_3$ for each eight pulse signals Vin. The fourth stage bit $A_3$ (not shown) can be generated by supplying the signal $P_3$ to the circuit at the next stage. These circuits 251, 252 and 253 have the same structure.

The first stage circuit 251 of the counter circuit has a capacitor $c_1$, diodes 255 and 256 and a capacitor $C_2$ to form a pumping circuit. On the rise of the input pulse signal Vin, the capacitor $C_2$ is charged via the capacitor $C_1$ and the diode 256, and as a result, the voltage at the node n41 rises. On the fall of the input pulse signal vin, while the potential at node n40 falls via the capacitor $C_1$, the diode 256 becomes non-conductive, and charges from the ground potential are supplied via the diode 255 to node n40. When the input pulse signal Vin rises again, the potential at node n41 is raised further.

In the charge pumping operation using the input pulse signal Vin, the height of a pulse determines the potential at the node n41 in accordance with the ratio for the capacitive coupling of capacitors C1 and C2. In this example counter circuit, the capacitances of the capacitors C1 and C2 are so designed that an inverter 258 is inverted by two input pulse signals Vin. The threshold voltage of the inverter 260 is set lower than that of the inverter 258, and the inverter 260 inverts its output in response to a single pulse signal Vin.

When the potential at node n41 is raised by the first pulse signal Vin, the inverter 260 inverts the output from level H to level L. Thus, output $A_0$ goes to level H. Due to the potential at node n41 which is increased by the second pulse signal Vin, the inverter 258 inverts the output and the first stage output $P_1$ goes to level H. When the output P1 goes to level H, the transistor 257 is rendered conductive. As a result, the potential at node n41 falls to level L, and output $P_1$ also falls to level L via the inverters 258 and 259. In other words, at output $P_1$, a pulse signal is generated that has a width equivalent to the delay time for the two inverters 258 and 259. In addition, the inverter 260 inverts the output and the first stage bit $A_0$ is returned to level L.

As is shown in FIG. 54, in the second stage circuit 252, the potential at node n43 of a charge pump circuit is also increased by output $P_1$ of the first stage circuit 251. As a result, the inverter 260 inverts the output using the same operation, and the second stage bit $A_1$ goes to level H. The third circuit 253 is structured the same as the first and the second circuits 251 and 252, and performs the same operation upon receipt of pulse signal $P_2$. In this manner, binary digital values obtained by counting the input pulse signals Vin are generated at counter output terminals $A_0$, $A_1$ and $A_2$.

Figure 55:
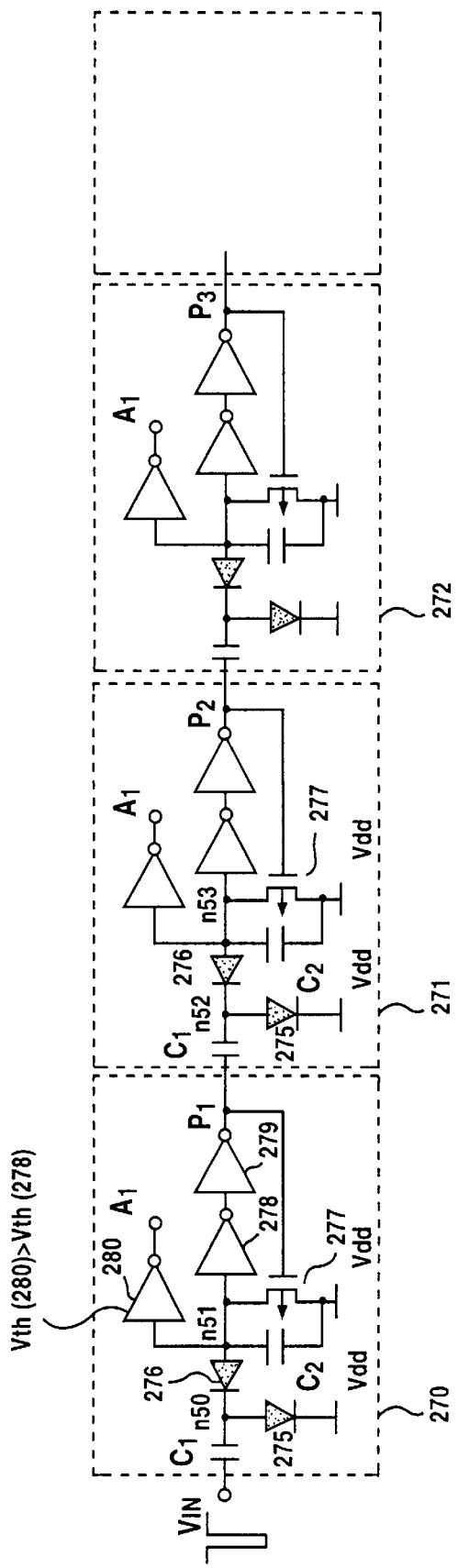
FIG. 55 is a diagram illustrating another counter circuit.

FIG. 55 is a diagram illustrating another counter circuit. While the counter circuit in FIG. 53 is a positive logic type, the counter circuit in FIG. 55 is a negative logic type, but it performs the same operation as the circuit in FIG. 53. In the circuit in FIG. 55, for example, a charge pump circuit composed of a capacitor $C_1$, diodes 275 and 276, and a capacitor $C_2$ is provided for a first stage circuit 270.

The differences from the circuit in FIG. 53 are that the diode 275 and the capacitor $C_2$ are not grounded, but are connected to a power supply source Vdd, and that the input pulse signal Vin is a negative pulse signal. Therefore, the reset potential of node n51 is level H, and the threshold voltage of the inverter 280 is set higher than that of the inverter 278.

The charge pump operation is also performed in reverse. In the reset condition, a P transistor 277 is rendered conductive and node n51 is at level H. Upon the application of the input pulse signal Vin, the potential at node n51 is reduced. Since the threshold value of the inverter 280 is set higher than that of the inverter 278, upon receipt of the first pulse signal vin, the inverter 280 inverts the output $A_0$ to level H. When two pulse signals Vin are received, the inverter 278 inverts the output, and pulse $P_1$ falls from level H to level L. As a result, the transistor 277 is rendered conductive and node 51 is reset to level H and the pulse $P_1$ returns to level H.

As is described above, although the logic is inverted and the charge pump operation is reversely performed, the operation is the same as that in FIG. 53. These counter circuits can be simply constructed by using a capacitive coupling circuit.

The above two counter circuits have employed inverters having different threshold voltages. However, since the construction of such a circuit requires the provision of transistors having different characteristics, this constitutes a difficulty for manufacturing process. Thus, it is preferable that a counter circuit employ inverters having the same threshold voltages.

Figure 56:
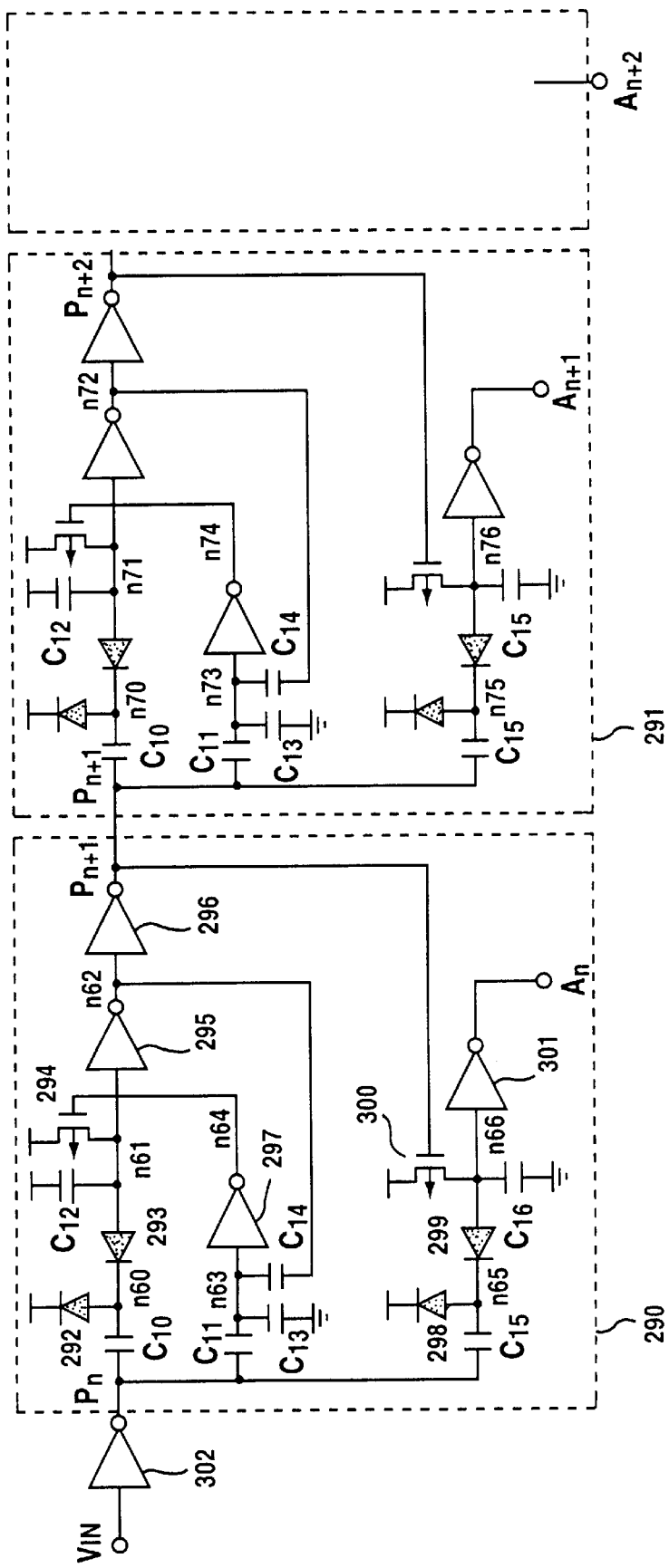
FIG. 56 is a diagram illustrating an additional counter circuit.
Figure 57:
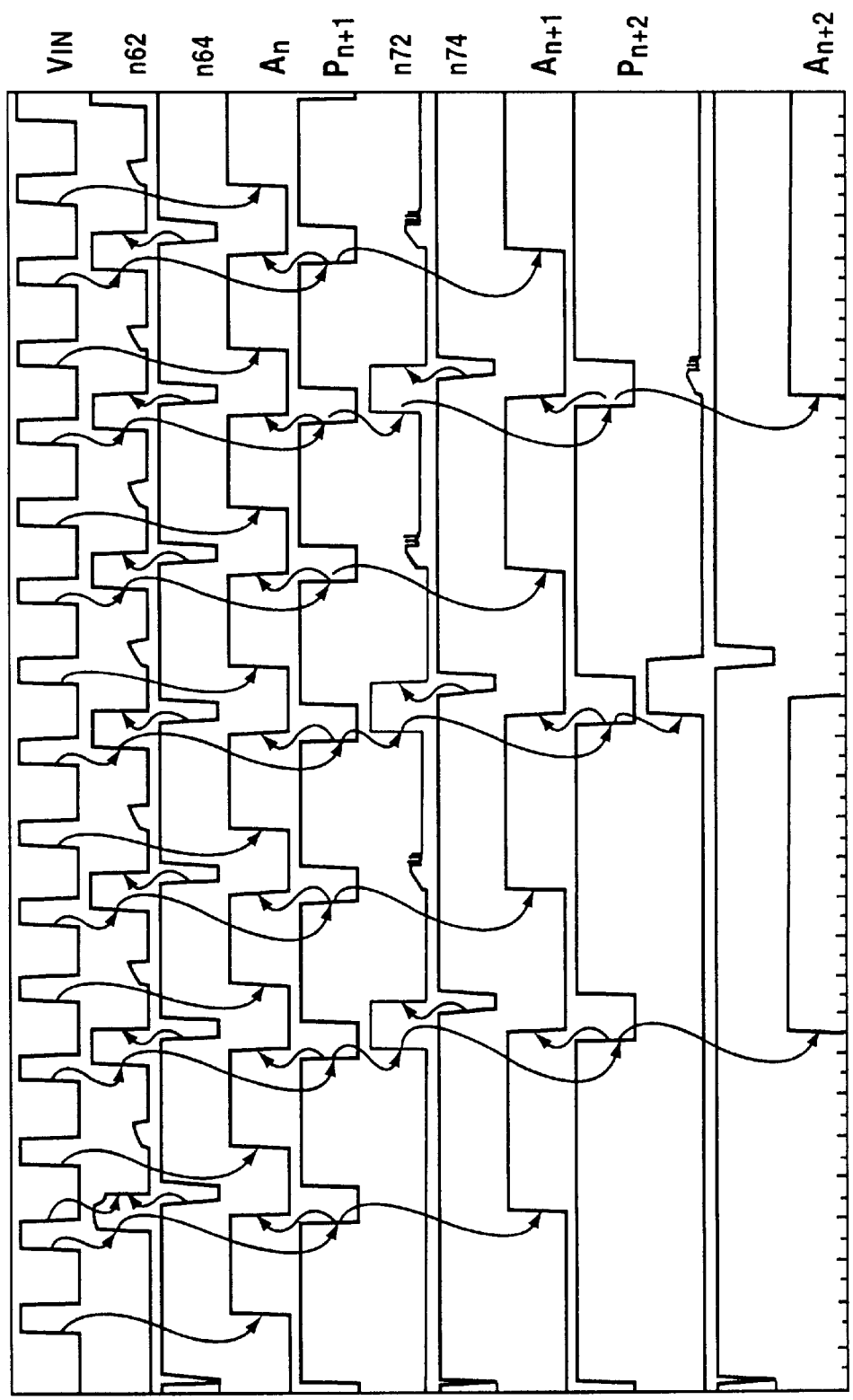
FIG. 57 is a signal waveform diagram for the counter circuit in FIG. 56.

FIG. 56 is a diagram illustrating an additional counter circuit. FIG. 57 is a signal waveform diagram showing the operation of that counter circuit.

In FIG. 56 are shown a first stage circuit 290 and a second stage circuit 291 in the counter circuit. Since the structures of the two circuits are substantially the same, only the structure of the first circuit 290 will now be described. This circuit 290 includes a charge pump circuit of the negative logic type shown in FIG. 55. The structure of a capacitor $C_{10}$, diodes 292 and 293, a capacitor $C_{12}$ and a reset transistor 294 are the same as those of the circuit in FIG. 55. That is, positive pulse signal Vin is inverted to obtain a negative pulse signal $P_n$. With this negative pulse signal $P_n$, node n61 falls from level H, which is a reset level. The threshold voltage of the inverter 295 is so set that it inverts the output upon receipt of two negative pulse signals $P_n$.

A charge pump circuit composed of a capacitor $C_{15}$, diodes 298 and 299, a capacitor $C_{16}$, and a reset transistor 300 has the same structure as described above. An inverter 301 has the same threshold voltage as those of the other inverters 295 and 297. It should be noted that the inverter 301 must invert the output upon receipt of a single pulse signal $P_n$, and that the connection direction for the capacitor $C_{16}$ is therefor different from the connection direction for the capacitor $C_{12}$. The capacitor $C_{16}$ is grounded.

In addition, the inverter 297 must invert the output upon the receipt of one pulse signal at node n62, which is inverted by two pulse signals $P_n$. Therefore, a capacitive coupling circuit, which is composed of capacitors $C_{11}$, $C_{13}$ and $C_{14}$, is provided at the input section of the inverter 297 and together with the inverter 297 constitutes a majority circuit. When both pulse signal $P_n$ and node n62 go to level H, the potential at node n64 falls, and the P type reset transistor 294 is driven to return node n61 to level H, which is the reset level.

Therefore, the inverter 295 inverts the output upon receipt of two pulse signals $P_n$ (inverted pulse signals of input positive pulse signals Vin) to form a pulse signal $P_{n+1}$ for the next stage. When the structure of the capacitor $C_{16}$ is changed with an appropriate capacitance, even though the inverter 301 has the same threshold voltage, it inverts the output upon receipt of one negative pulse signal $P_n$, and generates counter output $A_n$. The inverter 297 drives a reset transistor 294.

The operation of the counter circuit in FIG. 56 will now be described while referring to FIG. 57. Positive input pulse signal Vin is sequentially input, and negative pulse signal $P_n$ is transmitted via the inverter 302 to the first stage circuit 290. In the first charge pump circuit composed of the capacitor $C_{10}$, the diodes 292 and 293, the capacitor $C_{12}$ and the reset transistor 294, nodes n60 and n61 at level H fall via the diode 293 in accordance with the fall of pulse signal Pnf. At this time, however, the inverter 295 does not invert the output. Also in the second charge pump circuit composed of the capacitor $C_{15}$, the diodes 298 and 299, the capacitor $C_{16}$ and the reset transistor 300, node n66 at level H falls. Since the ratio of capacitances for the capacitors $C_{15}$ and $C_{16}$ is adequately set (e.g., $C_{15} > C_{16}$), the potential at node n66 is lower than the threshold voltage of the inverter 301. As a result, the inverter 301 inverts the output and the counter output $A_n$ goes to level H.

Upon receipt of the second pulse signal $P_n$, the potential at node n61 falls further, and the inverter 295 inverts the output. As a result, upon receipt of next stage input pulse $P_{n+1}$ which goes to level L, the reset transistor 300 becomes conductive and sets node n66 to level H. Thus, output $A_n$ goes to level L. At the same time, as node n62 goes to level H, the potential of the capacitor $C_{14}$ electrode is changed to level H. According to the majority logic between the potential of the capacitor $C_{14}$ and the signal $P_n$, which returned to level H, the inverter 297 inverts and generates output n64 at level L. With this L level output, the reset transistor 294 is driven and node n61 is returned again to level H. Thus, a pulse signal at the node n61, which is level L with a width equivalent of a delay time for the inverters 295 and 297, is provided. Similarly, signal $P_n$ is a negative pulse signal having a comparatively narrow width.

The second stage circuit 291 performs the same processing upon receipt of negative input pulse signal $P_n$. When two input pulse signals Vin are received, output $A_{n+1}$ goes to level H. Upon receipt of four input pulse signals Vin, output $A_{n+1}$ goes to level L. Although not shown in FIG. 56, the third stage circuit performs the same processing to generate output $A_{n+2}$.

As is described above, since the inverters in the counter circuit in FIG. 56 have the same threshold values, the circuit wherein no difficulty arises for the manufacturing process can be provided. Further, the counter circuit can be constituted with a small number of transistors by employing a charge pump circuit and a majority circuit that use a capacitive coupling circuit.

Figure 58:
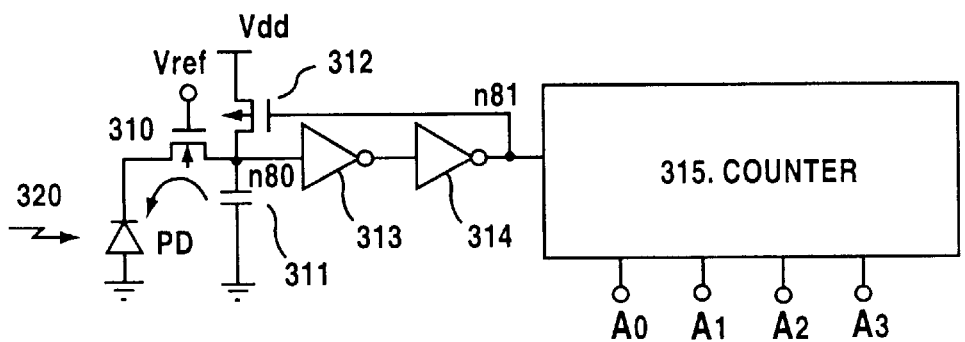
FIG. 58 is a diagram illustrating an AD converter employing a counter circuit.

An AD converter employing the above described counter circuit will now be described. FIG. 58 is a diagram illustrating such an AD converter. The AD converter discharges the node n80 of the capacitor 311, for example, by using a current detected by the photodiode PD, and charges the nodes n80 by using a reset transistor 312, thereby generating an input pulse signal for a counter circuit 315. A count value which is incremented within a predetermined period of time is output as digital output by using the fact that the frequency of an input pulse signal is varied by the magnitude of a current which changes in accordance with the light intensity detected by a photodiode.

Figure 59:
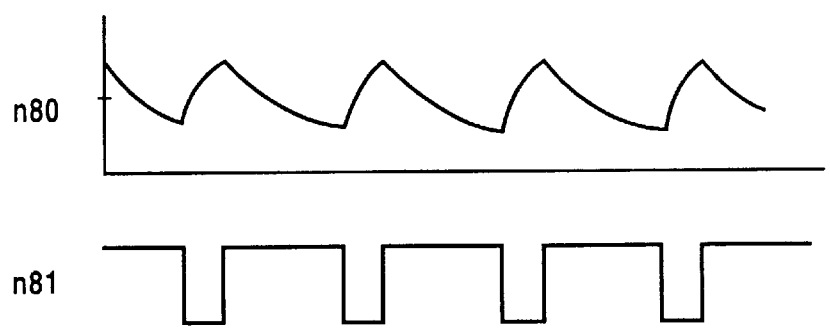
FIG. 59 is a signal waveform diagram for the AD converter in FIG. 58.
Figure 60:
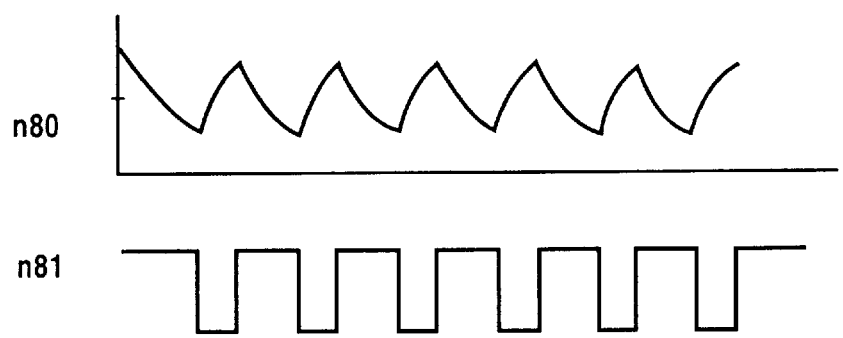
FIG. 60 is a signal waveform diagram for the AD converter in FIG. 58.

FIG. 59 is a diagram showing changes in nodes n80 and n81 when the light intensity is comparatively low. FIG. 60 is a diagram showing changes in nodes n80 and n81 when the light intensity is comparatively high. The operation of the AD converter will now be described while referring to FIGS. 59 and 60.

First, a detection current is generated in accordance with the intensity of the light 320 which is detected by the photodiode PD, and constant voltage Vref is applied to the gate of an N transistor 310. A capacitor 311 being charged via a P type reset transistor 312 is discharged with the detection current from the photodiode PD. An inverter 313 is set to an appropriate threshold voltage, and an input pulse signal is generated at node n81 and is supplied to a counter 315.

Assume that node n80 is at level H. In this condition, when the light 320 enters, the photodiode PD generates a current in accordance with the light intensity. Then, the electric charge on the capacitor 311 is discharged. When the voltage at node n80 falls lower than threshold voltage Vth of the inverter 313, the inverter 313 performs an inversion to change node n81 to level L. In response to an L level pulse signal, the reset transistor 312 is rendered conductive and the capacitor 311 is charged to raise node n80 to level H. Then, the inverter 313 again performs an inversion to change the node 81 to level H.

Therefore, a negative pulse occurs at node n81, and its pulse width is determined by the delay time for the inverters 313 and 314 and the charging period for the transistor 312. The interval of pulses is determined by the velocity of discharge, which is determined by the magnitude of a detection current. As is shown in FIG. 59, therefore, when the detection current is small, the frequency of a pulse signal is low. Further, as is shown in FIG. 60, when the detection current is great, the frequency of the pulse signal is high.

The counter 315 is constituted by, for example, the negative logic counter circuit shown in FIG. 53 or 56.

The example in FIG. 58 is a negative logic type. Node n80 goes to level H when reset, and the capacitor is charged by the detection current. This AD converter can be constructed using a positive logic type. Although not explained while referring to the drawings, when the capacitor 311 is connected to power source Vdd, the reset transistor is grounded, and the capacitor 311 is charged with a detection current from the photodiode PD, a positive pulse signal is generated at node n81.

The AD converter in FIG. 58 can be provided by using a capacitive coupling circuit. Although not a flash type, a current analog value can be converted into a digital value by counting the pulse signals, which correspond to a detection current, occurring within a predetermined period of time.

Figure 61:
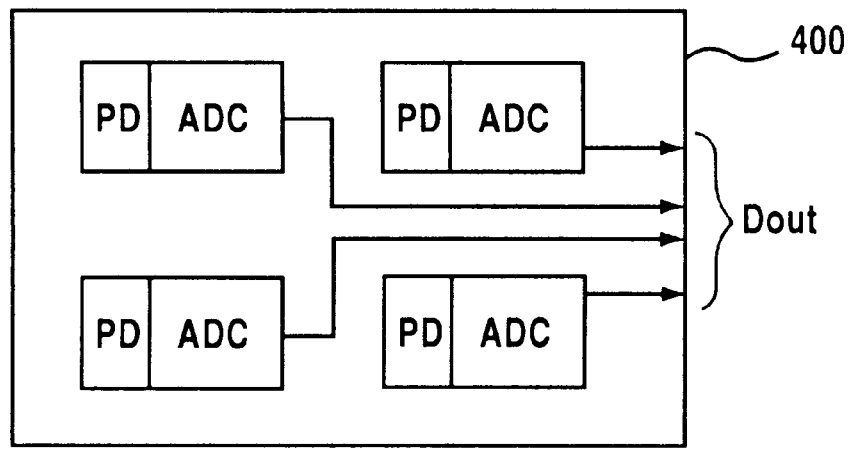
FIG. 61 is a diagram illustrating an example integrated circuit obtained when an AD converter and other logic circuits are formed on a chip on which a photodetector device is mounted.

FIG. 61 is a diagram illustrating an integrated circuit when the AD converter and the other logic circuits described above are formed on the same chip as is a photodetector PD. In this example, photodetectors PD for four pixels are mounted on a chip 400. An AD converter ADC is arranged adjacent to each photodetector PD to generate digital output Dout for each pixel.

Figure 62:
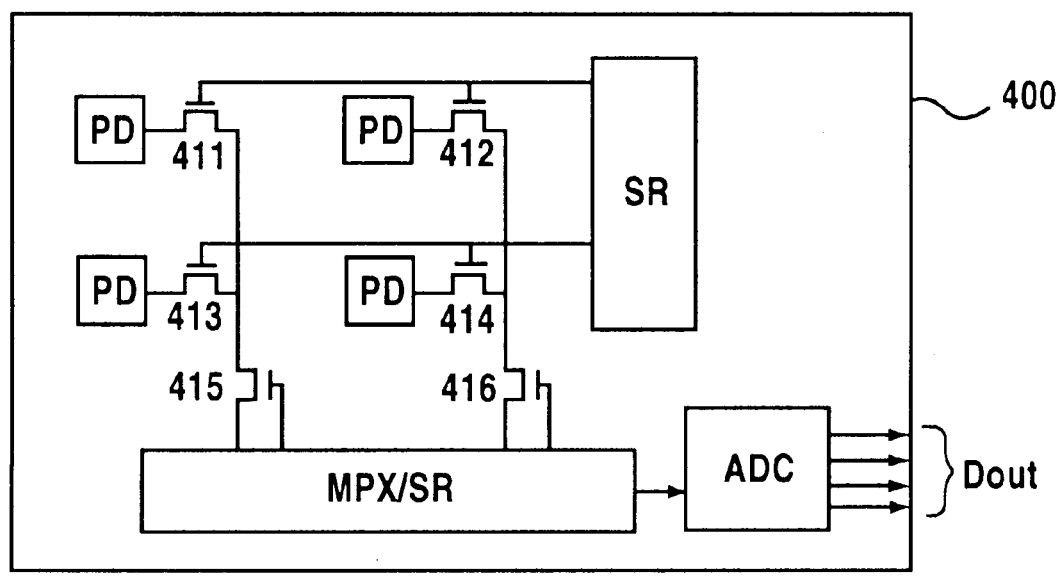
FIG. 62 is a diagram illustrating another example integrated circuit obtained when an AD converter and other logic circuits are formed on a chip on which a photodetector device is mounted.

Similarly, FIG. 62 is a diagram illustrating another integrated circuit when the AD converter and the other logic circuits described above are formed on the same chip as is a photodetector PD. In this example, photodetectors PD for four pixels are mounted on a chip 400. Analog outputs of the photodetectors are supplied via respective gate transistors 411 through 416 and through a multiplexer MPX to an AD converter ADC in a time sharing manner. The digital outputs Dout obtained by AD conversion are externally supplied. The gate transistors 411 through 416 are driven by a shift register SR in a time sharing manner.

Since the logic circuits and the AD converter using a capacitive coupling circuit, which are explained in the above embodiment, are employed for the integrated circuits in FIGS. 61 and 62, the integrated circuits can be constructed by using a small number of transistors. Accordingly, a larger area on which photodetectors are to be mounted can be obtained.

[Improved AD converter]

Figure 63:
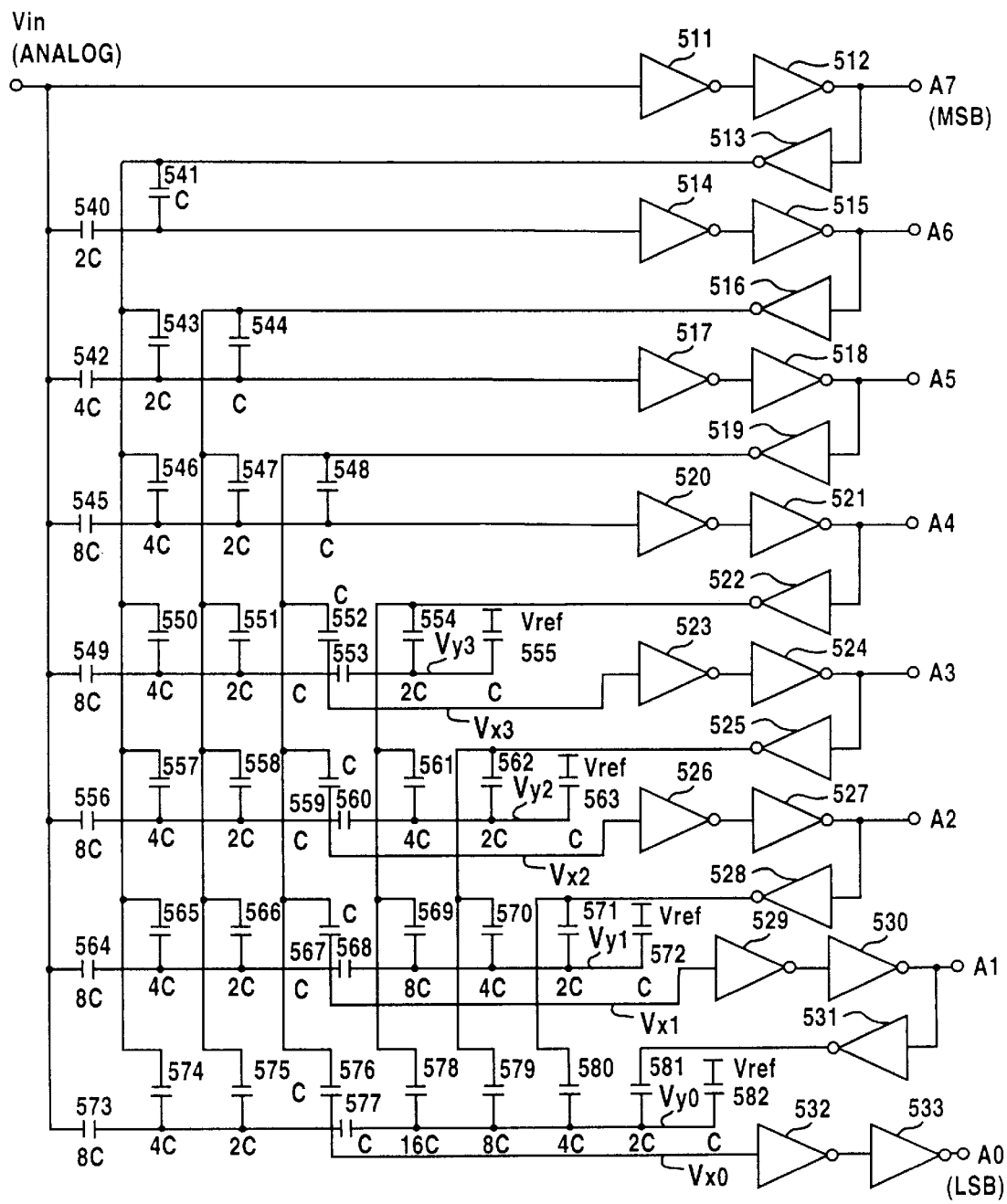
FIG. 63 is a diagram illustrating an improved AD converter.

FIG. 63 is a diagram illustrating an improved AD converter. This AD converter is an improved version of the flash AD converter shown in FIGS. 20, 22, 29 and 32.

When the number of digital output bits is small, no particular problem occurs in the processing performed by the flash AD converter in FIGS. 20, 22, 29 and 32. When the number of bits is large, such as 8 bits or 16 bits, the required capacitance is extremely large, which is an obstacle to integration with a photoelectric conversion device. As for the AD converter in FIG. 32, for example, the capacitance of the capacitive coupling circuit which is required to generate the 4-bit digital output is $$(2C+C)+(4C+2C+C)+(8C+4C+2C+C)=25C,$$

excluding the portion for generating a remainder. For the generation of 8-bit digital output, the required capacitance is $$(2C + C) + (4C + 2C + C) + (8C + 4C + 2C + C) +$$
$$(16C + 8C + 4C + 2C + C) + (32C + 16C + 8C + 4C + 2C + C) +$$
$$(64C + 32C + 16C + 8C + 4C + 2C + C) +$$
$$(128C + 64C + 32C + 16C + 8C + 4C + 2C + C) = 501C.$$

Such an extremely large capacitance is not desirable because a large area of the integrated circuit is occupied. To resolve this problem, the circuit in FIG. 32 employs the operational amplifier 168 to calculate the remainder for every four bits, and the remainder is used as input for the following 4-bit AD converter. However, the employment of the operational amplifier 168 is also not preferable because it results in an increase in the number of devices.

Although the improved AD converter in FIG. 63 provides 8-bit digital output, a capacitive coupling circuit is divided into a main array and a sub array, and the two arrays are coupled by a capacitor, so that the total capacitance can be considerably reduced.

The AD converter in FIG. 63 converts analog input Vin into 8-bit digital output A7 to A0. A circuit for acquiring the upper 4-bits, A7 through A4, for the analog input Vin is the same as that shown in FIGS. 29 and 32. More specifically, an inverter 511, which is a comparator, determines, directly or via a capacitor C (not shown), whether or not the analog input vin is greater than the threshold voltage Vt. The output is then inverted by an inverter 512 to generate the most significant bit A7. As is explained while referring to FIGS. 29 and 32, the inverter 512 has a threshold value either slightly higher or lower than the threshold value Vt (Vt=0 V in the example in FIG. 32 and Vt=Vdd/2 in the example in FIG. 63) of the inverter 511. The inverted value of the most significant bit A7 is fed back via a capacitor 541 to a capacitive coupling circuit composed of the capacitors 540 and 541 for the following bit A6.

To acquire the following bit A6, the capacitive coupling circuit couples input Vin via the capacitor 540 having a capacitance of 2C, and couples inverted value /A7 of the most significant bit A7 via the capacitor 541 having a capacitance of C. Therefore, the inverted bit /A7 of the most significant bit A7 is added, with a weighted factor of ½, to the input Vin. The inverter 514, which is a comparator, determines whether that value is greater or smaller than the threshold value Vt to thereby acquire the following bit A6. The principle of this operation has been previously described. Bits A5 and A4 are acquired in the same manner.

In the improved AD converter in FIG. 63, the circuits for obtaining the lower four bits A3 to A0 are so designed that a capacitive coupling circuit is divided into a main array and a sub-array and the two arrays are coupled together by a capacitor. For example, in a circuit for obtaining output bit A3, a main array, wherein input Vin and inverted bits of output bits A7 to A5 are coupled together by capacitors 549, 550, 551, 552 and a sub-array, wherein the inverted bit of output bit A4 is coupled together by the capacitor 554, are coupled by a capacitor 553. Reference voltage Vref is coupled via a capacitor 555 to the sub-array. The ratio of the capacitances of the capacitors 549 through 555 is as is shown in FIG. 63.

Figure 64:
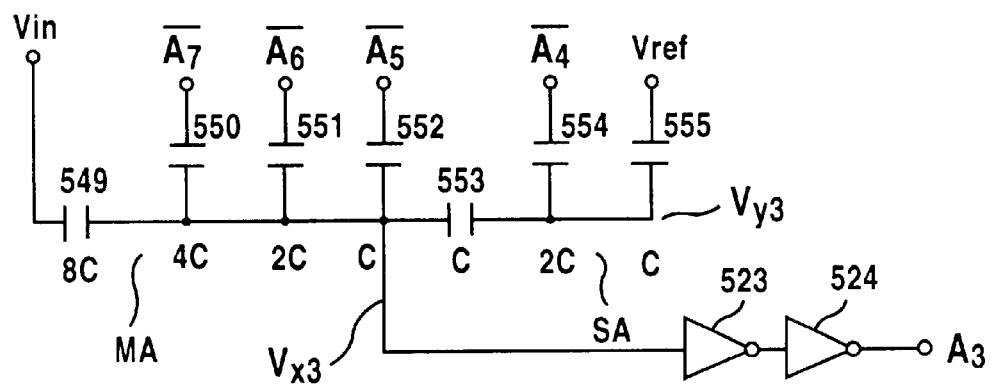
FIG. 64 is a diagram of an extracted portion of a circuit for acquiring bit A3.

FIG. 64 is a diagram of only an extracted circuit portion for obtaining output bit A3. As is apparent from FIG. 64, the voltage at capacitive coupling point $V_{y3}$ on the sub-array SA side is coupled via the capacitor 553 with capacitive coupling point $V_{x3}$ on the main array MA side. In th e sub-array SA, since inverted bit/A4 of output bit A4 is coupled via the capacitor 554 having the capacitance of 2C, the inverted bit /A4 is coupled with voltage $V_{y3}$ with a weighted factor of 2C/4C=½ derived from the relationship between the capacitor 553 (C), the capacitor 554 (2C) and the capacitor 555 (C). In the main array MA, voltage $V_{y3}$ is coupled via the capacitor 553 with voltage $V_{x3}$ with a weighted factor of ⅛. Input Vin has a weighted factor of 1; bit/A7, one of ½; bit A/6, one of ¼; bit /A5, one of ⅛; and voltage $V_{y3}$, one of ⅛. Therefore, bit /A4 is coupled with a weighted factor of ¹⁄₁₆.

Similarly, in the capacitive coupling circuit for output bit A2, a main array, including capacitors 556 through 559, and a sub-array, including capacitors 561 through 563, are coupled together by a capacitor 560. In the capacitive coupling circuit for output bit A1, a main array, including capacitors 564 through 567, and a sub-array, including capacitors 569 through 572, are coupled together by a capacitor 568.

Figure 65:
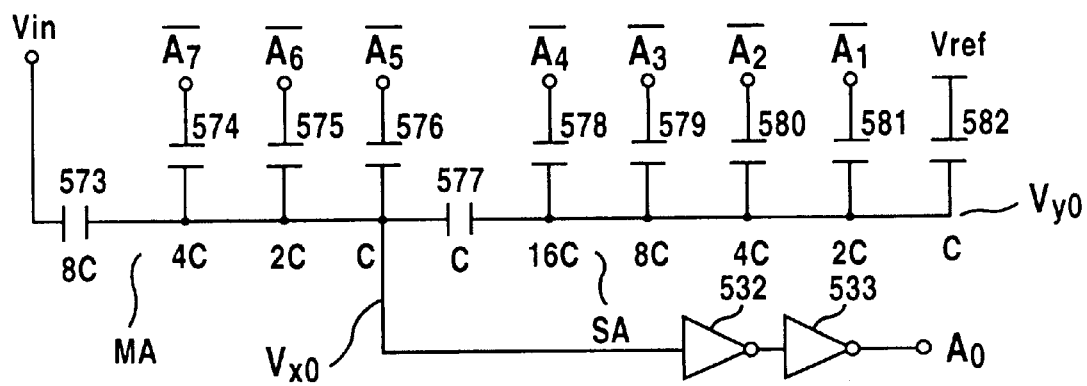
FIG. 65 is a diagram of a coupling circuit for the least significant bit A0.

FIG. 65 is a diagram illustrating a coupling circuit for the least significant bit A0. That is, a main array MA, including capacitors 573 through 576 which couple together input Vin and inverted bits /A7, /A6 and /A5, and a sub-array SA, including capacitors 578 through 582 which couple together inverted bits /A4 through/A1 and reference voltage Vref, are coupled together by a capacitor 577. Voltage $V_{x0}$ is transmitted to an inverter 532 which is a comparator.

To understand the improved AD converter in FIG. 63, the capacitive coupling circuit for output bit A0 in FIG. 65 is employed and voltage $V_{x0}$ is calculated. From the relationship between potential $V_{x0}$ of the main array and potential $V_{y0}$ of the sub-array, and the relationship between input Vin and bits A7 through A0, the following three expressions are established:

$$V_{x0}=(8Vin+4/A7\cdot Vdd+2/A6\cdot Vdd+/A\ 5\cdot Vdd+V_{y0})/16$$

$$V_{y0}=(16/A4\cdot Vdd+8/A3\cdot Vdd+4/A\ 2\cdot Vdd+2/A1\cdot Vdd+Vref+V_{x0})/32$$

$$Vin=Vdd(A7/2+A6/4+A5/8+A4/16+A3/32+A2/64+A1/128+A0/256)$$

By calculating the above three expressions, potential $V_{x0}$ is acquired as $$511V_{x0}=254Vdd+Vref+A0\cdot Vdd.$$

It should be noted that An·Vdd+/An·Vdd=Vdd (n is 1 to 7).

Assuming that the threshold voltage Vt of the comparator 532 is Vt=Vdd/2 and Vref=Vdd, $$V_{x0}=(510Vt+A0\cdot 2Vt)/511.$$

Potentials $V_{x0}$ are acquired when input Vin is at a level of A0=0 and when input Vin is at a level of A0=1.

(1) When input Vin is at a level of A0=0,
    $V_{x0}=(510/511)Vt$.
(2) When input Vin is at a level of A0=1,
    $V_{x0}=(512/511)Vt$.

That is, the least significant bit A0 is either 0 or 1 depending on whether potential $V_{x0}$ is 510/511 or 512/511 of the threshold voltage Vt.

Supposing Vref=Vdd/2, $$V_{x0}=(509Vt+A0\cdot 2Vt)/511.$$

Potentials are calculated when input Vin is at a level of A0=0 and when input Vin is at a level of A0=1.

(1) When input Vin is at a level of A0=0,
    $V_{x0}=(509/511)Vt$.
(2) When input Vin is at a level of A0=1,
    $V_{x0}=(511/511)Vt$.

The least significant bit A0 is 0 or 1 depending on whether the potential $V_{x0}$ is 509/511 or 511/511 of threshold voltage Vt.

Therefore, for the least significant bit A0, a digital value is obtained by detecting a difference of 2/511 of the threshold voltage Vt. Theoretically, the least significant bit of eight bits is Vin/256 (=2Vin/512), and it is apparent that the calculated values almost correspond to the theoretically obtained values. Since the main array and the sub-array in FIG. 65 interfere with each other via the capacitor 577, the actual values can not match the theoretically obtained values. However, this error can be adjusted in accordance with the design of the circuit.

It is preferable that the inverters 511, 514, 517 520, 523, 526, 529 and 532, which are comparators of the AD converter in FIG. 63, have characteristics for performing the inversion as accurate as possible at threshold voltage Vt. When an auto zero inverter is used in these inverter circuits, the inversion operation can be accurately performed.

Figure 66:
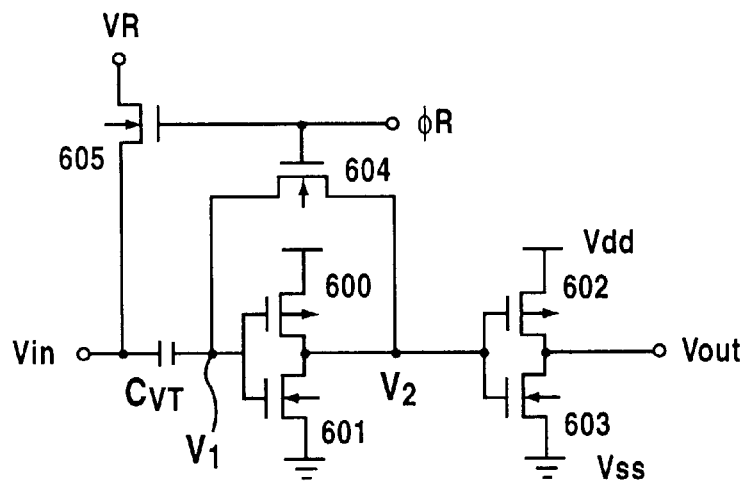
FIG. 66 is a diagram illustrating an auto-zero inverter.
Figure 67:
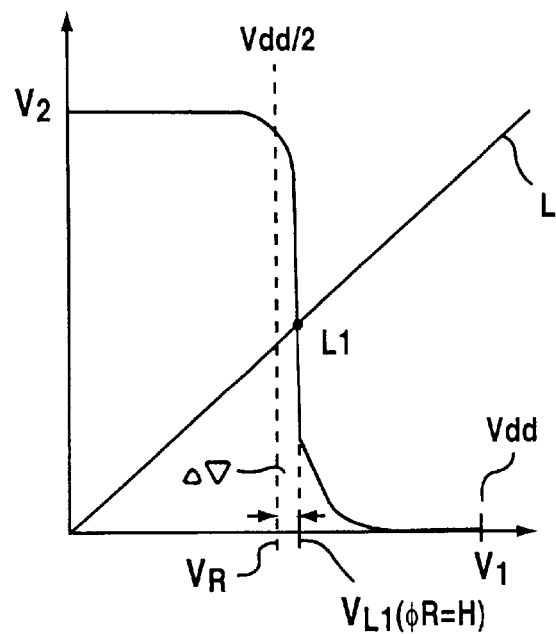
FIG. 67 is a graph showing the characteristic of the auto-zero inverter.

FIG. 66 is a diagram illustrating an auto zero inverter circuit. FIG. 67 is a diagram showing the characteristic of the auto zero inverter. The circuit in FIG. 66 comprises an inverter (532 in FIG. 65) including a CMOS inverter constituted by transistors 600 and 601, a short-circuit transistor 604 for short-circuiting input V1 and output V2, a transistor 605 for applying reference voltage $V_R$ to input terminal Vin, and a compensation capacitor $C_{VT}$; and another inverter constituted by transistors 602 and 603.

Since input V1 and output V2 of the first stage inverter are short-circuited by reset clock φR with level H, the potential for input V1 and output V2 is potential $V_{L1}$, corresponding to point L1 along a short circuit line L shown in FIG. 67. At this time, when reference voltage $V_R$ is applied to input Vin, an electric charge, which corresponds to difference ΔV between voltage $V_{L1}$ and reference voltage $V_R$ is accumulated in the compensation capacitor $C_{VT}$.

More specifically, point L1 in FIG. 67 is accurately shifted upper or lower from Vdd/2 due to the variance in the characteristic of the inverter, and potential $V_{L1}$ is shifted upper or lower from Vdd/2. Therefore, when reference voltage $V_R$=Vdd/2 is employed, the compensation capacitor $C_{VT}$ constantly accumulates electric charges that correspond to a voltage difference between the inverted potential $V_{L1}$ of the inverter and $V_R$=Vdd/2. Under such a reset condition, when an arbitrary voltage is applied to input vin, the inverter accurately performs inversion at a point where the input vin is Vdd/2.

Therefore, when the auto zero inverter shown in FIG. 66 is employed, an analog input Vin is supplied after the circuit is reset by reset signal φR.

Referring again to the improved flash AD converter in FIG. 63, as is described above, the capacitive coupling circuit portion for lower bits is divided into the main array and the sub-array, and the two arrays are coupled together by a capacitor. The total capacitance is:

$$(2C+C)+(4C+2C+C)+$$
$$(8C+4C+2C+C)+(8C+4C+2C+C+C+2C+C)+$$
$$(8C+4C+2C+C+C+4C+2C+C)+$$
$$(8C+4C+2C+C+C+8C+4C+2C+C)+$$
$$(8C+4C+2C+C+C+16C+8C+4C+2C+C)=145C.$$

This capacitance is about ⅓ of the previously acquired 501C. This difference becomes more apparent as the number of bits is increased.

Figure 68:
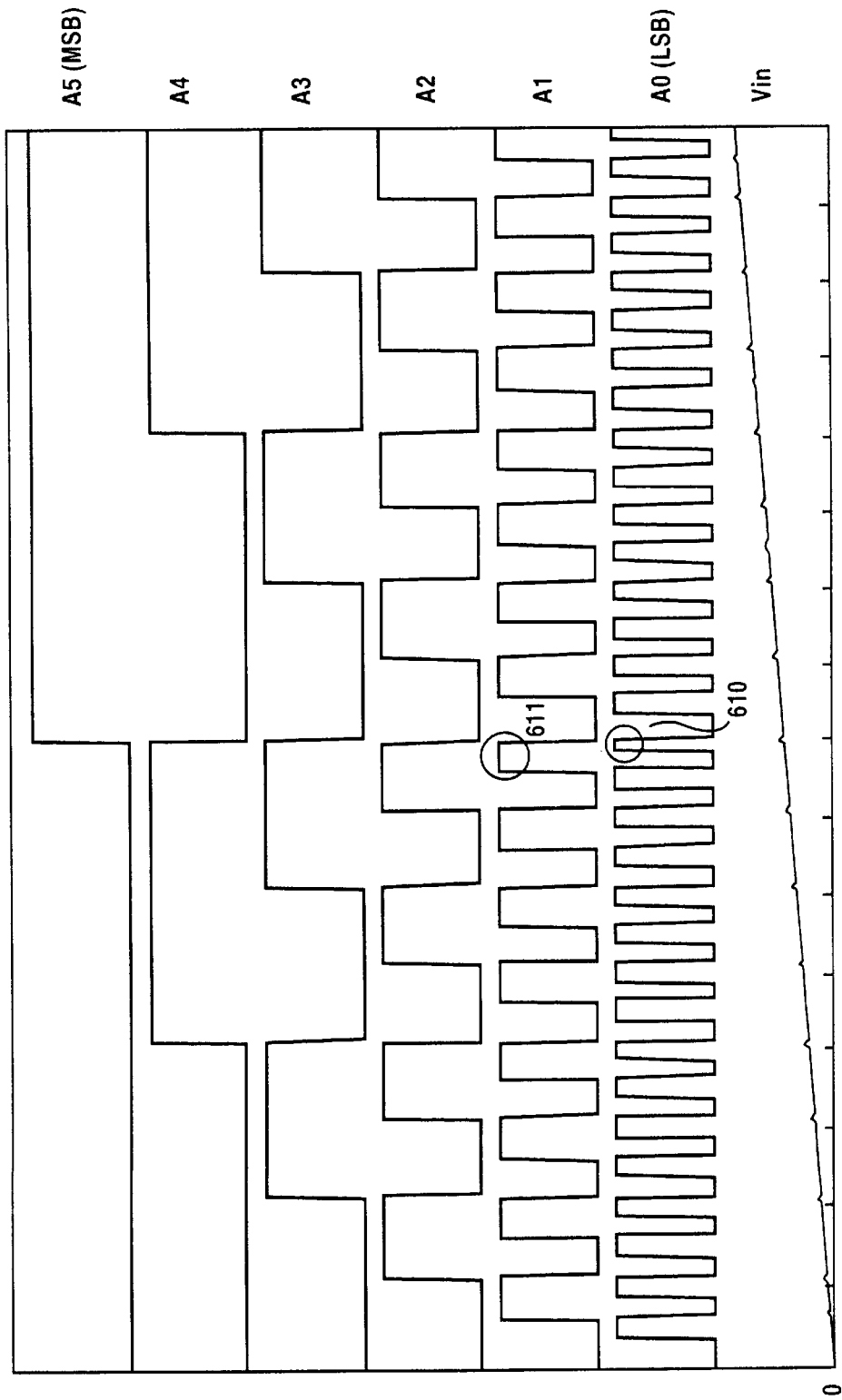
FIG. 68 is a diagram showing an operating characteristic of the same AD converter as that in FIG. 63, which includes 6-bit digital output A5 through A0.

FIG. 68 is a diagram showing the operational characteristic of an AD converter, which is equivalent to the circuit in FIG. 63, but has 6-bit digital outputs A5 to A0. In this example, of the 6-bit digital outputs A5 to A0, the capacitive coupling circuit divided into the main array and the sub-array is employed for lower bits A2, A1 and A0. The operational characteristic in FIG. 68 shows the changes in the digital outputs A5 to A0 when analog input Vin is changed from 0 V to Vdd. As a whole, it is found that the digital outputs A5 to A0 are sequentially inverted. However, as is indicated by 610 and 611, periods for level H at lower bits A0 and A1 are shorter than the other periods for level H. This is probably because of an error caused by interference between the main array and the sub-array, as previously described.

Figure 69:
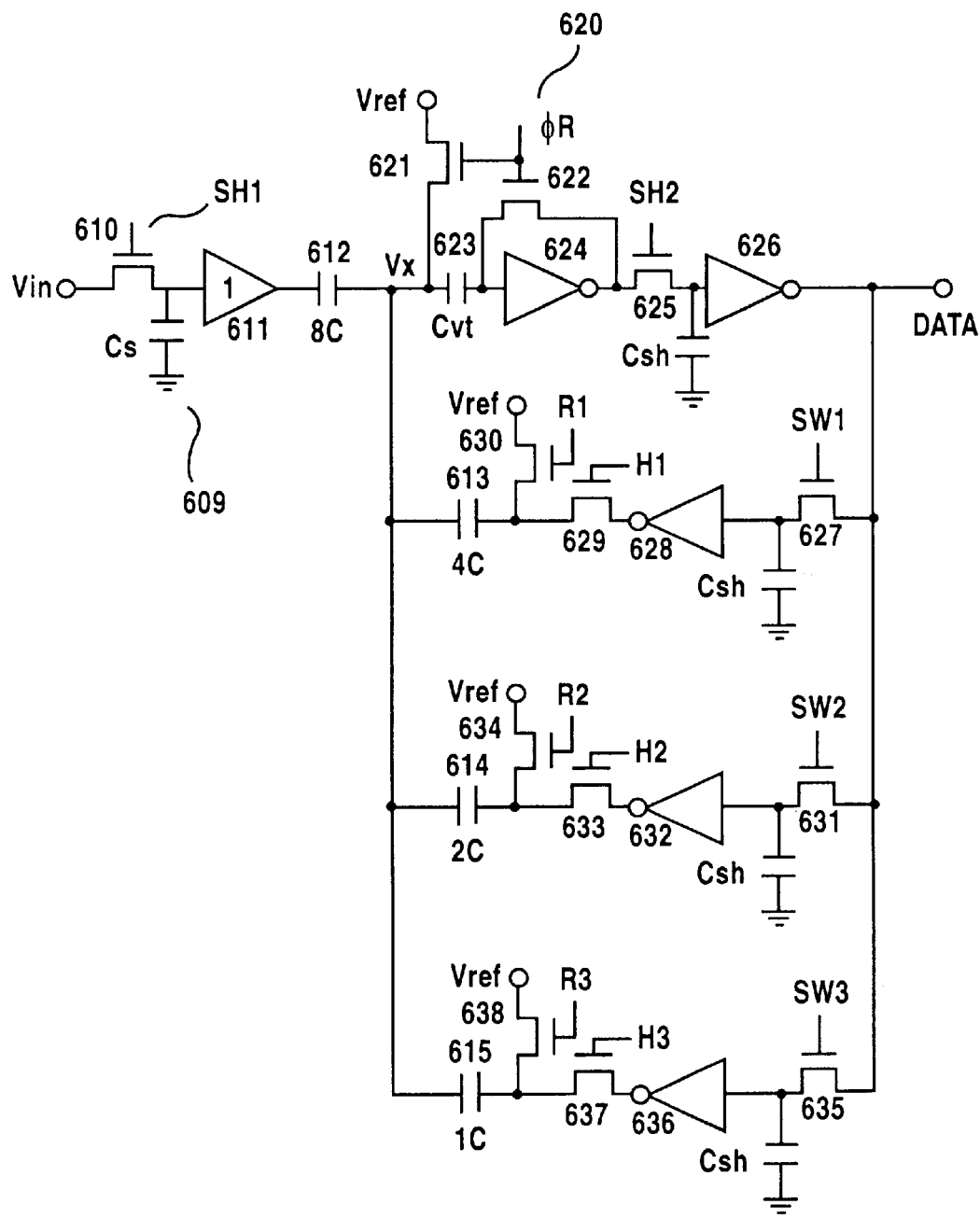
FIG. 69 is a diagram illustrating an improved sequential comparison type AD converter.

FIG. 69 is a diagram showing an improved serial type AD converter. Although the serial AD converter is shown in FIG. 45, this circuit requires multiple operational amplifiers. The example AD converter in FIG. 69 is constituted by capacitors, transistors and inverters, and as few operational amplifiers as possible.

In the circuit in FIG. 69, only one operational amplifier 611 is employed in a circuit 609 for sampling and holding analog input Vin. More specifically, a transistor 610 becomes conductive upon receipt of sample-and-hold signal SH1, and a capacitor Cs is charged in accordance with a voltage at analog input Vin. As a result, the voltage at analog input Vin is held at the electrode of the capacitor Cs.

Capacitors 612, 613, 614 and 615 constitute a capacitive coupling circuit. Input Vin is coupled to the capacitor 612 having a capacitance of 8C, and beginning from the upper bit, bit /A3 is coupled to the capacitor 613 having a capacitance of 4C, bit /A2 is coupled to the capacitor 614 having a capacitance of 2C, and bit /A1 is coupled to the capacitor 615 having a capacitance of C. Therefore, bits /A3 through /A1 are coupled together by weighted factors of ½, ¼ and ⅛ relative to input Vin.

That is, by opening the switches SW1, Sw2 and Sw3, the capacitive coupling circuits for individual bits in FIG. 63 are sequentially formed, and digital bit outputs are generated at output terminal Data.

The serial AD converter in FIG. 69 employs the auto zero inverter shown in FIG. 66 as a comparator. In other words, the comparator 620 is constituted by an inverter 624, a short-circuit transistor 622, a transistor 621 for applying reference voltage Vref, and a compensation capacitor $C_{VT}$. A transistor 625 is driven by clock SH2, and performs sampling of the output of the inverter 624 and holds the resultant output in a capacitor Csh. The voltage that is held is inverted by an inverter 626, and the inverted voltage is transmitted as digital output to output terminal Data.

The most significant bit A3 is sampled by the switch 627 and the sampled bit is held in the capacitor Csh. Inverted value /A3 is coupled via the capacitor 613 by means of the switch 629. As a result, the next bit A2 is generated at the output terminal Data. At the same time, the bit A2 is sampled by the switch 631 and held in the capacitor Csh. Inverted value /A2 is coupled via the capacitor 614 by means of the switch 633. As a result, the next bit A1 is generated at output terminal Data. The following bit A0 is generated in the same manner.

Figure 70:
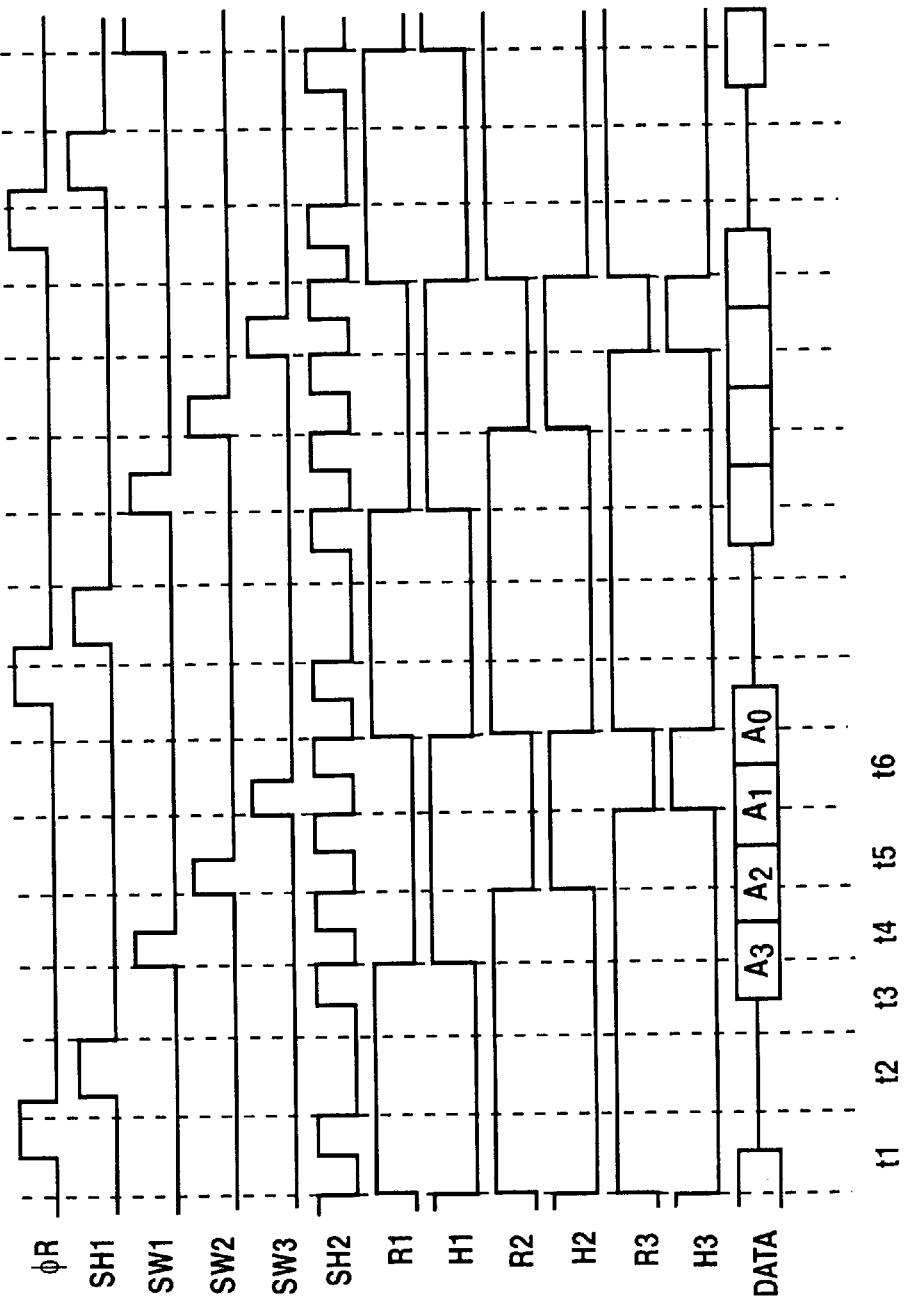
FIG. 70 is a timing chart for control clocks representing serial conversions performed by the AD converter in FIG. 69.

FIG. 70 is a timing chart for control clocks indicating the above serial AD conversion operation. Analog input Vin is sequentially converted into 4-bit digital values A3, A2, A1 and A0 at clock cycle of t1 to t6. First, at clock cycle t1, upon application of reset signal φR, the auto zero inverter 620 is reset and the compensation capacitor $C_{VT}$ is charged. At the same time, reset signals R1, R2 and R3 for individual bits are set to level H, and reference voltage Vref (=Vdd/2) is applied via transistors 630, 634 and 638 to the electrodes of the capacitors 613, 614 and 615. The voltage value Vref is a neutral potential in the capacitive coupling circuit.

When sample-and-hold signal SH1 is set to level H at clock cycle t2, the voltage at input Vin is held by the capacitor Cs, and the input potential is applied to the output terminal of the operational amplifier 611. The potential is applied via the capacitor 612 to the inverter or comparator 620, which in turn compares the potential with the reference voltage Vref (=Vdd/2). At clock cycle t3, in response to another sample-and-hold signal SH2 at level H, the output of the inverter 620 is sampled and held by the capacitor Csh, and the most significant bit A3 is output to the output terminal Data.

Following this, at clock cycle t4, switch signal Sw1 goes to level H, the transistor 627 becomes conductive, and output bit A3 is sampled and held by the capacitor Csh. At the same time, reset signal R1 goes to level L and signal H1 goes to level H, so that the inverted bit of the most significant bit A3 is transmitted to the capacitor 613. A voltage is generated at node Vx in accordance with weighting performed by the capacitive coupling circuit, which includes the capacitors 612 and 613. In the same manner, the following bit A2 is generated at output terminal Data.

At clock cycle t5, switch signal SW2 goes to level H, the transistor 631 is rendered conductive, and output bit A2 is sampled and held by the capacitor Csh. At the same time, reset signal R2 goes to level L. The potential for the following bit is generated at node Vx by the capacitive coupling circuit, which includes capacitors 612, 613 and 614. In response to sample-and-hold signal SH1, bit A1 is generated at output terminal Data.

Finally, at clock cycle t6, the potential for bit A0 is generated at node Vx by the capacitive coupling circuit, which includes capacitors 612 through 615. In response to sample-and-hold signal SH2, output bit A0 is generated at output terminal Data. At this time, output bit A3 is held in the capacitor Csh by the switch SWI, output bit A2 is held in the capacitor Csh by the switch SW2, and output bit A1 is held in the capacitor Csh by means of the switch SW3.

As is described above, analog input Vin is converted to a 4-bit digital value during clock cycles t1 to t6 in FIG. 70.

Figure 71:
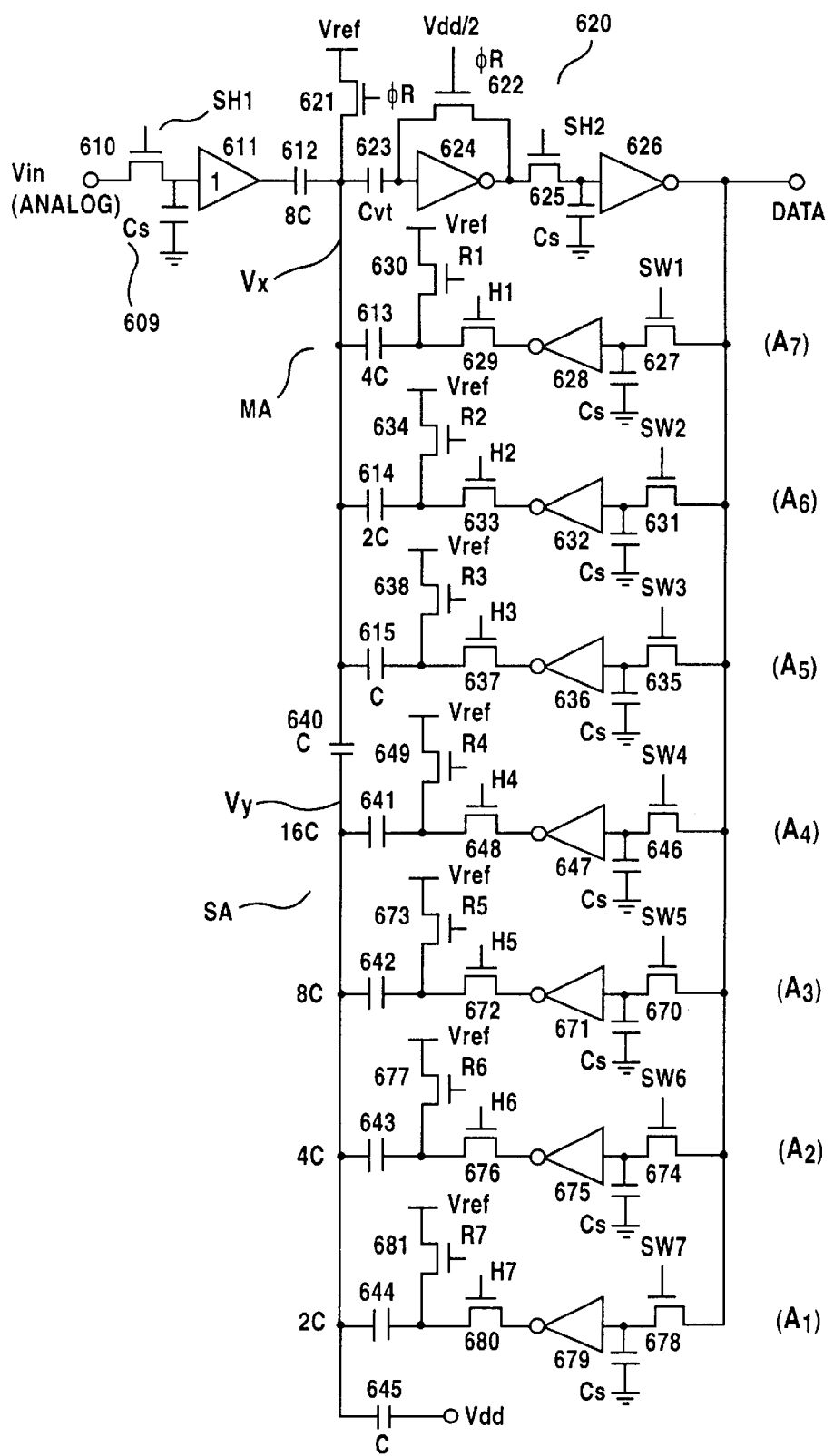
FIG. 71 is a diagram illustrating a serial AD converter that can generate an 8-bit digital value.

FIG. 71 is a diagram illustrating a serial AD converter for generating an 8-bit digital value. In this example, the capacitive coupling circuit portion is divided into a main array MA and a sub-array SA, as in FIG. 63, and the two arrays are coupled together by a capacitor 640, so that the increase in the total required capacitance that accompanies an increase in bits can be prevented.

In the AD converter in FIG. 71, capacitors 612 through 615 and capacitors 640 through 645 are equivalent to those in the capacitive coupling circuit in FIG. 65. It should be noted that, since the circuit in FIG. 71 is a serial circuit, inverted values of upper bits are applied in a time sharing manner. To detect the least significant bit, a circuit structure that is exactly the same circuit structure as in FIG. 65 is employed. The main array MA is constituted by the capacitors 612 615 in which inverted values of the upper bits A7, A6 and A5 are applied to the each capacitor, and the potential at the connection point is represented as Vx. The sub-array SA is constituted by the capacitors 641 645 in which inverted values of the lower bits A4, A3, A2 and A1 are applied to the each capacitor, and the potential at the connection point is represented as Vy. The two arrays MA and SA are coupled together by the capacitor 640.

In FIG. 71, a feedback circuit for the upper bits A7, A6 and A5 is equivalent to the one in FIG. 69, while the same reference numerals are used to denote corresponding components. A feedback circuit for the lower bits A4, A3, A2 and A1 constitutes a sub-array that is coupled by the capacitor 640. The conversion operation is performed in the manner as was explained while referring to FIG. 69. First, the inverter 620 is reset by reset signal φR, and nodes of the feedback circuits are also reset to a neutral level by reset signals R1 through R7. Analog input Vin is sampled and held by the capacitor Cs(609) in response to the sample-and-hold signal SH1. Then, in synchronization with the timing of the second sample-and-hold signal SH2, beginning at the upper bit, bits are serially converted into digital values in accordance with switch signals SW1 through SW7, signals H1 through H7 and reset signals R1 through R7.

Figure 72:
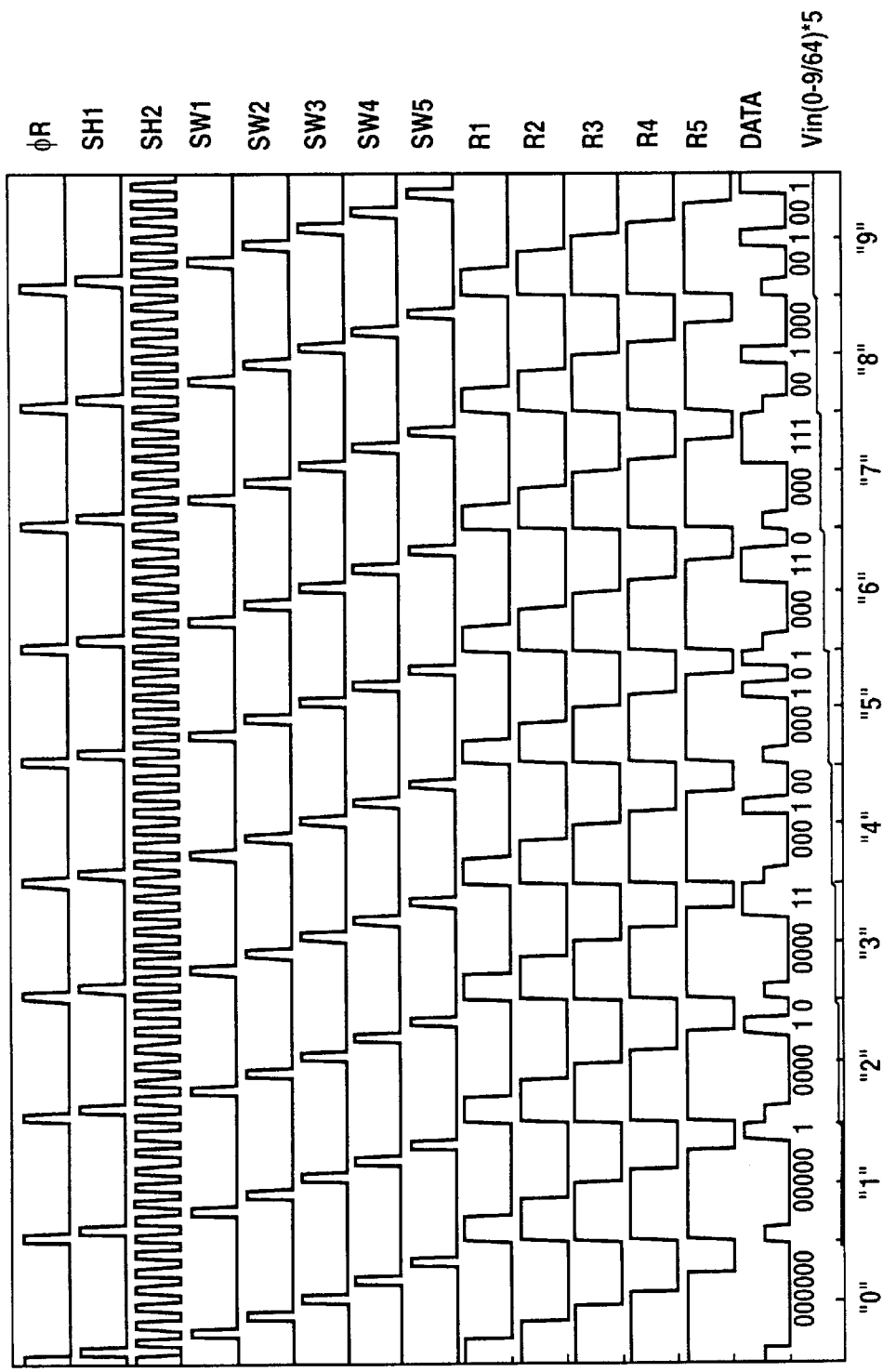
FIG. 72 is a timing chart for the serial AD converter in FIG. 71 having a 6-bit output.
Figure 73:
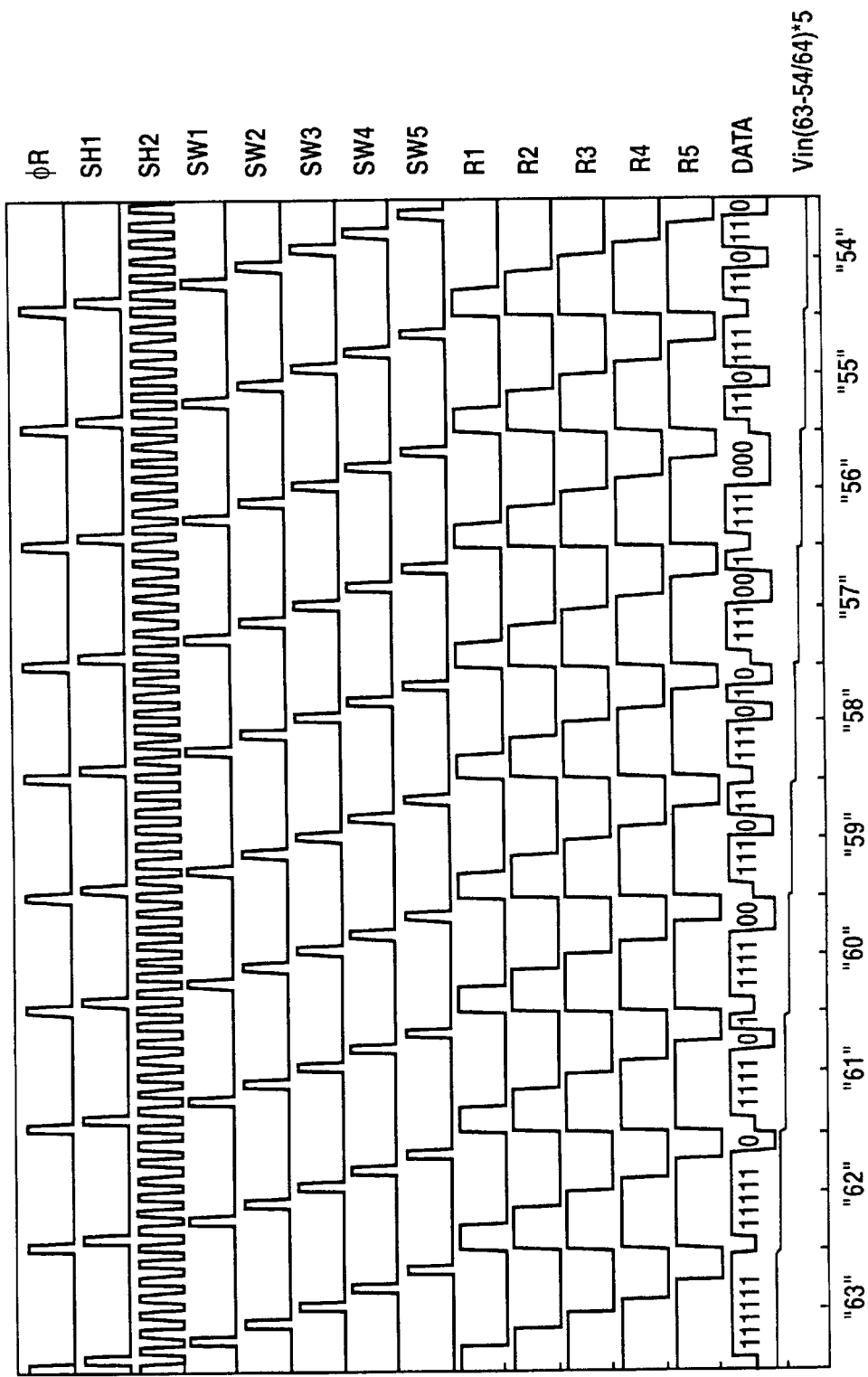
FIG. 73 is a timing chart for the serial AD converter in FIG. 71 having 6-bit output.

FIGS. 72 and 73 are timing charts for control signals φR, SH1, SH2, SW1 to SW7, R1 to R7, input Vin, and output Data and are used to explain the operation of the 6-bit serial AD converter in FIG. 71. In FIG. 72 is shown the change in the output at Data when input Vin is "0" to "9" of 64 levels for six bits. In FIG. 73 is shown the change in the output at Data when input Vin is "63" to "154," of 64 levels for six bits.

For the case in FIG. 72, when sample-and-hold signal SH2 goes to level H six times relative to the input Vin at a level of "0" to "9," input is converted into digital output of from "000000" to "001001."

For the case in FIG. 73, when sample-and-hold signal SH2 goes to level H six times relative to the input Vin at a level of "63" to "54," input is converted into digital output of from "111111" to "110110."

The serial AD converter in FIG. 71 is constituted by the inverters, the transistors and capacitors, with the exception that the operational amplifier 611 is employed for the input portion. In addition, in spite of there being multiple bit digital output, the capacitive coupling circuit is so designed that it is divided into the main array MA and the sub-array SA, and the two arrays are coupled together by the capacitor 640, so that the total required capacitance is reduced and integration is facilitated. Further, since the auto zero inverter 620 is used, the threshold value, which is used for comparison to convert analog input into digital values, can be set to Vdd/2, half of power voltage Vdd accurately. In addition, the threshold value can be set to an arbitrary potential Vref.

As is described above, according to the present invention, various logic circuits, AD converters, DA converters and counter circuits can be constituted with a small number of transistors by employing a capacitive coupling circuit.

Therefore, when these circuits are employed, an area required for mounting peripheral devices can be reduced for an LSI on which an image sensor, a peripheral AD converter and an operation circuit are all mounted. Therefore, an LSI on which a sensor having a high fill factor is mounted can be provided.

What is claimed is:

1. A logic circuit comprising:
    a plurality of input terminals, to which binary input is provided;
    a plurality of input capacitors having first electrode respectively connected to one of said plurality of input terminals and second electrode connected in common, said input capacitors having almost the same capacitance;
    a fixed capacitor having a first electrode which is fixed at level H or level L and a second electrode which is connected to said second electrodes connected in common, said fixed capacitor having almost the same capacitance as the plurality of input capacitors; and
    an inverter circuit, for receiving a voltage from the second electrode connected in common and having a threshold value so that the inverter circuit is inverted when a voltage corresponding to logic 1 is applied to a predetermined number of input terminals of said plurality of input terminals, and generating a binary output.

2. A logic circuit comprising:
    a plurality of input terminals, to which binary input is provided;
    a plurality of input capacitors having first electrode respectively connected to one of said plurality of input terminals and second electrode connected in common, said input capacitors having integer times capacitances;
    a fixed capacitor having a first electrode which is fixed at level H or level L and a second electrode which is connected to said second electrodes connected in common, said fixed capacitor having almost the same capacitance as one of the plurality of input capacitors; and
    an inverter circuit, for receiving a voltage from the second electrodes connected in common, and having a threshold value so that the inverter circuit is inverted when a voltage corresponding to logic 1 is applied to a predetermined number of input terminals of said plurality of input terminals, and generating a binary output.

3. A logic circuit comprising:
    N (N is a plural number) input terminals, to which binary input is provided;
    N input capacitors having first electrode respectively connected to one of said N input terminals, and second electrodes connected in common, said N input capacitors having almost the same capacitance;
    a fixed capacitor having a first electrode fixed at level H or level L and a second electrode being connected to said second electrodes connected in common, and having a capacitance N−1 times the capacitance of said N input capacitors; and
    an inverter circuit, for receiving a voltage from said second electrodes connected in common, and having a threshold value so that the inverter circuit is inverted when a voltage corresponding to logic 1 is applied to a predetermined number of input terminals of said N input terminals, and generating a binary output.

4. An arbiter logic circuit comprising:
    a first request input terminal and a second request input terminal, for which binary input is provided;
    a first input capacitor, one electrode of which is connected to said first request input terminal;
    a first fixed capacitor, one electrode of which is fixed at level L and the other electrode of which is connected in common with the other electrode of said first input capacitor;
    a first inverter for receiving a voltage from said electrode connected in common and for providing an output at one output terminal;
    a second input capacitor, one electrode of which is connected to said second request input terminal;
    a second fixed capacitor, one electrode of which is fixed at level L and the other electrode of which is connected in common to the other electrode of said second input capacitor;
    a second inverter for receiving a voltage from said electrode connected in common on the second input capacitor side and for providing an output at another output terminal; and
    feedback capacitors located between said one output terminal and said electrode connected in common on the second input capacitor side, and between said another output terminal and said electrode connected in common on the first input capacitor side.

5. A tristate buffer circuit comprising:
    an input terminal, for which binary input is provided;
    a first and a second output enable terminals for receiving binary control signals with an inverted phase;
    an output terminal, which is set to a high impedance by said control signal, or from which an output corresponding to said binary input is provided;
    a first controller including,
        first input capacitors, one electrodes of which are connected to said input terminal and said first output enable terminal respectively, and the other electrodes of which are connected in common,
        a first fixed capacitor, one electrode of which is fixed at level L and the other electrode of which is connected to said other electrodes of the first input capacitors connected in common, and a first inverter for receiving a voltage of said other electrodes connected in common;

a second controller including, second input capacitors, one electrodes of which are connected to said input terminal and said second output enable terminal respectively, and the other electrodes of which are connected in common, a second fixed capacitor, one electrode of which is fixed at level H and the other electrode of which is connected to said other electrodes of the second input capacitors connected in common, and a second inverter for receiving a voltage of said other electrodes connected in common; and an output buffer circuit having two transistors driven by outputs from said first and said second inverters, wherein said output terminal is connected to a connection point of the transistors.

6. A logic circuit comprising:

at least two input terminals, for which binary input is provided;

a first logic circuit including, first input capacitors, one electrodes of which are connected to said input terminals respectively and the other electrode of which is connected in common, a first fixed capacitor, one electrode of which is fixed at level H or level L and the other electrode of which is connected to said electrodes in common of the first input capacitors, having a capacitance almost half of a total capacitance of said first input capacitors, and a first inverter, for receiving a voltage from said other electrodes connected in common of the first input capacitors, having a threshold value so that the first invertor is inverted when a voltage corresponding to logic 1 is applied to either or both of said input terminals; and a second logic circuit including, second input capacitors, one electrodes of which are connected to said input terminals respectively and the other electrode of which is connected in common, a second fixed capacitor, one electrode of which is fixed at level H or level L and the other electrode of which is connected to said electrodes in common of the second input capacitors, having a capacitance almost half of a total capacitance of said second input capacitors, and a second inverter, for receiving a voltage from said other electrodes connected in common of the second input capacitors, having a threshold value so that the second inverter is inverted when a voltage corresponding to logic 1 is applied to either or both of said input terminals;

wherein an output of said first logic circuit is fed back to an input terminal of said second inverter via a feedback capacitor having the substantially same capacitance as the sum of capacitances of said input capacitors.

7. A schmitt trigger circuit comprising:

an input terminal of said schmitt triger circuit, for which an input having a voltage between H level and L level is provided;

an input capacitor, one electrode of which is connected to said input terminal;

an inverter for receiving a voltage from the other electrode of said input capacitor; and a feedback capacitor, receiving, at one electrode, a non-inverted signal generated via said inverter, having the other electrode connected to the other electrode of said input capacitor, and having a feedback capacitance different from a capacitance of said input capacitor.

* * * * *